United States Patent [19]

Kawamonzen et al.

[11] Patent Number: 5,578,697
[45] Date of Patent: Nov. 26, 1996

[54] POLYIMIDE PRECURSOR, BISMALEIMIDE-BASED CURED RESIN PRECURSOR AND ELECTRONIC PARTS HAVING INSULATING MEMBERS MADE FROM THESE PRECURSORS

[75] Inventors: Yoshiaki Kawamonzen, Kawasaki; Masayuki Oba, Yokohama; Yukihiro Mikogami, Yokohama; Shigeru Matake, Yokohama; Shuzi Hayase, Yokohama; Satoshi Mikoshiba, Yokohama, all of Japan

[73] Assignee: Kabushiki Kaisha Toshiba, Kawasaki, Japan

[21] Appl. No.: 413,173

[22] Filed: Mar. 29, 1995

[30] Foreign Application Priority Data

Mar. 29, 1994 [JP] Japan .................................. 6-059280

[51] Int. Cl.$^6$ .................................. C08G 73/10
[52] U.S. Cl. .................. 528/353; 528/170; 528/172; 528/173; 528/176; 528/183; 528/185; 528/188; 528/220; 528/229; 528/310; 528/322; 528/342; 428/395; 428/411.1; 428/473.5
[58] Field of Search .................. 528/353, 310, 528/322, 188, 176, 170, 172, 173, 220, 229, 720, 185, 183, 342; 428/395, 411.1, 473.5

[56] References Cited

U.S. PATENT DOCUMENTS

| | | |
|---|---|---|
| 3,356,648 | 12/1967 | Rogers . |
| 5,041,520 | 8/1991 | Ohta et al. .................. 528/353 |
| 5,231,162 | 7/1993 | Nagata .................. 528/353 |
| 5,354,839 | 10/1994 | Yamashita et al. .................. 528/188 |
| 5,374,708 | 12/1994 | Tamai et al. .................. 528/353 |

FOREIGN PATENT DOCUMENTS

| | | |
|---|---|---|
| 1-118527 | 5/1989 | Japan . |
| 2-86624 | 3/1990 | Japan . |
| 3-83953 | 4/1991 | Japan . |
| 3-121131 | 5/1991 | Japan . |
| 4-108879 | 4/1992 | Japan . |
| 4-277526 | 10/1992 | Japan . |
| 5-25387 | 2/1993 | Japan . |
| 5-85996 | 4/1993 | Japan . |
| 5-178991 | 7/1993 | Japan . |
| 6-271516 | 9/1994 | Japan . |
| 6-271671 | 9/1994 | Japan . |
| 6-271670 | 9/1994 | Japan . |

*Primary Examiner*—Jeffrey C. Mullis
*Assistant Examiner*—P. Hampton-Hightower
*Attorney, Agent, or Firm*—Oblon, Spivak, McClelland, Maier & Neustadt, P.C.

[57] ABSTRACT

A polyimide precursor having a molecular structure obtained by polymerizing (a) 0.97 to 1.03 molar equivalent of a diamine component containing 0.40 molar equivalent or more of aromatic diamine compound represented by the general formula (DA1), and (b) an acid anhydride component containing $(1-n_1/2)$ molar equivalent of a tetracarboxylic dianhydride and $n_1$ molar equivalent of at least one selected from the group consisting of maleic anhydride and maleic derivative anhydride, wherein $n_1$ ranges from 0.02 to 0.40.

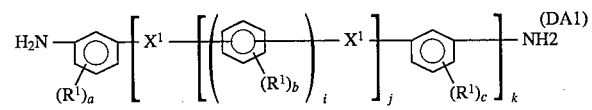

20 Claims, 3 Drawing Sheets

POLYIMIDE PRECURSOR, BISMALEIMIDE-BASED CURED RESIN PRECURSOR AND ELECTRONIC PARTS HAVING INSULATING MEMBERS MADE FROM THESE PRECURSORS

BACKGROUND OF THE INVENTION

1. Field of the Invention

This invention relates to polyimide precursor and bismaleimide-based cured resin precursor which are suited for use in the formation of various insulating members, and also to an electronic parts provided with a polyimide resin and bismaleimide-based cured resin made from these precursors as an insulating film or an insulating substrate.

2. Description of the Related Art

There is a recent trend to use as an interlayer insulating film material for a semiconductor device a polyamide resin having an excellent heat resistance which is capable of withstanding to a high temperature heat treatment of more than 400° C. As a product of such a polyimide resin, there is known Capton (trade mark of DuPont Co., Ltd.) which is a condensation product between pyromellitic dianhydride and 4,4'-oxydianiline. Moreover, in the recent trend of increasing the capacity, minimizing the size and weight, enhancing the reliability, increasing integration density of electronic parts, it is strongly demanded to develop for a material of multi-layered wiring substrate an organic high molecular material excellent in heat resistance, highly reliabile in through-hole adhesion, excellent in dimentional stability as well as in electric property, and high in flexibility. Conventionally, bismaleimide-based cured resin has been used as a material for a multi-layered wiring substrate. It is known as such a bismaleimide-based cured resin a reaction product of bis(4-maleimidophenyl) methane with methylene-4,4'-dianiline (for example, Japanese Patent Publication No. 46-23250).

By the way, with the recent trend of densifying a semiconductor device, the width of line-and-space of wiring pattern is increasingly narrowed down to the order of quarter micron so that the increase in delay time and operating power of a semiconductor device have now become a serious problem. Namely, a signal transfer velocity can be expressed by $Vs=c\times\epsilon_r^{1/2}$ (c: velocity of light, $\epsilon_r$: dielectric constant of dielectric material). As apparent from this equation, the lowering of dielectric constant of an interlayer insulating film is very important for increasing the signal transfer velocity. The dielectric constant of $SiO_2$ which has been conventionally employed as an interlayer insulating film for a semiconductor device is as high as 3.5. Therefore, any new material to be used in place of this material is required to be lower in dielectric constant than 3.5. Likewise, it has become indispensable problem in the manufacture of a multi-layered wiring substrate to lower as much as possible the dielectric constant of the substrate.

Under the circumstances, there is a strong demand for developing an organic high molecular film which is useful as an insulating element for an electronic parts and has a dielectric constant of as low as less than 3.0. However, any of the conventional polyimide resin and bismaleimide-based cured resin are still as high as 3.4 or so in dielectric constant. On the other hand, fluorocarbon resin has been attracted in view of its low dielectric constant which is as low as 2.5. However, the fluorocarbon resin is inadvantageous in workability. In particular, the fluorocarbon resin is very poor in dimentional stability under a high temperature condition as experienced in the manufacture of a multi-layered layered substrate.

In addition to the requirement of low dielectric constant, it is also required for an insulating member for a semiconductor device to have various characteristics such as being capable of improving the flatness of the surface of a semiconductor device, low in hygroscopicity and hardly decomposed through a chemical reaction.

As for the flatness of the surface of a semiconductor device, the followings can be said. Namely, since the conventional polyimide precursor is relatively high in molecular weight even before it is cured, and consequently the solution (varnish) thereof is high in viscosity, it is very difficult to obtain a flat film surface when it is used to form an insulating layer on a rugged surface of a semiconductor device. In particular, it is very difficult to completely fill fine trenches having a width of 0.1 to 0.5 μm formed on the surface of the substrate with the polyimide resin. In order to solve the above-mentioned problem, there has been practiced to take measures wherein a polyimide layer is coated as thick as 3 to 4 μm on the underlying wiring layer having a step of about 1 μm, and then the formed polyimide layer is etched-back by RIE (reactive ion etching), thereby forming a flat film surface. However, it is very difficult to detect the terminal point of the etch-back. In addition the interior of the etching apparatus may be contaminated by the by-products formed in the etch-back process. Therefore, it is desirable to decrease the amount of etch-back. Also from this point of view, it is required to form a flat film surface as far as possible. Furthermore, if the concentration of the varnish is lowered to completely fill the trenches with the polyimide resin, the amount of solvent is inevitably increased. However, since the conventional polyimide precursor is already high in molecular weight even before being cured, the fluidity of the varnish is rather poor even a relatively large amount of the solvent is remained therewith. As a result, the evaporation of the solvent is extremely inhibited and at the same time a local shrinkage of the polyimide resin will be caused thereby resulting the generation of voids.

Moreover, the conventional polyimide resin and bismaleimide-based cured resin are highly hygroscopic so that if it is left to stand in air atmosphere, it is easily hydrolyzed causing partial decomposition of the resin and releasing a toluene component and/or aniline component thus raising the problem of environmental stability.

Additionally, it is also required for an insulating member for use in a specific electronic parts to have a peculiar characteristic. For example, when polyimide resin is to be used as a liquid crystal alignment film for a liquid crystal display element, the following problem is raised. For example, in order to attain a wider angle of visibility, STN (super twisted nematic) system is widely adopted in the liquid crystal display. Since the longitudinal axial directions of liquid crystal molecules are caused to twist in the cell at an angle of 270 degrees according to the liquid crystal display element of STN system, a liquid crystal alignment film capable of giving a high pretilt angle is demanded to meet the requirement. Further, in the case of super fine color liquid crystal display, there is provided TFT (thin film transistor) in each pixel as well as a color filter is required. In this case, since the heat resistance of the color filter is poor, a liquid crystal alignment film which can be formed at low curing temperature, e.g. 200° C. or lower is demanded.

A polyimide resin having fluoroalkyl groups bonded to linear carbon chains is disclosed, in Japanese Patent Disclosure KOKAI No. 62-174725, as a liquid crystal alignment film which is capable of giving a high pretilt angle. However, this polyimide resin has drawbacks in that it is difficult to obtain a stabilized pretilt angle and is poor in voltage retention. Further, a soluble polyimide is disclosed, in a publication, 9th High Molecular Electronics Workshop Lecture, Summary of Lecture, p.32, as a liquid crystal alignment film having a low curing temperature. However, this soluble polyimide has a drawback that it is difficult to attain a high pretilt angle. As explained above, there has been failed up to date to find a polyimide liquid crystal alignment film which is capable of giving a high pretilt angle and at the same time high in voltage retention.

SUMMARY OF THE INVENTION

An object of the present invention is to provide a polyimide precursor and a bismaleimide-based cured resin precursor which are capable of forming a flat film even on a fine rugged surface of a substrate, low in dielectric constant and in hygroscopicity, and excellent in environmental stability.

Another object of the present invention is to provide electronic parts provided with an insulating member made from the resins mentioned above, and are capable of realizing a high operating speed and power saving and high in reliability.

According to the present invention, there is provided a first group of polyimide precursor having a molecular structure obtained by polymerizing (a) 0.97 to 1.03 molar equivalent of a diamine component containing 0.40 molar equivalent or more of aromatic diamine compound represented by the following general formula (DA1), and (b) an acid anhydride component containing $(1-n_1/2)$ molar equivalent of a tetracarboxylic dianhydride represented by the following general formula (DAH1) and $n_1$ molar equivalent of at least one selected from the group consisting of maleic anhydride and maleic derivative anhydride, wherein $n_1$ ranges from 0.02 to 0.40:

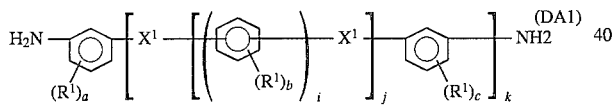

wherein $X^1$ groups may be the same or different and represent bivalent oxy, thio, sulfonyl, carbonyl, peralkylpolysiloxanylene or a nonsubstituted or fluoro-substituted aliphatic hydrocarbon group, or a single bond; $R^1$ substituents may be the same or different and represent individually fluoro, or a nonsubstituted or fluoro-substituted aliphatic hydrocarbon group; a, b and c are an integer of 0 to 4 respectively; i is an integer of 1 to 6; j is an integer of 0 to 6; and k is 0 or 1,

wherein Y is a tetravalent organic group.

According to the present invention there is further provided a second group of polyimide precursor having a molecular structure obtained by polymerizing (a) a diamine component containing 0.10 molar equivalent or more of an aromatic diamine compound represented by the following general formula (DA2), and (b) an acid anhydride component containing 0.80 molar equivalent or more of a tetracarboxylic dianhydride represented by the following general formula (DAH1):

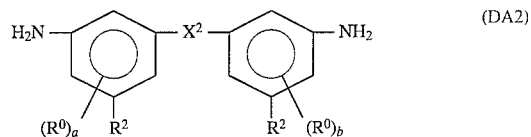

wherein $X^2$ represents perfluoroalkylene, perfluoroalkylidene, sulfonyl, or a single bond; $R^2$ substituents may be the same or different and represent fluoro, or a nonsubstituted or fluoro-substituted aliphatic hydrocarbon group, or a hydrogen atom, at least one $R^2$ being fluoro, or a fluoro-substituted aliphatic hydrocarbon group; $R^0$ substituents may be the same or different and represent fluoro, or a non-substituted or fluoro-substituted aliphatic hydrocarbon group; and a and b are an integer of 0 to 3 respectively,

wherein Y is a tetravalent organic group.

More specifically, the second group of polyimide precursor has a molecular structure obtained by polymerizing (a) 0.97 to 1.03 molar equivalent of the diamine compound containing the fluorine-containing diamine compound represented by the general formula (DA2), and (b) $(1-n_2/2)$ molar equivalent of the tetracarboxylic dianhydride represented by the general formula (DAH1) and $n_2$ molar equivalent of a dicarboxylic anhydride, wherein $n_2$ ranges from 0 to 0.4, or (a') $(1-n_3/2)$ molar equivalent of the diamine compound containing 0.1 molar equivalent or more of the fluorine-containing diamine compound represented by the general formula (DA2) and $n_3$ molar equivalent of a monoamine compound, wherein $n_3$ ranges from 0 to 0.4, and (b') 0.97 to 1.03 molar equivalent of the tetracarboxylic dianhydride represented by the general formula (DAH1).

According to the present invention, there is provided a first group of photosensitive polyimide precursor compresses 100 parts by weight of the first or second polyimide precursor, and 0.1 to 120 parts by weight of a photosensitive agent.

According to the present invention, there is further provided a second group of polyimide precursor comprising:

(a) 100 parts by weight of a polyamic acid derivative having a repeating unit represented by the following general formula (PA11), and (b) 0.05 to 30 parts by weight of a photopolymerization initiator:

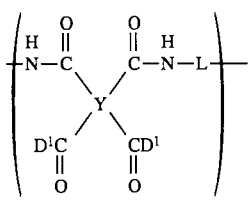

(PA11)

wherein Y is a tetravalent organic group; L is a bivalent organic group consisting of a residual group of the diamine compound represented by the general formula (DA1); $D^1$ substituents may be the same or different and represent a photosensitive organic group or hydroxy, at least one $D^1$ being the photosensitive organic group.

According to the present invention, there is provided a procursor of a bismaleimide-based cured resin having a molecular structure obtained by reacting (a) 1 molar equivalent of bismaleimide compound represented by the following general formula (DM1), and (b) 0.01 to 2 molar equivalent of at least one selected from the group consisting of a diamine compound represented by the following general formula (DA11) and a bivalent phenol compound represented by the following general formula (DP1):

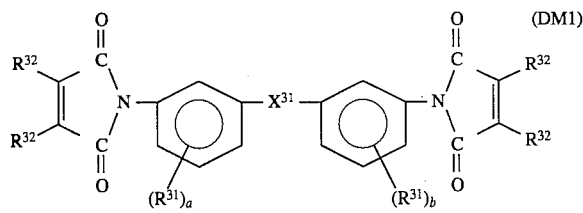

(DM1)

wherein $X^{31}$ represents bivalent oxy, sulfonyl, carbonyl, peralkylpolysiloxanylene, 1,3-phenylenedioxy, 1,4-phenylenedioxy, or a nonsubstituted or fluoro-substituted aliphatic hydrocarbon group, or a single bond; $R^{31}$ substituents may be the same or different and represent fluoro, a nonsubstituted or fluoro-substituted aliphatic hydrocarbon group, or a hydrogen atom, at least one $R^{31}$ being fluoro, or a fluoro-substituted aliphatic hydrocarbon group; $R^{32}$ substituents may be the same or different and represent halo, or a nonsubstituted or fluoro-substituted aliphatic hydrocarbon group, or a hydrogen atom; and a and b are an integer of 1 to 4 respectively,

(DA11)

wherein $X^{32}$ represents a bivalent organic group,

(DP1)

wherein $X^{33}$ represents a bivalent organic group; Ar represents an aromatic hydrocarbon group or an aromatic heterocyclic group; and n is 0 or 1.

According to the present invention, there is provided an electronic parts comprising an insulating member consisting of a polyimide resin obtained by curing one of polyimide precursor selected from the group of above-mentioned polyimide precursors, or of a bismaleimide-based cured resin obtained by curing the above-mentioned bismaleimide-based precursor.

DETAILED DESCRIPTION OF THE PREFERRED EMBODIMENTS

Figure 1:
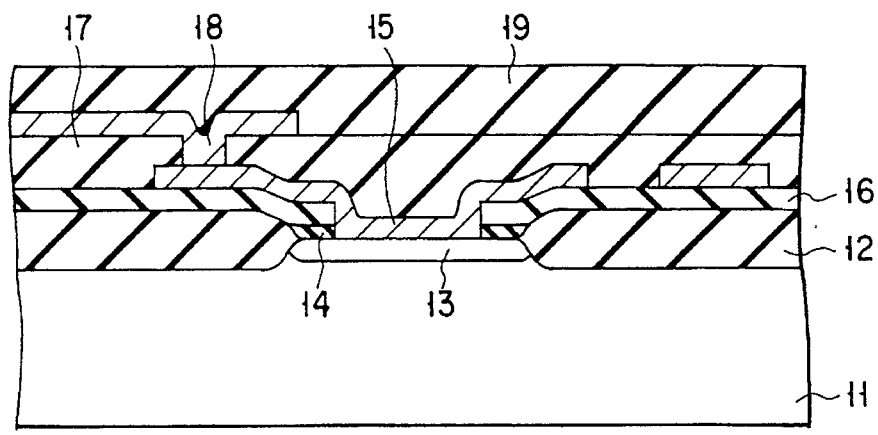
FIG. 1 is a sectional view illustrating a semiconductor device having an interlayer insulating film consisting of polyimide resin formed from a precursor of this invention.

This invention will be further explained in detail with reference to the following preferred embodiments.

The polyimide precursor (polyamic acid) of this invention generally has a molecular structure that can be obtained by polymerizing 0.97 to 1.03 molar equivalent of diamine component with $(1-n_2/2)$ molar equivalent of tetracarboxylic dianhydride and $n_2$, wherein $n_2$ ranges from 0 to 0.40, molar equivalent of dicarboxylic anhydride, or by polymerizing $(1-n_3/2)$ molar equivalent of diamine component and $n_3$, wherein $n_3$ ranges from 0 to 0.40, molar equivalent of monoamine compound with 0.97 to 1.03 molar equivalent of tetracarboxylic dianhydride.

First, the features of polyimide precursor (polyamic acid) constituting a first group of this invention will be discussed. This polyimide precursor has a molecular structure that can be obtained by polymerizing (a) 0.97 to 1.03 molar equivalent of a diamine component containing 0.40 molar equivalent or more of an aromatic diamine compound having a molecular structure represented by the general formula (DA1) with (b) an acid anhydride component comprising $(1-n_1/2)$ molar equivalent of tetracarboxylic dianhydride represented by the general formula (DAH1) and $n_1$, wherein $n_1$ ranges from 0.02 to 0.40, molar equivalent of maleic anhydride or maleic derivative anhydride.

The aromatic diamine compound having a molecular structure represented by the general formula (DA1) includes (a1) an aromatic diamine compound having one benzene ring and a couple of amino groups respectively bonded to the meta-positions of the benzene ring, and (a2) an aromatic diamine compound having two or more benzene rings and a couple of amino groups, each of the amino groups being bonded to the meta-position of the terminal benzene ring as counted from the bonding position of the terminal benzene ring to another benzene ring.

Examples of the aromatic diamine compound represented by the general formula (DA1) includes 1,3-phenylenediamine, 3,3'-diaminobiphenyl, 1,3-phenylene-3,3'-dianiline, 1,4-phenylene-3,3'-dianiline, oxy-3,3'-dianiline, thio-3,3'-dianiline, sulfonyl-3,3'-dianiline, methylene-3,3'-dianiline, 1,2-ethylene-3,3'-dianiline, 1,3-trimethylene-3,3'-dianiline, 2,2-propylidene-3,3'-dianiline, 1,4-tetramethylene-3,3'-dianiline, 1,5-pentamethylene-3,3'-dianiline, 1,1,1,3,3,3-hexafluoro-2,2-propylidene-3,3'-dianiline, difluoromethylene-3,3'-dianiline, 1,1,2,2-tetrafluoro-1,2-ethylene-3,3'-dianiline, 1,1,2,2,3,3-hexafluoro-1,3-trimethylene-3,3'-dianiline, 1,3-bis(3-aminophenyl)-1,1,3,3-tetramethyl disiloxane, 1,3-bis(3-aminophenoxy)benzene, 1,3-bis(3-aminophenylthio)benzene, 1,3-bis(3-aminophenylsulfonyl)benzene, 1,3-bis[2-(3-aminophenyl)-2-propyl]benzene, 1,3-bis[2-(3-aminophenyl)-1,1,1,3,3,3-hexafluoro-2-propyl]benzene, 1,4-bis(3-aminophenoxy)benzene, 1,4-bis(3-aminophenylthio)benzene, 1,4-bis(3-aminophenylsulfonyl)benzene, 1,4-bis[2-(3-aminophenyl)-2-propyl]benzene, 1,4-bis[2-(3-aminophenyl)-1,1,1,3,3,3-hexafluoro-2-propyl]benzene, 2,2-bis[4-(3-aminophenoxy) phenyl]-1,1,1,3,3,3-hexafluoropropane, 5-fluoro-1,3-phenylenediamine, 2,4,5,6-hexafluoro-1,3-phenylenediamine, 3,3'-diamino-5,5'-difluorobiphenyl, 3,3,'-diamino-2,2',4,4',5,5',6,6'-octafluorobiphenyl, oxy-5,5'-bis(3-fluoroaniline), sulfonyl-5,5'-bis(3-fluoroaniline), 1,3-bis(3-aminophenoxy)-5-fluorobenzene, 1,3-bis(3-amino-5-fluorophenoxy)benzene, 1,3-bis(3-amino-5-fluorophenoxy)-5-fluorobenzene, 5-(trifluoromethyl)-1,3-phenylenediamine, oxy-5,5'-bis[3-(trifluoromethyl)aniline], sulfonyl-5,5'-bis[3-(trifluoromethyl)aniline], 1,3-bis(3-aminophenoxy)-5-(trifluoromethyl)benzene, 1,3-bis[3-amino-5-(trifluoromethyl)phenoxy]benzene, 1,3-bis[3-amino-5-(trifluoromethyl)phenoxy]-5-(trifluoromethyl)benzene, 3,3'-bis(trifluoromethyl)-5,5'-diaminobiphenyl, 2,2-bis[3-amino-5-(trifluoromethyl) phenyl]-1,1,1,3,3,3-hexafluoropropane, 2,2-bis(3-amino-4-methylphenyl)-1,1,1,3,3,3-hexafluoropropane, 2,2-bis(3-amino-4-hydroxyphenyl)-1,1,1,3,3,3-hexafluoropropane, 3',3'''-diamino-p-quarterphenyl, 4,4'-bis(3-aminophenoxy)biphenyl, bis[4-(3-aminophenoxy)phenyl]sulfone, bis[3-(3-aminophenoxy)phenyl]sulfone, bis[4-(3-aminophenoxy)phenyl]ether, bis[3-(3-aminophenoxy)phenyl]ether, bis{4-[4-(2-(3-aminophenyl)propylidene)phenoxy]phenyl}sulfone, 2,2-bis[4-(3-aminophenoxy)phenyl]propane. These compounds may be used singly, or in combination.

The polyimide precursor containing an aromatic diamine compound represented by the a general formula (DA1) and having amino groups bonded to the meta-positions of the benzene ring(s) makes it possible to obtain a polyimide resin excellent in environmental stability. This polyimide resin obtained is more excellent in heat resistance as compared with an aromatic diamine compound having amino groups bonded to the para-positions of the benzene ring(s) and is preferable in that even if it is left to stand in an air atmosphere, the generation of gases (such as toluene and xylene) resulting from hydrolysis would hardly be caused thereby. In particular, a polyimide resin containing an aromatic diamine compound having a plurality of benzene rings identified in (a2) can be hardly hydrolyzed and therefore is excellent in environmental stability.

According to this invention, an aromatic diamine compound represented by the general formula (DA1) is employed in the ratio of 0.40 molar equivalent or more, preferably 0.70 molar equivalent or more based on the total amount of the whole diamine components. Because if the mixing amount of the aromatic diamine compound represented by the general formula (DA1) is less than this lower limit, it may be impossible to obtain a polyimide resin which can be hardly hydrolyzed and is excellent in environmental stability.

As examples of aromatic diamine compounds which are preferable among the aromatic diamine compounds represented by the general formula (DA1) in view of the heat resistance, environmental stability and low dielectric constant of polyimide resin to be obtained, the following compounds may be employed. Namely, they are 1,3-phenylenediamine, 3,3'-diaminobiphenyl, 1,3-phenylene-3,3'-dianiline, 1,4-phenylene-3,3'-dianiline, oxy-3,3'-dianiline, sulfonyl-3,3'-dianiline, 1,1,1,3,3,3-hexafluoro-2,2-propylidene-3,3'-dianiline, difluoromethylene-3,3'-dianiline, 1,1,2,2-tetrafluoro-1,2-ethylene-3,3'-dianiline, 1,1,2,2,3,3-hexafluoro-1,3-trimethylene-3,3,'-dianiline, 1,3-bis(3-aminophenoxy)benzene, 1,4-bis(3-aminophenoxy) benzene, 5-fluoro-1,3-phenylenediamine, 3,3'-diamino-5,5'-difluorobiphenyl, 5-(trifluoromethyl)-1,3-phenylenediamine, oxy-5,5'-bis[3-(trifluoromethyl)aniline], sulfonyl-5,5'-bis[3-(trifluoromethyl)aniline], 1,3-bis(3-aminophenoxy)-5-(trifluoromethyl)benzene, 1,3-bis[3-amino-5-(trifluoromethyl)phenoxy]benzene, 1,3-bis[3-amino-5-(trifluoromethyl)phenoxy]-5-(trifluoromethyl)benzene, 2,2-bis(3-amino-4-methylphenyl)-1,1,1,3,3,3-hexafluoropropane, 2,2-bis(3-amino-4-hydroxyphenyl)-1,1,1,3,3,3-hexafluoropropane, 3,3'-bis(trifluoromethyl)-5,5'-diaminobiphenyl, and 2,2-bis[3-amino-5-(trifluoromethyl)phenyl]-1,1,1,3,3,3-hexafluoroprapane.

It is also possible in a first group of the polyimide precursor of this invention to use an aromatic diamine compound represented by the following general formula (DA6), i.e., a bis(aminoalkyl) peralkylpolysiloxane compound together with an aromatic diamine compound represented by the general formula (DA1).

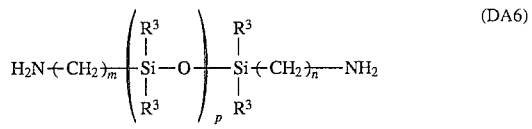

(DA6)

wherein $R^3$ substituents may be the same or different and represent individually an alkyl group having 1 to 5 carbon atoms; m and n respectively represent an integer of 1 to 10, and p is a positive integer.

Examples of bis(aminoalkyl) peralkylpolysiloxane compounds represented by the general formula (DA6) are 1,3-bis(aminomethyl)-1,1,3,3-tetramethyl disiloxane, 1,3-bis(2-aminoethyl)-1,1,3,3-tetramethyl disiloxane, 1,3-bis(3-aminopropyl)-1,1,3,3-tetramethyl disiloxane, 1,3-bis(4-aminobutyl)-1,1,3,3-tetramethyl disiloxane, 1,3-bis(5-aminopentyl)-1,1,3,3-tetramethyl disiloxane, 1,3-bis(6-aminohexyl)-1,1,3,3-tetramethyl disiloxane, 1,3-bis(7-aminoheptyl)-1,1,3,3-tetramethyl disiloxane, 1,3-bis(8-aminooctyl)-1,1,3,3-tetramethyl disiloxane, 1,3-bis(10-aminodecyl)-1,1,3,3-tetramethyl disiloxane, 1,5-bis(3-aminopropyl)-1,1,3,3,5,5-hexamethyltrisiloxane, 1,7-bis(3-aminopropyl)-1,1,3,3,5,5,7,7-octamethyltetrasiloxane, 1,11-bis(3-aminopropyl)-1,1,3,3,5,5,7,7,9,9,11,11-dodecamethylhexasiloxane, 1,15-bis(3-aminopropyl)-1,1,3,3,5,5,7,7,9,9,11,11,13,13,15,15-hexadecamethyl octasiloxane and 1,19-bis(3-aminopropyl)-1,1,3,3,5,5,7,7,9,9,11,11,13,13,15,15,17,17,19,19-eicosadecamethyldecasiloxane.

Bis(aminoalkyl) peralkylpolysiloxane compounds represented by the general formula (DA6) are effective in improving the adhesion properties of polyimide resin onto, for example, a semiconductor substrate. It is preferable to employ the polysiloxane compounds in the ratio of 0.02 to 0.1 molar equivalent based on the total amount of the whole diamine components. If the polysiloxane compounds are used in excess to the upper limit, it may give rise to the lowering of heat resistance of the resultant polyimide resin though the adhesion properties of polyimide resin onto the semiconductor substrate may be improved.

It is also possible according to this invention to use another kind of diamine compounds other than those represented by the general formula (DA1) as far as the physical properties of the polyimide resin to be finally obtained would not be deteriorated. Examples of such diamine compounds are aromatic diamine compounds wherein amino groups are bonded to the positions of a benzene ring or rings excluding meta-positions, e.g. para-positions of the benzene ring or rings, and aliphatic diamine compounds. Specifically, examples of such diamine compounds are 1,2-phenylenediamine, 1,4-phenylenediamine, 3,4'-diaminobiphenyl, 4,4'-diaminobiphenyl, 1,3-phenylene-4,4'-dianiline, 1,4-phenylene-4,4'-dianiline, oxy-4,4'-dianiline, oxy-3,4'-dianiline, thio-4,4'-dianiline, sulfonyl-4,4'-dianiline, methylene-4,4'-dianiline, 1,2-ethylene-4,4'-dianiline, 1,3-trimethylene-4,4'-dianiline, 2,2-propylidene-4,4'-dianiline, 1,4-tetramethylene-4,4'-dianiline, 1,5-pentamethylene-4,4'-dianiline, 1,1,1,3,3,3-hexafluoro-2,2-propylidene-4,4'-dianiline, difluoromethylene-4,4'-dianiline, 1,1,2,2-tetrafluoro-1,2-ethylene-4,4'-dianiline, 1,1,2,2,3,3-hexafluoro-1,3-trimethylene-4,4'-dianiline, 1,3-bis(4-aminophenyl)-1,1,3,3-tetramethyl disiloxane, 1,3-bis(4-aminophenoxy)benzene, 1,3-bis(4-aminophenylthio)benzene, 1,3-bis(4-aminophenylsulfonyl)benzene, 1,3-bis[2-(4-aminophenyl)-2-propyl]benzene, 1,3-bis[2-(4-aminophenyl)-1,1,1,3,3,3-hexafluoro-2-propyl]benzene, 1,4-bis(4-aminophenoxy)benzene, 1,4-bis(4-aminophenylthio)benzene, 1,4-bis(4-aminophenylsulfonyl)benzene, 1,4-bis[2-(4-aminophenyl)-2-propyl]benzene, 1,4-bis[2-(4-aminophenyl)-1,1,1,3,3,3-hexafluoro-2-propyl]benzene, 2,2-bis[4-(4-aminophenoxy)phenyl]-1,1,1,3,3,3-hexafluoropropane, 2-fluoro-1,4-phenylenediamine, 2,5-difluoro-1,4-phenylenediamine, 2,3,5,6-tetrafluoro-1,4-phenylenediamine, 4,4'-diamino-2,2'-difluorobiphenyl, 4,4'-diamino-3,3'-difluorobiphenyl, 4,4'-diamino-2,2',3,3',5,5',6,6'-octafluorobiphenyl, oxy-4,4'-bis(2-fluoroaniline), oxy-4,4'-bis(3-fluoroaniline), sulfonyl-4,4'-bis(2-fluoroaniline), sulfonyl-4,4'-bis(3-fluoroaniline), 2-(trifluoromethyl)-1,4-phenylenediamine, 2,5-bis(trifluoromethyl)-1,4-phenylenediamine, 2,2'-bis(trifluoromethyl)-4,4'-diaminobiphenyl, 3,3'-bis(trifluoromethyl)-4,4'-diaminobiphenyl, oxy-4,4'-bis[2-(trifluoromethyl)aniline], oxy-4,4'-bis[3-(trifluoromethyl)aniline], sulfonyl-4,4'-bis[2-(trifluoromethyl)aniline], sulfonyl-4,4'-bis[3-(trifluoromethyl)aniline], bis(4-aminophenoxy)dimethylsilane, 1,3-bis(4-aminophenyl)-1,1,3,3-tetramethyl disiloxane, methanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonane diamine, 1,10-decanediamine, 1,2-bis(3-aminopropoxy)ethane, 1,3-diaminocyclohexane, 1,4-diaminocyclohexane, bis(3-aminocyclohexyl)methane, bis(4-aminocyclohexyl) methane, 1,2-bis(3-aminocyclohexyl)ethane, 1,2-bis(4-aminocyclohexyl)ethane, 2,2-bis(3-aminocyclohexyl)propane, 2,2-bis(4-aminocyclohexyl)propane, bis(3-aminocyclohexyl)ether, bis(4-aminocyclohexyl) ether, bis(3-aminocyclohexyl)sulfone, bis(4-aminocyclohexyl)sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine, 1,4-xylylenediamine, 1,8-diaminonaphthalene, 2,7-diaminonaphthalene, 2,6-diaminonaphthalene, 2,5-diaminopyridine, 2,6-diaminopyridine, 2,5-diaminopyrazine and 2,4-diamino-s-triazine.

Among other kinds of diamine compound that can be used together with the aromatic diamine compounds represented by the general formula (DA1) in view of the heat resistance, environmental stability and low dielectric constant of polyimide resin to be obtained, the following compounds may be preferably employed. Namely, they are 1,4-phenylenediamine, 3,4'-diaminobiphenyl, 4,4'-diaminobiphenyl, 1,3-phenylene-4,4'-dianiline, 1,4-phenylene-4,4'-dianiline, oxy-4,4'-dianiline, oxy-3,4'-dianiline, thio-4,4'-dianiline, sulfonyl-4,4'-dianiline, methylene-4,4'-dianiline, 2,2-propylidene-4,4'-dianiline, 1,1,1,3,3,3-hexafluoro-2,2-propylidene-4,4'-dianiline, 1,3-bis(4-aminophenoxy)benzene, 1,4-bis(4-aminophenoxy)benzene, 1,3-bis[2-(4-aminophenyl)-2-propyl]benzene, 1,4-bis[2-(4-aminophenyl)-2-propyl] benzene, 2,2-bis[4-(4-aminophenoxy)phenyl]-1,1,1,3,3,3-hexafluoropropane, 2-fluoro-1,4-phenylene diamine, 2,5-difluoro-1,4-phenylenediamine, 2,3,5,6-tetrafluoro-1,4-phenylenediamine, 4,4'-diamino-2,2'-difluorobiphenyl, 4,4'-diamino-3,3'-difluorobiphenyl, 4,4'-diamino-2,2',3,3',5,5',6,6'-octafluorobiphenyl, oxy-4,4'-bis(2-fluoroaniline), oxy-4,4'-bis(3-fluoroaniline), sulfonyl-4,4'-bis(2-fluoroaniline), sulfonyl-4,4'-bis(3-fluoroaniline), 2-(trifluoromethyl)-1,4-phenylenediamine, 2,5-bis(trifluoromethyl)-1,4-phenylene diamine, 2,2'-bis(trifluoromethyl)-4,4'-diaminobiphenyl, 3,3'-bis(trifluoromethyl)-4,4'-diaminobiphenyl, oxy-4,4'-bis[2-(trifluoromethyl)aniline], oxy-4,4'-bis[3-(trifluoromethyl) aniline], sulfonyl-4,4'-bis[2-(trifluoromethyl)aniline], sulfonyl-4,4'-bis[3-(trifluoromethyl)aniline], 1,8-diaminonaphthalene, 2,7-diaminonaphthalene and 2,6-diaminonaphthalene.

As tetracarboxylic dianhydride represented by the general formula (DAH1) to be used in a first group of polyimide precursor of this invention, any compounds can be used in which Y in the general formula (DAH1) is a tetravalent organic group selected from the group consisting of an aliphatic hydrocarbon group, an alicyclic hydrocarbon group, an aromatic hydrocarbon group and a heterocyclic group each having 1 to 30 carbon atoms, and a polycyclic compound group formed by linking aliphatic hydrocarbon groups, alicyclic hydrocarbon groups, aromatic hydrocarbon groups and heterocyclic groups, directly or via a linkage group. Examples of such tetracarboxylic dianhydride are pyromellitic dianhydride, 3-fluoropyromellitic dianhydride, 3,6-difluoropyromellitic dianhydride, 3-(trifluoromethyl)pyromellitic dianhydride, 3,6-bis(trifluoromethyl)pyromellitic dianhydride, 1,2,3,4-benzenetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 3,3",4,4"-p-terphenyltetracarboxylic dianhydride, 3,3''',4,4'''-p-quaterphenyltetracarboxylic dianhydride, 3,3'''',4,4''''-p-quinquephenyltetracarboxylic dianhydride, 2,2',3,3'-biphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)-1,1,3,3-tetramethyl disiloxane dianhydride, 1,3-bis(3,4-dicarboxyphenyl)benzene dianhydride, 3,3'-bis(3,4-dicarboxyphenyl)biphenyl dianhydride, 1,3-bis(3,4-dicarboxyphenyl)benzene dianhydride, 1,4-bis(3,4-dicarboxyphenyl)benzene dianhydride, 1,3-bis[2-(3,4-dicarboxyphenyl)-2-propyl]benzene dianhydride, 1,4-bis[2-(3,4-dicarboxyphenyl)-2-propyl]benzene dianhydride, 1,3-bis(3,4-dicarboxyphenylsulfonyl) benzene dianhydride, 1,4-bis(3,4-dicarboxyphenylsulfonyl) benzene dianhydride, bis[3-(3,4-dicarboxyphenyl) phenyl]methane dianhydride, bis[4-(3,4-dicarboxyphenyl) phenyl]methane dianhydride, 2,2-bis[3-(3,4-dicarboxyphenyl)phenyl]propane dianhydride, 2,2-bis[4-(3,4-dicarboxyphenyl)phenyl] propane dianhydride, 2,2-bis[3-(3,4-dicarboxyphenyl) phenyl]-1,1,1,3,3,3-hexafluoropropane dianhydride, 2,2-bis[4-(3,4-dicarboxyphenyl) phenyl]-1,1,1,3,3,3-hexafluoropropane dianhydride, bis(3,4-dicarboxyphenyl)dimethylsilane dianhydride, 1,3-bis(3,4-dicarboxyphenyl)-1,1,3,3-tetramethyl disiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrene tetracarboxylic dianhydride, 2,3,6,7-phenanthrenetetracarboxylic dianhydride, 2,3,8,9-naphthacenetetracarboxylic dianhydride, 1,3-bis(3,4-dicarboxyphenyl)-1,1,3,3-tetramethyl disiloxane dianhydride, ethylenetetracarboxylic dianhydride, butanetetracarboxylic dianhydride, cyclopentanetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic) dianhydride, methylene-4,4'-bis(cyclohexane-1,2-dicarboxylic)dianhydride, 1,2-ethylene-4,4'-bis(cyclohexane-1,2-dicarboxylic)dianhydride, 1,1-ethylidene-4,4'-bis(cyclohexane-1,2-dicarboxylic) dianhydride, 2,2-propylidene-4,4'-bis(cyclohexane-1,2-dicarboxylic)dianhydride, 1,1,1,3,3,3-hexafluoro-2,2-propylidene-4,4'-bis(cyclohexane-1,2-dicarboxylic) dianhydride, oxy-4,4'-bis(cyclohexane-1,2-dicarboxylic) dianhydride, thio-4,4'-bis(cyclohexane-1,2-dicarboxylic) dianhydride, sulfonyl-4,4'-bis(cyclohexane-1,2-dicarboxylic)dianhydride, 2,2'-difluoro-3,3',4,4'-biphenyltetracarboxylic dianhydride, 5,5'-difluoro-3,3',4,4'-biphenyl tetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyl tetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4'-biphenyltetracarboxylic dianhydride, 2,2',6,6'-tetrakis(trifluoromethyl)-3,3',4,4'-biphenyl tetracarboxylic dianhydride, 5,5',6,6'-tetrakis(trifluoromethyl)-3,3',4,4'-biphenyl tetracarboxylic dianhydride, 2,2',5,5',6,6'-hexakis(trifluoromethyl)-3,3',4,4'-biphenyl tetracarboxylic dianhydride, 3,3'-difluoro-oxy-4,4'-diphthalic dianhydride, 5,5'-difluoro-oxy-4,4'-diphthalic dianhydride, 6,6'-difluoro-oxy-4,4'-diphthalic dianhydride, 2,2',5,5',6,6'-hexafluoro-oxy-4,4'-diphthalic dianhydride, 3,3'-bis(trifluoromethyl)oxy-4,4'-diphthalic dianhydride, 5,5'-bis(trifluoromethyl)oxy-4,4'-diphthalic dianhydride, 6,6'-bis(trifluoromethyl)oxy-4,4'-diphthalic dianhydride, 3,3',5,5'-tetrakis(trifluoromethyl)oxy-4,4'-diphthalic dianhydride, 3,3',6,6'-tetrakis(trifluoromethyl) oxy-4,4'-diphthalic dianhydride, 5,5',6,6'-tetrakis(trifluoromethyl)oxy-4,4'-diphthalic dianhydride, 3,3',5,5',6,6'-hexakis(trifluoromethyl) oxy-4,4'-diphthalic dianhydride, 3,3'-difluoro-sulfonyl-4,4'-diphthalic dianhydride, 5,5,'-difluoro-sulfonyl-4,4'-diphthalic dianhydride, 6,6'-difluoro-sulfonyl-4,4'-diphthalic dianhydride, 3,3',5,5',6,6'-hexafluoro-sulfonyl-4,4'-diphthalic dianhydride, 3,3'-bis(trifluoromethyl)sulfonyl-4,4'-diphthalic dianhydride, 5,5'-bis(trifluoromethyl)sulfonyl-4,4'-diphthalic dianhydride, 6,6'-bis(trifluoromethyl)sulfonyl-4,4'-diphthalic dianhydride, 3,3',5,5'-tetrakis(trifluoromethyl)sulfonyl-4,4'-diphthalic dianhydride, 3,3',6,6'-tetrakis(trifluoromethyl)sulfonyl-4,4'-diphthalic dianhydride, 5,5',6,6'-tetrakis(trifluoromethyl)sulfonyl-4,4'-diphthalic dianhydride, 3,3',5,5',6,6'-hexakis(trifluoromethyl)sulfonyl-4,4'-diphthalic dianhydride, 3,3'-difluoro-2,2-perfluoropropylidene-4,4'-diphthalic dianhydride, 5,5'-difluoro-2,2-perfluoropropylidene-4,4'-diphthalic dianhydride, 6,6'-difluoro-2,2-perfluoropropylidene-4,4'-diphthalic dianhydride, 3,3',5,5',6,6'-hexafluoro-2,2-perfluoropropylidene-4,4'-diphthalic dianhydride, 3,3'-bis(trifluoromethyl)-2,2-perfluoropropylidene-4,4'-diphthalic dianhydride, 5,5'-bis(trifluoromethyl)-2,2-perfluoropropylidene-4,4'-diphthalic dianhydride, 6,6'-bis(trifluoromethyl)-2,2-perfluoropropylidene-4,4'-diphthalic dianhydride, 3,3',5,5'-tetrakis(trifluoromethyl)-2,2-perfluoropropylidene-4,4'-diphthalic dianhydride, 3,3',6,6'-tetrakis(trifluoromethyl)-2,2-perfluoropropylidene-4,4'-diphthalic dianhydride, 5,5',6,6'-tetrakis(trifluoromethyl)-2,2-perfluoropropylidene-4,4'-diphthalic dianhydride, 3,3',5,5',6,6'-hexakis(trifluoromethyl)-2,2-perfluoropropylidene-4,4'-diphthalic dianhydride, 9-phenyl-9-(trifluoromethyl) xanthene-2,3,6,7-tetracarboxylic dianhydride, 9,9-bis(trifluoromethyl)xanthene-2,3,6,7-tetracarboxylic dianhydride and bicyclo[2,2,2]oct-7-ene-2,3,5,6-tetracarboxylic dianhydride.

These tetracarboxylic dianhydrides may be used singly or in combination of two or more. It is preferable to employ these tetracarboxylic dianhydrides in the ratio of 0.80 to 0.99 molar equivalent, more preferably 0.90 to 0.98 molar equivalent based on the total amount of the whole acid anhydride components. If the tetracarboxylic dianhydrides are used in an amount less than the lower limit, it may give rise to the lowering of heat resistance of the resultant polyimide resin, whereas if the tetracarboxylic dianhydrides are used in an amount in excess to the upper limit, the content of maleic anhydride or maleic acid derivative anhydride constituting one of the acid anhydride components is decreased so that it may give rise to an increase in intrinsic viscosity of the solution of polyimide precursor thereby making it more difficult to completely fill, for example, the fine reggedness on the surface of a substrate.

In view of obtaining a highly heat-resistant polyimide resin having a high glass transition temperature and a decomposition temperature, it is preferable to employ at least one tetracarboxylic dianhydride selected from the group consisting of following aromatic tetracarboxylic dianhydrides represented by the general formulas (DAH2) to (DAH4) among the tetracarboxylic dianhydrides represented by the general formulas (DAH1).

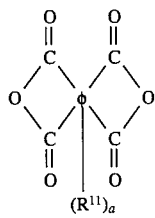
(DAH2)

wherein $R^{11}$ substituents may be the same or different and represent individually fluoro, or a non-substituted or fluoro-substituted aliphatic hydrocarbon group; φ represents armatic hydrocarbon group, and a is an integer of 0 to 10.

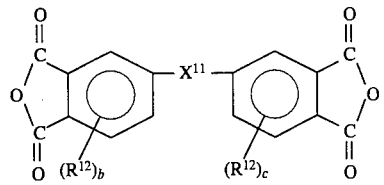
(DAH3)

wherein $X^{11}$ is bivalent oxy, thio, sulfonyl, carbonyl, peralkylpolysiloxanylene, or a nonsubstituted or fluoro-substituted aliphatic hydrocarbon group, 1,4-phenylene, biphenyl-4,4'-diyl, or a single bond; $R^{12}$ substituents may be the same or different and represent individually fluoro, or a nonsubstituted or fluoro-substituted aliphatic hydrocarbon group; and b and c are an integer of 0 to 4 respectively.

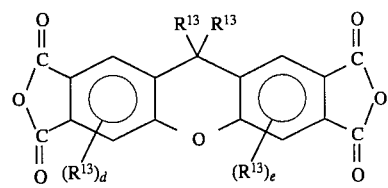
(DAH4)

wherein $R^{13}$ substituents may be the same or different and represent individually fluoro, or a non-substituted or fluoro-substituted aliphatic hydrocarbon group or aromatic hydrocarbon group; and d and e are an integer of 0 to 4 respectively.

Examples of aromatic tetracarboxylic dianhydrides represented by the general formula (DAH2) are pyromellitic dianhydride, 3-fluoropyromellitic dianhydride, 3,6-difluoropyromellitic dianhydride, 3-(trifluoromethyl) pyromellitic dianhydride, 3,6-bis(trifluoromethyl) pyromellitic dianhydride, 2,3,6,7-naphthalenetetracarboxylic dianhydride, 1,4,5,8-naphthalenetetracarboxylic dianhydride, 1,2,5,6-naphthalentetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, 2,3,6,7-phenanthrenetetracarboxylic dianhydide, 2,3,8,9-naphthacenetetracarboxylic dianhydride.

Examples of aromatic tetracarboxylic dianhydrides represented by the general formula (DAH3) are 3,3',4,4'-benzophenonetetracarboxylic dianhydride, 3,3',4,4'-biphenyltetracarboxylic dianhydride, 3,3'',4,4''-p-terphenyltetracarboxylic dianhydride, 3,3''',4,4'''-p-quaterphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)-1,1,3,3-tetramethylsiloxane dianhydride, 2,2'-difluoro-3,3',4,4'-biphenyltetracarboxylic dianhydride, 5,5'-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4'-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxylic dianhydride, 3,3'-difluoro-oxy-4,4'-diphthalic dianhydride, 5,5'-difluoro-oxy-4,4'-diphthalic dianhydride, 6,6'-difluoro-oxy-4,4'-diphthalic dianhydride, 3,3',5,5',6,6'-hexafluoro-oxy-4,4'-diphthalic dianhydride, 3,3'-bis(trifluoroxymethyl) oxy-4,4'-diphthalic dianhydride, 5,5'-bis(trifluoromethyl)oxy-4,4'-diphthalic dianhydride, 6,6'-bis(trifluoroxymethyl)oxy-4,4'-diphthalic dianhydride, 3,3',5,5'-tetrakis(trifluoromethyl)oxy-4,4'-diphthalic dianhydride, 3,3',6,6'-tetrakis(trifluoromethyl)oxy-4,4'-diphthalic dianhydride, 5,5',6,6'-tetrakis(trifluoromethyl)oxy-4,4'-diphthalic dianhydride, 3,3',5,5',6,6'-hexakis(trifluoromethyl)oxy-4,4'-diphthalic dianhydride, 3,3'-difluoro-sulfonyl-4,4'-diphthalic dianhydride, 5,5'-difluoro-sulfonyl-4,4'-diphthalic dianhydride, 6,6'-difluoro-sulfonyl-4,4'-diphthalic dianhydride, 3,3',5,5',6,6'-hexafluoro-sulfonyl-4,4'-diphthalic dianhydride, 3,3'-bis(trifluoromethyl)sulfonyl-4,4'-diphthalic dianhydride, 5,5'-bis(trifluoromethyl) sulfonyl-4,4'-diphthalic dianhydride, 6,6'-bis(trifluoromethyl)sulfonyl-4,4'-diphthalic dianhydride, 3,3',5,5'-tetrakis(trifluoromethyl)sulfonyl-4,4'-diphthalic dianhydride, 3,3',6,6'-tetrakis(trifluoromethyl)sulfonyl-4,4'-diphthalic dianhydride, 5,5',6,6'-tetrakis(trifluoromethyl)sulfonyl-4,4'-diphthalic dianhydride, 3,3',5,5',6,6'-hexakis(trifluoromethyl)sulfonyl-4,4'-diphthalic dianhydride, 3,3'-difluoro-2,2-perfluoropropylidene-4,4'-diphthalic dianhydride, 5,5'-difluoro-2,2-perfluoropropylidene-4,4'-diphthalic dianhydride, 6,6'-difluoro-2,2-perfluoropropylidene-4,4'-diphthalic dianhydride, 3,3',5,5',6,6'-hexafluoro-2,2-perfluoropropylidene-4,4'-diphthalic dianhydride, 3,3'-bis(trifluoromethyl)-2,2-perfluoropropylidene-4,4'-diphthalic dianhydride, 5,5'-bis(trifluoromethyl)-2,2-perfluoropropylidene-4,4'-diphthalic dianhydride, 6,6'-bis(trifluoromethyl)-2,2-perfluoropropylidene-4,4'-diphthalic dianhydride, 3,3',5,5'-tetrakis(trifluoromethyl)-2,2-perfluoropropylidene-4,4'-diphthalic dianhydride, 3,3',6,6'-tetrakis(trifluoromethyl)-2,2-perfluoropropylidene-4,4'-diphthalic dianhydride, 5,5',6,6'-tetrakis(trifluoromethyl)-2,2-perfluoropropylidene-4,4'-diphthalic dianhydride and 3,3',5,5',6,6'-hexakis(trifluoromethyl)-2,2-perfluoropropylidene-4,4'-diphthalic dianhydride.

Examples of aromatic tetracarboxylic dianhydrides represented by the general formula (DAH4) are 9-phenyl-9-(trifluoromethyl)xanthene-2,3,6,7-tetracarboxylic dianhydride and 9,9-bis(trifluoromethyl) xanthene-2,3,6,7-tetracarboxylic dianhydride.

In view of improving the heat resistance, environmental stability and low dielectric constant of the polyimide resin to be obtained, it is preferable to employ the following aromatic tetracarboxylic dianhydrides among the tetracarboxylic dianhydrides represented by the general formulas (DAH2) to (DAH4). Namely, they are pyromellitic dianhydride, 3,6-bis(trifluoromethyl)pyromellitic dianhydride, 3,3', 4,4'-benzophenonetetracarboxylic dianhydride, 3,3',4,4'-biphenyltetracarboxylic dianhydride, 1,1,1,3,3,3-hexafluoro-2,2-propylidene-4,4'-diphthalic dianhydride, oxy-4,4'-diphthalic dianhydride, sulfonyl-4,4'-diphthalic dianhydride, 1,3-bis(3,4-dicarboxyphenyl)-1,1,3,3-tetramethyl disiloxane dianhydride, 9-phenyl-9-(trifluoromethyl)xanthene-2,3,6,7-tetracarboxylic dianhydride and 9,9-bis(trifluoromethyl)xanthene-2,3,6,7-tetracarboxylic dianhydride.

Maleic anhydride or maleic acid derivative anhydride to be employed in the first group of this invention is presented by the following general formula (MA1).

(MA1)

wherein $R^{21}$ substituents may be the same or different and represent individually halo, or a nonsubstituted or fluoro-substituted aliphatic hydrocarbon group, or hydrogen atom.

Examples of such maleic anhydride or maleic acid derivative anhydride are maleic anhydride, citraconic anhydride, dimethylmaleic anhydride, ethylmaleic anhydride, diethylmaleic anhydride, propylmaleic anhydride, butylmaleic anhydride, chloromaleic anhydride, dichloromaleic anhydride, bromomaleic anhydride, dibromomaleic anhydride, fluoromaleic anhydride, difluoromaleic anhydride and (trifluoromethyl) maleic anhydride, bis(trifluoromethyl)maleic anhydride.

These maleic anhydrides or maleic acid derivative anhydrides may be used singly or in combination of two or more.

The maleic anhydride or maleic acid derivative anhydride serves to lower the molecular weight of a polyamic acid thereby lowering the viscosity of the solution of the polyamic acid. The maleimide skeleton introduced at the end of polyamic acid forms a cross-linkage, directly or through an excessive diamine component during the curing of the polyamic acid. The maleic anhydride or maleic acid derivative anhydride can be employed in a ratio of 0.02 to 0.40 molar equivalent, preferably 0.05 to 0.20 molar equivalent based on the whole acid anhydride components. If the maleic anhydride or maleic acid derivative anhydride is used in an amount less than the lower limit, the intrinsic viscosity of the solution of polyimide precursor may exceed over 0.7 dL/g thereby making it more difficult to completely fill the fine ruggedness, in particular trenches having a width of 0.1 to 0.5 μm formed on the surface of a substrate. Whereas if the maleic anhydride or maleic acid derivative anhydride is used in an amount in excess to the upper limit, it may cause to lower heat resistance of the resultant polyimide resin.

There is no limitation with respect to the method of synthesizing the polyimic acid constituting the polyimide precursor of the first group of this invention. However, it is preferable to react the diamine component containing the aromatic diamine compound represented by the general formula (DA1) with the acid anhydride component comprising the tetracarboxylic dianhydride represented by the general formula (DAH1) and maleic anhydride or maleic acid derivative anhydride in an organic solvent. Examples of the organic solvent suitable in this reaction are N,N-dimethyl formamide, N,N-dimethylacetamide, N,N-diethylacetamide, N,N-dimethoxyacetamide, N-methyl-2-pyrrolidone, 1,3-dimethyl-2-imidazolidinone, N-methylcaprolactam, 1,2-dimethoxyethane, bis(2-methoxyethyl)ether, 1,2-bis(2-methoxyethoxy)ethane, bis[2-(2-methoxyethoxy)ethyl]ether, tetrahydrofuran, 1,3-dioxane, 1,4-dioxane, pyrroline, picoline, dimethylsulfoxide, sulfolane, phenol, cresol, anisole, γ-butyrolactone, propylene carbonate, acetylacetone and acetonylacetone. These solvents may be used singly or in combination of two or more.

The reaction temperature of the synthesis is generally 250° C. or lower, preferably 50° C. or lower. There is no restriction as to the reaction pressure, and the reaction can be performed under the normal pressure. The reaction time is dependent on the kind of tetracarboxylic dianhydride and also on the kind of solvent, but generally the reaction period ranging from 4 to 24 hours would be sufficient. The polyamic acid obtained by this reaction preferably has such a degree of polymerization that the instrinsic viscosity of the 0.5 w/v % N-methyl-2-pyrrolidone solution of the polyamic acid becomes in the range of 0.2 to 0.7 dL/g, preferably 0.3 to 0.6 dL/g at 30° C. If the instrinsic viscosity of the polyamic acid is too low, i.e., the degree of polymerization is to low, it would be difficult to obtain a polyimide resin having a sufficient heat resistance, whereas if the instrinsic viscosity of the polyamic acid is too high, i.e., the degree of polymerization is too high, it becomes more difficult to completely fill the fine ruggedness formed on the surface of a substrate.

The preparation of polyimide resin from the polyamic acid constituting the first group of polyimide precursor of this invention may be performed by a heat treatment method wherein the polyamic acid is imidized by being heated at a temperature of 100° C. to 450° C.; by a light-irradiation method wherein a polyamic acid is imidized with light; or by a chemical treatment method wherein a polyamic acid is chemically imidized using an imidizing agent such as acetic anhydride. The polyimide resin prepared according to these methods is highly suited for use in forming a flat film even on a finely ragged surface of a substrate, since the viscosity of the solution containing the polyamic acid constituting the polyimide precursor is relatively low. Moreover, the polyimide resin prepared according to these methods is low in dielectric constant and hygroscopicity, and excellent in heat stability and also in environmental stability. In addition, since maleimide skeletons are introduced at the terminals of the polyimide precursor, the maleimide skeletons form cross-linkage directly or via excessive diamine components during the curing reaction. Therefore, even when the polyimide precursor has a relatively low melecular weight so that its solution has a low viscosity, a highly heat resistant polyimide resin can be obtained.

Then, the features of polyimide precursor (polyamic acid) constituting a second group of this invention will be discussed. This polyimide precursor has a molecular structure obtained by polymerizing (a) a diamine component containing 0.10 molar equivalent or more of an aromatic diamine compound represented by the following general formula (DA2), and (b) an acid anhydride component containing 0.80 molar equivalent or more of a tetracarboxylic dianhydride represented by the following general formula (DAH1). More specifically, the polyimide precursor, has a molecular structure obtained by polymerizing (a) 0.97 to 1.03 molar equivalent of said diamine compound containing said fluorine-containing diamine compound represented by the general formula (DA2), and (b) $(1-n_2/2)$ molar equivalent of said tetracarboxylic dianhydride represented by the general formula (DAH1) and $n_2$ molar equivalent of a dicarboxylic anhydride, wherein $n_2$ ranges from 0 to 0.4, or (a') $(1-n_3/2)$ molar equivalent of said diamine compound containing 0.1 molar equivalent or more of said fluorine-containing diamine compound represented by the general formula (DA2) and $n_3$ molar equivalent of a monoamine compound, wherein $n_3$ ranges from 0 to 0.4, and (b') 0.97 to 1.03 molar equivalent of said tetracarboxylic dianhydride represented by the general formula (DAH1). The polyimide precursor according to this second group differs from that of the first group mentioned above in that it no more requires the inclusion of maleic acid anhydride or maleic acid derivative anhydride.

The aromatic diamine compound having a molecular structure represented by the general formula (DA2) includes those represented by the following general formulas (DA3) to (DA5).

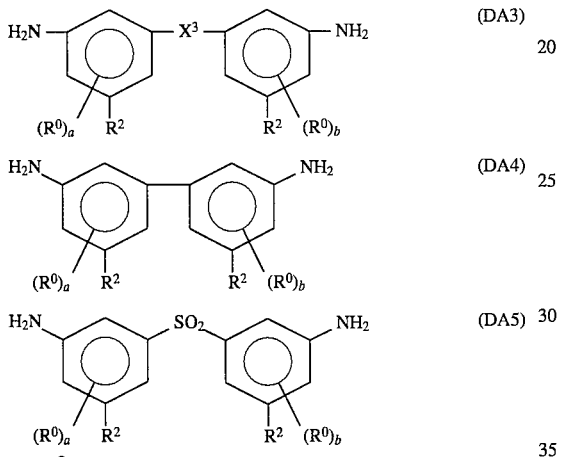

wherein $X^3$ in the formula (DA3) represents a perfluoroalkylene or perfluoroalkylidene group; and $R^0$ and $R^2$ substitutents and a and b are the same as defined in the general formula (DA2).

Examples the aromatic diamine compound represented by a general formula (DA3) includes 2,2-bis[3-amino-5-(trifluoromethyl)phenyl]-1,1,1,3,3,3-hexafluoropropane, 2,2-bis[3-amino-5-(pentafluoroethyl)phenyl]-1,1,1,3,3,3-hexafluoropropane, 2,2-bis[3-amino-5-(heptafluoropropyl)phenyl]-1,1,1,3,3,3-hexafluoropropane, 2,2-bis[3-amino-5-(nonafluorobutyl)phenyl]-1,1,1,3,3,3-hexafluoropropane, 2,2-bis(3-amino-5-fluorophenyl)-1,1,1,3,3,3-hexafluoropropane, bis[3-amino-5-(trifluoromethyl)phenyl]difluoromethane, 1,2-bis[3-amino-5-(trifluoromethyl)phenyl]-1,1,2,2-tetrafluoroethane, 1,3-bis[3-amino-5-(trifluoromethyl)phenyl]-1,1,2,2,3,3-hexafluoropropane, 2,2-bis[3-amino-5-(trifluoromethyl)phenyl]-1,1,1,3,3,4,4,4-octafluorobutane and 1,4-bis[3-amino-5-(trifluoromethyl)phenyl]-1,1,2,2,3,3,4,4-octafluorobutane.

Examples the aromatic diamine compound represented by a general formula (DA4) includes 3,3'-diamino-5,5'-difluorobiphenyl, 3,3'-diamino-5,5'-bis(trifluoromethyl)biphenyl, 3,3'-diamino-5-fluorobiphenyl and 3,3'-diamino-5-(trifluoromethyl)biphenyl.

Examples the aromatic diamine compound represented by a general formula (DA5) includes 3,3'-diamino-5,5'-difluorodiphenylsulfone, 3,3'-diamino-5,5'-bis(trifluoromethyl)diphenylsulfone, 3,3'-diamino-5-fluorodiphenylsulfone, and 3,3'-diamino-5-(trifluoromethyl)diphenylsulfone.

These aromatic diamine compounds may be used singly or in combination of two or more.

The aromatic diamine compound represented by the general formula (DA3) can be synthesized by the following steps. Namely, (1) first, a compound represented by the general formula (DZ1) is heated together with a compound represented by $R^2$—X after dissolving them in an organic solvent or without using any solvent in the presence of particulate copper catalyst in an autoclave, thereby obtaining a compound represented by the general formula (DR1). (2) Next, the compound represented by the general formula (DR1) is dissolved in concentrated sulfuric acid or fuming sulfuric acid and then nitrated with fuming nitric acid, thereby obtaining a dinitro compound represented by the general formula (DN1). (3) Finally, the nitro group of the dinitro compound represented by the general formula (DN1) is reduced to obtain the aromatic diamine compound represented by the general formula (DA3).

Examples of the organic solvent suited for use in the step (1) are N,N-dimethylformamide, N,N-dimethylacetamide, N-methyl-2-pyrrolidone, dimethylsulfoxide, sulforan, nitrobenzene, benzene and naphthalene. Examples of the reducing agent suited for use in reducing the nitro group into amino group in the step (3) are palladium catalyst, Raney nickel catalyst, iron chloride catalyst, tin chloride catalyst, ammonium sulfide catalyst and hydrazine.

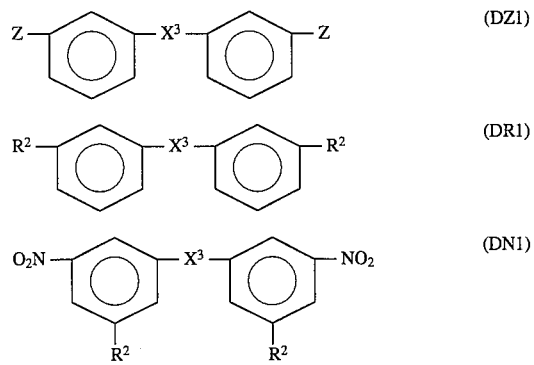

wherein Z represents iodo, bromo or chloro; and $X^3$ and $R^2$ are the same as defined in the general formula (DA3).

The aromatic diamine compound represented by a general formula (DA4) can be synthesized by the following steps. Namely, a nitrobenzene compound represented by the general formula (NZ1) is heated to subject it to a coupling reaction after dissolving it in an organic solvent or without using any solvent in the presence of particulate copper catalyst, thereby obtaining a fluorine-containing 3,3'-dintrobiphenyl compound represented by the general formula (DN2). Then, the nitro group of the fluorine-containing 3,3'-dintrobiphenyl compound represented by the general formula (DA4) is reduced to obtain a fluorine-containing 3,3'-diaminobiphenyl compound represented by the general formula (A4).

Examples of the nitrobenzene compound represented by the general formula (NZ1) are 3-chloro-5-fluoronitrobenzene, 3-bromo-5-fluoronitrobenzene, 3-iodo-5-fluoronitrobenzene, 3-chloro-5-nitrobenzofluoride, 3-bromo-5-nitrobenzofluoride and 3-iodo-5-nitrobenzofluoride. As for the organic solvent to be used for the coupling reaction, and the reducing agent to be used for reducing the nitro group into amino group may be the same as those explained in the synthesis of the compound represented by the general formula (DA3).

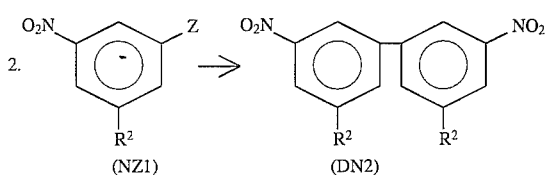

wherein Z represent iodo, bromo or chloro; and R² is the same as defined in the general formula (DA3).

According to the second group of polyimide precursor (polyamic acid) of this invention, these fluorine-containing aromatic diamine compounds represented by a general formula (DA2) function to improve the heat stability of polyimide resin. In view of sufficiently improving the heat stability of the polyimide resin, the amount of the fluorine-containing aromatic diamine compounds represented by a general formula (DA2) should preferably be in the ratio of 0.10 molar equivalent or more, more preferably 0.20 molar equivalent or more based on the whole diamine components.

It is also possible according to the second group of polyimide precursor of this invention to use a diamine compound represented by the general formula (DA6) or other kind of diamine compounds as in the case of the first group of polyimide precursor of this invention as far as the physical properties of the polyimide resin to be finally obtained would not be deteriorated.

According to the second group of polyimide precursor of this invention, the same kinds of tetracarboxylic dianhydride represented by the general formula (DAH1) as used in the first group of polyimide precursor of this invention can be employed. It is preferable to employ these tetracarboxylic dianhydrides represented by the general formula (DAH1) in the ratio of 0.80 molar equivalent or more, more preferably 0.90 molar equivalent or more based on the total amount of the whole acid anhydride components. The reason for limiting the amount of the tetracarboxylic dianhydrides represented by the general formula (DAH1) is the same as explained in the first group of polyimide precursor.

In view of obtaining a highly heat-resistant polyimide resin having a high glass transition temperature and a decomposition temperature, it is preferable to employ the aromatic tetracarboxylic dianhydrides represented by the general formulas (DAH2) to (DAH4) mentioned above among the tetracarboxylic dianhydrides represented by the general formulas (DAH1).

In the second group of polyimide precursor, a dicarboxylic anhydride or monoamine compound may be used if required.

Examples of the dicarboxilic anhydride are maleic anhydride, citraconic anhydride, dimethylmaleic anhydride, ethylmaleic anhydride, diethylmaleic anhydride, propylmaleic anhydride, butylmaleic anhydride, chloromaleic anhydride, dichloromaleic anhydride, bromomaleic anhydride, dibromomaleic anhydride, fluoromaleic anhydride, difluoromaleic anhydride and (trifluoromethyl)maleic anhydride, bis-(trifluoromethyl) maleic anhydride, cyclobutanedicarboxylic anhydride, cyclopentanedicarboxilic anhydride, cyclohexanedicarboxilic anhydride, tetrahydrophthalic anhydride, endomethylenetetrahydrophthalic anhydride, methyltetrahydrophthalic anhydride, methylendomethylenetetrahydrophthalic anhydride, phthalic anhydride, methylphthalic anhydride, ethylphthalic anhydride, dimethylphthalic anhydride, fluorphthalic anhydride, difluorphthalic anhydride, chlorophthalic anhydride, dichlorophthalic anhydride, bromophthalic anhydride, dibromophthalic anhydride, nitrophthalic anhydride, 2,3-benzophenonedicarboxylic anhydride, 3,4-benzophenonedicarboxylic anhydride, 2,3-dicarboxydiphenyl ether anhydride, 3,4-dicarboxydiphenyl ether anhydride, 2,3-dicarboxydiphenylsulfone anhydride, 3,4-dicarboxydiphenylsulfone anhydride, 2,3-dicarboxybiphenyl anhydride, 3,4-dicarboxybiphenyl anhydride, 1,2-naphthalenedicarboxylic anhydride, 2,3-naphthalenedicarboxylic anhydride, 1,8-naphthalenedicarboxylic anhydride, 1,2-anthracenedicarboxylic anhydride, 2,3-anthracenedicarboxylic anhydride, 1,9-anthracenedicarboxylic anhydride, 2,3-pyridinedicarboxyline anhydride, and 3,4-pyridinedicarboxyline anhydride.

Example of monoamine compound are methylamine, ethylamine, propylamine, butylamine, pentylamine, hexylamine, heptylamine, octylamine, 1-(3-aminopropyl)-1,1,3,3,3,-pentamethydisiloxane, vinylamine, allylamine, glycine, alanine, aminobutyric acid, valine, norvaline, isovaline, leucine, norleucine, isoleucine, glutamine, glutamic acid, tryptophan, aminocrotonic acid, aminoacetonitrile, aminopropiononitrile, aminocrotononitrile, cyclopropylamine, cyclobutylamine, cyclopentylamine, cyclohexylamine, cycloheptylamine, cyclooctylamine, aminoadamantane, aminobenzocyclobutane, aminocaprolactam, aniline, chloroaniline, dichloroaniline, bromoaniline, dibromoaniline, fluoroaniline, difluoroaniline, nitroaniline, dinitroaniline, toluidine, xylidine, ethylaniline, anisidine, phenetidine, aminoacetanilide, aminoacetophenone, aminobenzoic acid, aminobenzaldehyde, aminobenzonitrile, aminophthalonitrile, aminobenzotrifluoride, aminostyrene, aminostilbene, aminoazobenzene, aminodiphenyl ether, aminodiphenyl sulfone, aminobenzenesulfonamide, aminophenylmaleimide, aminophenylphthalimide, aminobiphenyl, aminoterphenyl, aminonaphthalene, aminoacridine, aminoanthraquinone, aminofluorene, aminofluorenone, aminopyrrolidine, aminopiperazine, aminopiperidine, aminohomopiperidine, aminomorpholine, aminobenzodioxole, aminobenzodioxane, aminopyridine, aminopyridazine, aminopyrimidine, aminopyrazine, aminoquinoline, aminocinnoline, aminophthalazine, aminoquinazoline, aminoquinoxaline, aminopyrrole, aminoimidazole, aminopyrazole, aminotriazole, aminooxazole, aminoisoxazole, aminothiazole, aminoisothiazole, aminoindole, aminobenzimidazole, aminoindazole, aminobenzoxazole, aminobenzothiazole, benzylamine, phenethylamine, phenylpropylamine, phenylbutylamine, benzhydrylamine, aminoethyl-1,3-dioxolane, aminoethylpyrrolidine, aminoethylpiperazine, aminoethylpiperidine, aminoethylmorpholine, aminopropylimidazole, aminopropylcyclohexane.

As for the method of synthesizing the polyimide precursor of the second group of this invention, it is preferable to react the diamine component containing a fluorine-containing aromatic diamine compound represented by the general formula (DA2) with an acid anhydride component comprising tetracarboxylic dianhydride represented by the general formula (DAH1) in an organic solvent. The reaction conditions regarding the organic solvent, temperature, pressure and reaction time are the same as those employed in the reaction of the first group of polyimide precursor of this invention.

The polyamic acid obtained by this reaction preferably has such a degree of polymerization that the instrinsic viscosity of the 0.5 w/v % N-methyl-2-pyrrolidone solution of the polyamic acid becomes in the range of 0.5 dL/g or more at 30° C. If the degree of polymerization of the polyamic acid is too low, it would be difficult to obtain a polyimide resin having a sufficient heat resistance. On the other hand, the instrinsic viscosity of the polyamic acid is not specifically ristricated. However, if the degree of polymerization of the polyamic acid is too high, it becomes more difficult to completely fill the fine reggedness formed on the surface of a substrate. Therefore, it is preferable that the intrinsic viscosity be 0.8 dL/g or less in order to form a film excellent in flatness on the surface of the substrate having fine ruggedness.

The preparation of polyimide resin from polyamic acid constituting a second group of polyimide precursor of this invention can be carried out in the same manner as explained with reference to the first group of polyimide precursor of this invention. The polyimide resin prepared from the second group of polyimide precursor of this invention is low in dielectric constant and hygroscopicity as well as excellent in heat stability and also in environmental stability. In particular, a polyimide precursor formed of an aromatic diamine compound represented by the general formula (DA3) is preferable in view of obtaining a polyimide resin which is low in dielectric constant. Further, a polyimide precursor formed of an aromatic diamine compound represented by the general formula (DA4) or (DA5) is preferable in view of obtaining a polyimide resin which is high in glass transition temperature as well as in decomposition temperature and excellent in heat resistance.

Followings are explanation regarding the photosensitive polyimide precursor of this invention.

The photosensitive polyimide precursor of a first group of this invention comprises (a) the above-mentioned polyimide precursor of the first group or the second group of this invention and (b) a photosensitive agent.

In the photosensitive polyimide precursor of the first group of this invention, an amine having a double bond, more preferably a tertialy amine having a double bond, or a compound having an azide group can be used as the photosensitive agent. Namely, examples of them are 2-(N,N-dimethylamino)ethyl acrylate, 2-(N,N-dimethylamino)ethyl methacrylate, 2-(N,N-diethylamino)ethyl acrylate, 2-(N,N-diethylamino)ethyl methacrylate, 3-(N,N-dimethylamino) propyl acrylate, 3-(N,N-dimethylamino)propyl methacrylate, 2-allylpyridine, 4-allylpyridine, 3-(N,N-dimethylamino)propylacrylamide, acroylmorpholine, 2-aminoethyl acrylate, 4-(N,N-dimethylamino)butyl acrylate and 2-(N,N-dimethylamino)ethyl cinnamate. The compounds represented by the following chemical formulas can also be employed as the photosensitive agent.

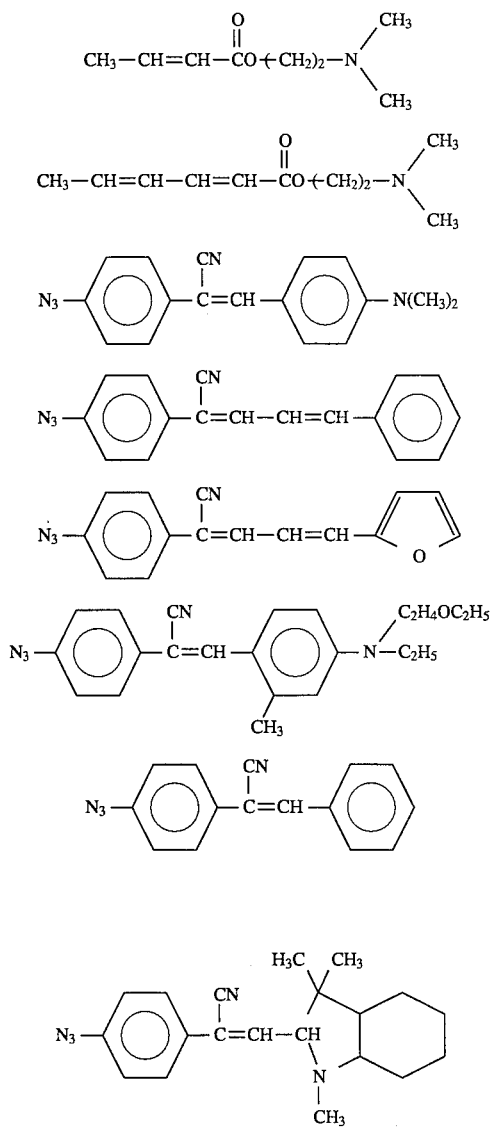
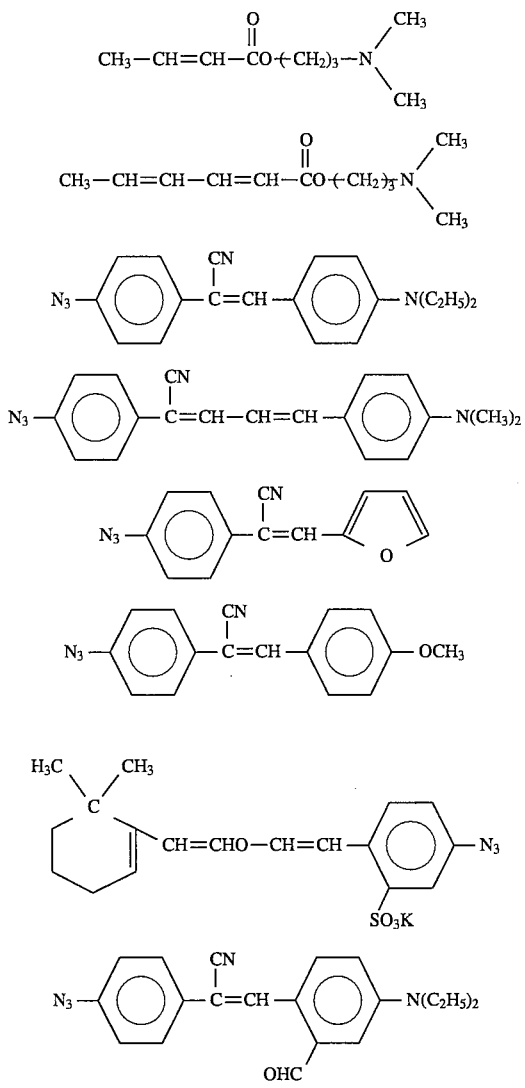

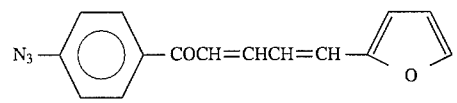
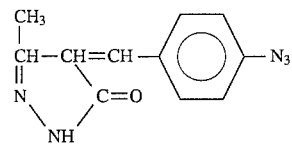
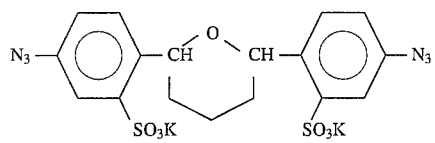
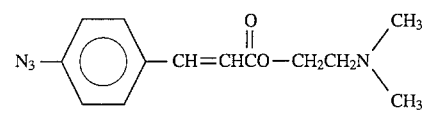
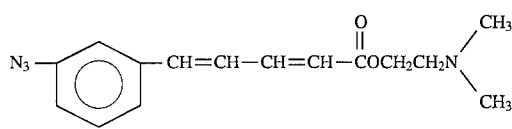
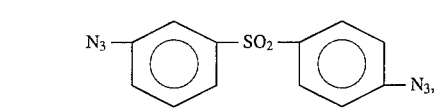
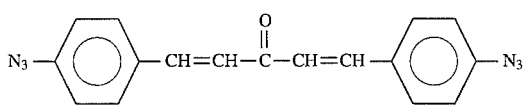
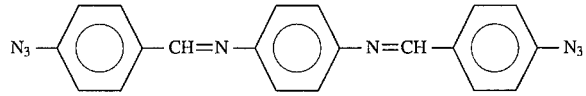
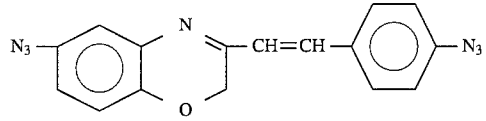
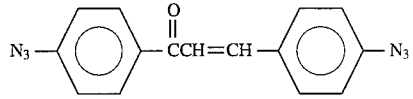
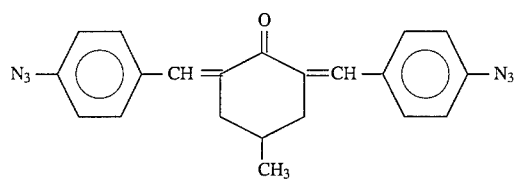
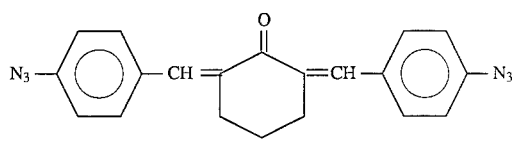
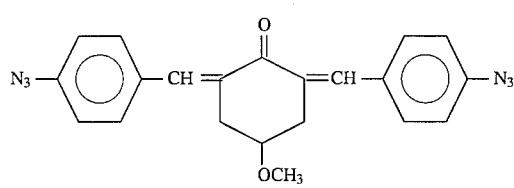
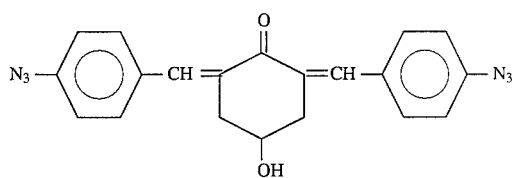

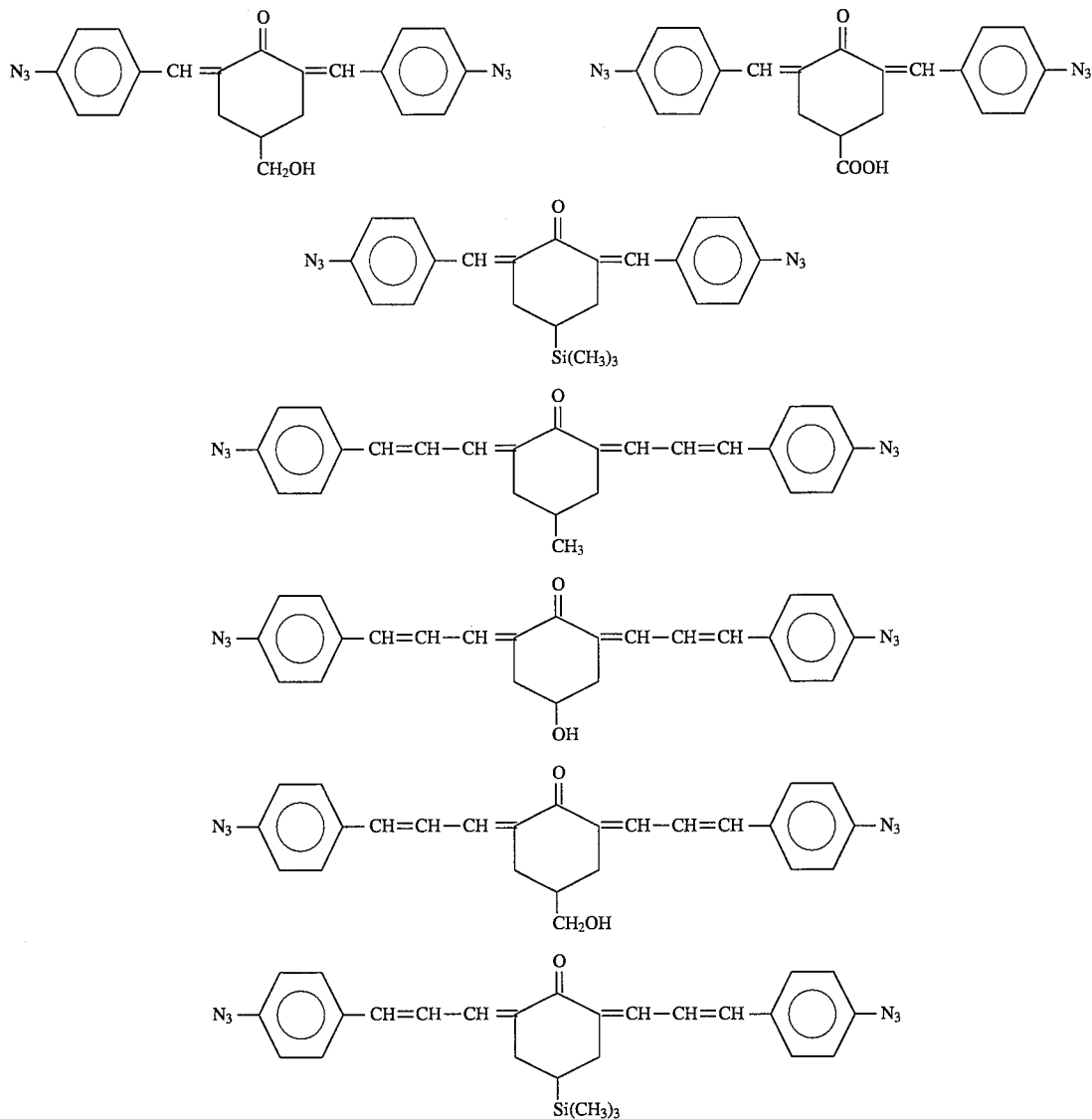

The photosensitive agent can be used by selecting at least one of these compounds described above. The amount of the photosensitive agent should preferably be 0.1 to 120 parts by weight, preferably 0.5 to 100 parts by weight based on 100 parts by weight of the polyimide precursor. If the amount of the photosensitive agent is lower than 0.1 parts by weight, the sensitivity of the photosensitive polyimide precursor to the light would become insufficient so that it becomes difficult to differentiate the dissolving speed to a developing agent between an exposed portion and an unexposed portion. On the other hand, if the amount of the photosensitive agent exceeds over 120 parts by weight, the problem of the residue of photosensitive agent after the developing step would be raised.

It is also possible to incorporate a sensitizing agent, if required, into the photosensitive polyimide precursor of the first group of this invention. Examples of such a sensitizing agent are benzophenone, anthraquinone, benzoquinone, 2-methylanthraquinone, 1,4-naphthoquinone, 1,2-benzoanthraquinone, Michler's ketone, 4,4'-dimethylbenzophenone, 5-nitroacenaphthene, benzoyl ether, 4,4'-bis(diethylamino)benzophenone, 2,6-bis[4-(dimethylamino)benzylidene] cyclohexanone, 4-(t-butyl)-2,6-bis[4-(dimethylamino)benzylidene]cyclohexanone, 3,3'-carbonyl bis[7-(diethylamino)coumarin], 3-(2-benzimidazolyl)-7-(diethylamino)coumarin, N-phenylglycine, 2-(dimethylamino)ethylbenzoate, ethyl-4-(dimethylamino)benzoate, diethylthioxanthene, isopropylthioxanthene, 2,4,6-trimethylbenzoildiphenylphosphine oxide, benzyldimethyl ketal, 2-methyl-[4-(methylthio)phenyl]-2-morpholino-1-propane, 1-hydroxycyclohexyl phenyl ketone, anthorone, acridine and methyl-4-(dimethylamino)benzoate.

The sensitizing agent can be used by selecting at least one of these compounds described above. The amount of the sensitizing agent should preferably be 0.5 to 50 parts by weight, preferably 1 to 30 parts by weight based on 100 parts by weight of the photosensitive agent. The employment of the sensitizing agent is advantageous in improving the photosensitive property of the photosensitive polyimide precursor of the first group of this invention.

The photosensitive polyimide precursor of the first group of this invention can be prepared in the form of a varnish by dissolving a photosensitive agent together with a sensitizing agent, if required, in a solution of any predetermined polyimide precursor synthesized in an organic solvent as explained above. The concentration of polyimide precursor in a varnish should preferably be 5 to 30 wt %. Any solvents other than the above-mentioned organic solvents may be employed in the process of preparing a varnish for the purpose of adjusting the viscosity of the varnish whereby improving the coating property of the varnish to a substrate. Examples of such solvents are isopropanol, methanol, ethylene glycol, butyl acetate, cellosolve, butyl cellosolve, diethyleneglycol methy lether, diethyleneglycol ethyl ether, ethyleneglycol acetate monoethyl ether, diethyleneglycol dimethyl ether and xylene. It is also possible to incorporate depending on the end-use a surfactant and silane coupling agent into the photosensitive polyimide precursor of the first group of this invention.

The photosensitive polyimide precursor of the first group of this invention can be used for forming, for example, a pattern of insulating layer for a semiconductor device as explained below. First, the varnish of a photosensitive polyimide precursor is filtered to remove fine insoluble matters, and then coated over the surface of the semiconductor substrate by means of spin-coating or dipping. The resultant layer is then heated for drying it at a temperature of 60° to 100° C., thereby forming a layer of the photosensitive polyimide precursor. On this layer of the photosensitive polyimide precursor is then disposed a mask having a predetermined pattern through which an energy ray such as X-ray, visible light, infrared ray, ultraviolet ray or electron beam is irradiated. As a result, the photosensitive agent is caused to react thereby causing the polymer chain of the resin component in the exposed portion to be cross-linked. This reaction differs in mechanism depending on the kinds of the photosensitive agent, i.e., (1) an azide compound or (2) an amine having a double bond such as acrylate. (1) when an azide compound is employed as a photosensitive agent, the azide compound (AZ) in the exposed portion is transformed into a nitrene radical (NR). If an amine having a double bond, for example, 2-N,N-dimethylaminoethyl acrylate is added in the precursor, the nitrene radical thus formed gives rise to a cross-linking reaction of the double bond of the amine which has been introduced into the polyimide precursor by means of an ionic bond or a hydrogen abstraction reaction, thereby causing the cross-linking of polymer chains in the exposed portion. (2) When an amine having a double bond such as acrylate is employed as a photosensitive agent, bigroup is caused to generate by the irradiation of energy ray in the double bond portion of the compound, thereby causing the recombination between these groups to occur in a manner of chain reaction. Since these acrylates are introduced into a polyimide precursor by means of ionic bond by merely adding to the varnish, the cross-linking of polymer chains is caused at the portions thereof. If required, the varnish layer may be heat-treated for 5 to 60 minutes at a temperature of 80° to 200° C. This heat treatment causes the cross-linking of the polymer chains of the resin component to become stronger.

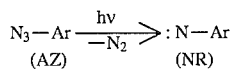 (1)

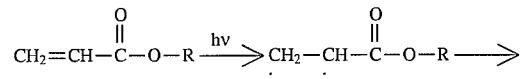 (2)

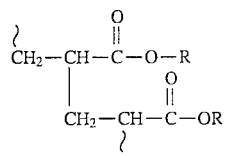

The development of the layer of photosensitive polyimide precursor thus irradiated by the energy ray may be performed by a dipping method, a spray method or paddle method using a developer. As a result, the unexposed posed portion is dissolved by the developer, since the polymer chains of the unexposed portion are not cross-linked. On the other hand, the exposed portion is not dissolved by the developer, since the polymer chains are cross-linked. Regarding the developer, an organic solvent employed in the manufacture of the polyimide precursor can be used. Further, in order to make easy the development, another solvent may be used together with such a developer. Examples of such a solvent are methanol, ethanol, isopropylalcohol, ethyl acetate, butyl acetate, acetone, cellosolve, methyl cellosolve, butyl cellosolve, ethyleneglycol acetate monoethyl lether, toluene, xylene and water. A rinsing may be performed for removing any residual developer after the development by using water, alcohol or acetone. A baking may also be performed following the rinsing.

Finally, the relief patterns of the photosensitive polyimide precursor formed by the development is heated under a predetermined condition. Through this heat treatment, the photosensitive agent attached to the polymer chains of the polyimide precursor can be removed, any solvent remaining in the relief pattern is evaporated, and the ring closure of amic acid is caused thereby forming a polyimide pattern. This heat treatment should preferably be carried out by gradually raising the temperature from room temperature to the final heating temperature of 150° to 450° C. If the final temperature is set to less than 150° C., a portion of the polyimide precursor may not be imidized remaining as a residue thus hindering the heat stability of the product. On the other hand, if the final temperature is set to more than 450° C., an imidized portion of the polymer may be decomposed thereby hindering the heat stability of the polyimide product.

Next, the photosensitive polyimide precursor of a second group of this invention will be explained.

The photosensitive polyimide precursor of the second group of this invention comprises (a) a polyamic acid derivative having a repeating unit represented by the general formula (PA11) and (b) a photopolymerization initiator. Here, it is preferable that the polyamic acid derivative contains 25% or more of the repeating units represented by the formula (PA11) in the whole repeating units for a sufficient photosensitive property.

In the general formula (PA11), Y represents a tetravalent organic group originating from a tetracarboxylic dianhydride, L is a residual group of diamine compound represented by the general formula (DA1). $D^1$ substituents denote a photosensitive organic group or OH, and at least one of $D^1$ substituents is a photosensitive organic group. Examples of $D^1$ are represented by the following chemical formula.

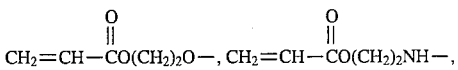

-continued $$CH_2=C(CH_3)-CO(CH_2)_2O-,\ CH_2=C(CH_3)-CO(CH_2)_2NH-,$$

$$CH_2=CH-CO(CH_2)_3O-,\ CH_2=CH-CO(CH_2)_3NH-,$$

$$CH_2=C(CH_3)-CO(CH_2)_3O-,\ CH_2=C(CH_3)-CO(CH_2)_3NH-,$$

$$CH_3-CH=CHCO(CH_2)_2O-,$$

$$(CH_2=CHCH_2OCH_2)_3CCH_2O-,$$

$$C_6H_5-CH=CHCO-(CH_2)_2-O-,$$

There is no restriction regarding the method of synthesizing the polyamic acid derivative represented by the general formula (PA11). For example, a method disclosed in R. Rubner et al, Photograph. Sci. Eng., 23(5), p303 (1979). Specifically, 2-hydroxyethyl methacrylate is caused to react with tetracarboxylic dianhydride, thereby synthesizing a dicarboxylic diester in which a photosensitive organic group introduced in the tetracarboxylic dianhydride. Then, the dicarboxylic diester is caused to react with thionyl chloride, thereby transforming the carboxyl group into a carboxylic chloride. Finally, the resultant product is caused to react with a desired diamine compound to obtain a polyamic acid derivative represented by the general formula (PA11). It is preferable to synthesice the polyamic acid derivative by means of a reaction in an organic solvent. As for the organic solvent, the same kinds of organic solvents as used in the synthesis of the polyimide precursors of the first and second group can also be used in this case.

As a photopolymerization initiator to be used in the photosensitive polyimide precursor of the second group of this invention, at least one compound is used that is selected from the group consisting of the azide compounds among the photosensitive agents and sensitizing agents that may be used of required, which are explained with reference to the photosensitive polyimide precursor of the first group of this invention. The amount of the photopolymerization initiator to be added is 0.05 to 30 parts by weight, preferably 0.1 to 20 parts by weight based on 100 parts by weight of polyamic acid derivative represented by the general formula (PA11).

The method of forming a pattern of insulating layer using the photosensitive polyimide precursor of the second group of this invention may be the same as explained with reference to the photosensitive polyimide precursor of the first group of this invention.

Next, there will be further explained with respect to the precursor of the bismaleimide-based cured resin of this invention. This bismaleimide-based cured resin precursor has a molecular structure obtained by reacting to some degree (a) a bismaleimide compound represented by the general formula (DM1) with (b) at least one compound selected from the group consisting of diamine compound represented by the general formula (DA11) and bivalent phenol compounds represented by the general formula (OP1).

Examples of bismaleimide compounds represented by the general formula (DM1) constituting the (a) component of the bismaleimide-based cured resin precursor of this invention are 3,3'-dimaleimido-5,5'-bis(trifluoromethyl)biphenyl, bis[3-maleimido-5-(trifluoromethyl)phenyl]ether, bis[3-maleimido-5-(trifluoromethyl)phenyl]sulfide, bis[3-maleimido-5-(trifluoromethyl)phenyl]sulfone, 3,3'-dimaleimido-5,5'-bis(trifluoromethyl)benzophenone, 1,3-bis[3-maleimido-5-(trifluoromethyl)phenyl]-1,1,3,3-tetramethyl disiloxane, 2,2-bis[3-maleimido-5-(trifluoromethyl)phenyl]-1,1,1,3,3,3-hexafluoropropane, 1,3-bis[3-maleimido-5-(trifluoromethyl)phenoxy]benzene, 1,4-bis[3-maleimido-5-(trifluoromethyl) phenoxy]benzene, 3,5-bis[3-maleimidophenoxy]-benzotrifluoride, 3,5-bis[3-maleimido-5-(trifluoromethyl)phenoxy]benzotrifluoride, 3,3'-difluoro-5,5'-dimaleimido biphenyl, bis(3-fluoro-5-maleimidophenyl)ether, bis(3-fluoro-5-maleimidophenyl)sulfide, bis(3-fluoro-5-maleimidophenyl)sulfone, 3,3''-difluoro-5,5'-dimaleimidobenzophenone, 1,3-bis(3-fluoro-5-maleimidophenyl)-1,1,3,3-tetramethyl disiloxane, 2,2-bis(3-fluoro-5-maleimidophenyl)-1,1,1,3,3,3-hexafluoropropane, 1,3-bis(3-fluoro-5-maleimidophenoxy)benzene, 1,4-bis(3-fluoro-5-maleimidophenoxy)benzene, 1,3-bis(3-fluoro-5-maleimidophenoxy)-5-fluorobenzene and 1,4-bis(3-fluoro-5-maleimidophenoxy)-5-fluorobenzene.

There is no restriction as to the method of synthesizing the bismaleimide compound represented by the general formula (DM1). However the synthesis is generally carried out as follows. Namely, (1) one molar equivalent of the aromatic diamine compound represented by the general formula (DA31) is reacted in an organic solvent with two molar equivalent or more of the maleic anhydride or maleic acid derivative anhydride represented by the general formula (MA1) thereby sythesizing a bismaleamic acid compound represented by the general formula (DMA1). (2) Then, one molar equivalent of the bismaleamic acid compound represented by the general formula (DMA1) is mixed in an organic solvent with 2 to 4 molar equivalent of acetic anhydride as a dehydrating agent, and the mixed solution is subjected to dehydration cyclization in the presence of 0.05 to 2 molar equivalent of a base and 0.005 to 0.2 molar equivalent of a catalyst thereby synthesizing the bismaleimide compound represented by the general formula (DM1).

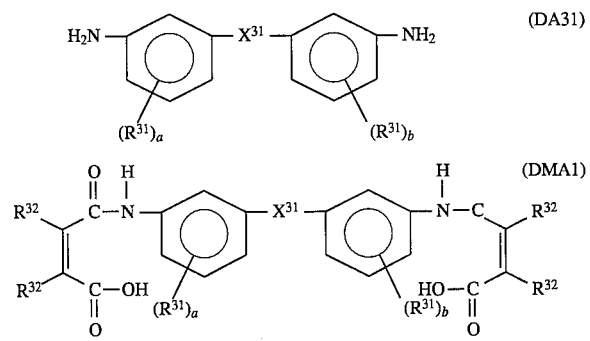

wherein $X^{31}$ is bivalent oxy, thio, sulfonyl, carbonyl, peralkylpolysiloxanylene, 1,3-phenylenedioxy, 1,4-phenylenedioxy, or a nonsubstituted or fluoro-substituted aliphatic hydrocarbon group, or a single bond; $R^{31}$ substituents may be the same or different and represent individually fluoro or a nonsubstituted or fluoro-substituted aliphatic hydrocarbon group, at least one R31 being fluoro or a fluoro-substituted aliphatic hydrocarbon group; $R^{32}$ substituents may be the same or different and represent individually halo or a nonsubstituted or fluoro-substituted aliphatic hydrocarbon group, or a hydrogen atom; a and b are an integer of 1 to 4 respectively.

Examples of aromatic diamine compounds represented by the general formula (DA31) are 3,3'-diamino-5,5'-bis(trifluoromethyl) biphenyl, bis[3-amino-5-(trifluoromethyl)phenyl]ether, bis[3-amino-5-(trifluoromethyl)phenyl]sulfide, bis[3-amino-5-(trifluoromethyl)phenyl]sulfone, 3,3'-diamino-5,5'-bis(trifluoromethyl)benzophenone, 1,3-bis[3-amino-5-(trifluoromethyl)phenyl]-1,1,3,3-tetramethyl disiloxane, 2,2-bis[3-amino-5-(trifluoromethyl)phenyl]-1,1,1,3,3,3-hexafluoropropane, 1,3-bis[3-amino-5-(trifluoromethyl)phenoxy]benzene, 1,4-bis[3-amino-5-(trifluoromethyl)phenoxy]benzene, 3,5-bis[3-aminophenoxy]benzotrifluoride, 3,5-bis[3-amino-5-(trifluoromethyl)phenoxy]benzotrifluoride, 3,3'-diamino-5,5'-difluorobiphenyl, bis(3-amino-5-fluorophenyl)ether, bis(3-amino-5-fluoro phenyl) sulfide, bis(3-amino-5-fluorophenyl) sulfone, 3,3'-diamino-5,5'-difluorobenzophenone, 1,3-bis(3-amino-5-fluorophenyl)-1,1,3,3-tetramethyl disiloxane, 2,2-bis[3-amino-5-fluorophenyl)-1,1,1,3,3,3-hexafluoropropane, 1,3-bis(3-amino-5-fluorophenoxy)benzene, 1,4-bis(3-amino-5-fluorophenoxy)benzene and 1,3-bis(3-amino-5-fluorophenoxy)-5-fluorobenzene.

Examples of the maleic anhydride or maleic acid derivative anhydride represented by the general formula (MA1) are the same as explained above.

Examples of the organic solvent suitable for use in the reaction of the step (1) are acetone, methyl ethyl ketone, methyl isobutyl ketone, diisopropyl ketone, cyclohexanone, chloroform, methylene chloride, dichloroethane, trichloroethylene, N,N-dimethylformamide, N,N-dimethylacetamide, N,N-diethylacetamide, N,N-dimethoxyacetamide, N-methyl-2-pyrrolidone, 1,3-dimethyl-2-imidazolidinone, N-methylcaprolactam, diethyl ether, dipropyl ether, 1,2-dimethoxyethane, bis(2-methoxyethyl)ether, bis(2-methoxyethoxy)ethane, bis[2-(2-methoxyethoxy)ethyl]ether, tetrahydrofuran, 1,3-dioxane, 1,4-dioxane, pyrroline, picoline, dimethylsulfoxide and sulforan. These solvents may be used singly or in combination of two or more.

The reaction temperature of the synthesis is generally 100° C. or lower, preferably 30° C. or lower. There is no restriction as to the reaction pressure, and the reaction can be performed under the normal pressure. The reaction time is dependent on the kind of aromatic diamine compound and also on the kind of solvent, but generally the reaction period ranging from 0.5 to 24 hours would be sufficient.

The base to be used in the reaction step (2) may be selected from metallic salt of acetic acid and tertiary amine. For example, sodium acetate, potassium acetate, trimethylamine, triethylamine and tributylamine may be employed.

The catalyst to be used in the reaction step (2) may be selected from oxides of alkaline earth metals, and the carbonate, sulfate, phosphate and acetate of any of iron (II), iron (III), nickel (II), magnesium (II), manganese (III), copper (I), copper (II), cobalt (II) and cobalt (III). These catalysts may be used singly or in combination of two or more of them. Among them, most preferable are nickel (II) acetate, cobalt (III) acetate and magnesium oxide.

The organic solvent to be used in the reaction step (2) may be selected from those useful in the reaction step (1). Therefore, there is no need in this reaction to isolate the bismaleamic acid compound produced in the reaction step (1).

The reaction temperature of the synthesis is generally 200° C. or lower, preferably 20° to 120° C. There is no restriction as to the reaction pressure, and the reaction can be performed under the normal pressure. The reaction time is dependent on the kind of bismaleamic acid compound and also on the kind of solvent, but generally the reaction period ranging from 0.5 to 24 hours would be sufficient. After finishing the reaction, the precipitated crystals are filtered or poured into water or methanol thereby obtaining the aimed bismaleimide compound.

Examples of diamine compounds represented by the general formula (DA11) among the (b) components of the precursor of bismaleimide-based cured resin of this invention are 1,3-phenylenediamine, 1,2-phenylenediamine, 1,4-phenylenediamine, 3-aminobenzylamine, 4-aminobenzylamine, 4,4'-diaminodiphenyl ether, 3,3'-diaminodiphenyl ether, 3,4'-diaminodiphenyl ether, bis(3-aminophenyl)sulfide, (3-aminophenyl) (4-aminophenyl) sulfide, bis(4-aminophenyl) sulfide, bis(3-aminophenyl)sulfoxide, (3-aminophenyl) (4-aminophenyl)sulfoxide, bis(4-aminophenyl)sulfoxide, bis(3-aminophenyl) sulfone, (3-aminophenyl) (4-aminophenyl)sulfone, bis(4-aminophenyl)sulfone, 3,3,'-diaminobenzophenone, 3,4,'-diaminobenzophenone, 4,4,'-diaminobenzophenone, 3,3'-diaminobiphenyl, 3,4'-diaminobiphenyl, 4,4,'-diaminobiphenyl, 1,3-phenylene-4,4'-dianiline, 1,4-phenylene-4,4'-dianiline, 3,3,'-diaminodiphenylmethane, 3,4,'-diaminodiphenylmethane, 4,4,'-diaminodiphenylmethane, 3,3,'-diaminodiphenylethane, 3,4,'-diaminodiphenylethane, 4,4,'-diaminodiphenylethane, 3,3,'-diaminodiphenylpropane, 3,4'-diaminodiphenylpropane, 4,4,'-diaminodiphenylpropane, 1,3-bis(3-aminophenoxy)benzene, 1,4-bis(3-aminophenoxy)benzene, 1,3-bis(4-aminophenoxy)benzene, 1,4-bis(4-aminophenoxy)benzene, 2,2-bis(3-aminophenyl)-1,1,1,3,3,3-hexafluoropropane, 2,2-bis(4-aminophenyl)-1,1,1,3,3,3-hexafluoropropane, 1,3-bis[2-(4-aminophenyl)-2-propyl]benzene, 1,4-bis[2-(4-aminophenyl)-2-propyl]benzene, 2,2-bis[4-(4-aminophenoxy)phenyl]-1,1,1,3,3,3-hexafluoropropane, 2,2-bis[4-(3-aminophenoxy)phenyl]-1,1,1,3,3,3-hexafluoropropane, bis[3-amino-5-(trifluoromethyl)phenyl]ether, bis[4-amino-2-(trifluoromethyl)phenyl]ether, bis[3-amino-5-(trifluoromethyl)phenyl]sulfone, bis[4-amino-2-(trifluoromethyl)phenyl]sulfone, 4,4'-diamino-2,2'-bis(trifluoromethyl)biphenyl, 3,3'-diamino-5,5'-bis(trifluoromethyl)biphenyl, 2,2'-bis[3-amino-5-(trifluoromethyl)phenyl]-1,1,1,3,3,3-hexafluoropropane, 1,8-diaminonaphthalene, 2,7-diaminonaphthalene, 2,6-diaminonaphthalene, 2,5-diaminopyridine, 2,6-diaminopyridine, 2,6-diamino-4-(trifluoromethyl)pyridine, 2,5-diaminopyrazine, 2,4-diamino-s-triazine, methanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,2-bis(3-aminopropoxy)ethane, 1,3-diaminocyclohexane, 1,4-diaminocyclohexane, bis(3-aminocyclohexyl) methane, bis(4-aminocyclohexyl)methane, 1,2-bis(3-aminocyclohexyl)ethane, 1,2-bis(4-aminocyclohexyl)ethane, 2,2-bis(3-aminocyclohexyl)propane, 2,2-bis(4-aminocyclohexyl)propane, bis(3-aminocyclohexyl)ether, bis(4-aminocyclohexyl)ether, bis(3-aminocyclohexyl) sulfone, bis(4-aminocyclohexyl) sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine and 1,4-xylylenediamine. These diamine compounds may be used singly or in combination of two or more.

In view of improving the heat resistance and environmental stability of the bismaleimide cured resin to be obtained, it is preferable to employ the following diamine compounds having an aromatic ring among the diamine compounds represented by the general formula (DA11). Namely, they are 1,2-phenylenediamine, 1,4-phenylenediamine, 4,4'-diaminodiphenyl ether, 3,3'-diaminodiphenyl ether, 3,4'-diaminodiphenyl ether, bis(3-aminophenyl) sulfone, (3-aminophenyl) (4-aminophenyl) sulfone, bis(4-aminophenyl) sulfone, 3,3'-diaminobenzophenone, 3,4'-diaminobenzophenone, 4,4'-diaminobenzophenone, 3,3'-diaminobiphenyl, 3,4'-diaminobiphenyl, 4,4'-diaminobiphenyl, 1,3-phenylene-4,4'-dianiline, 1,4-phenylene-4,4'-dianiline, 3,3'-diaminodiphenylmethane, 3,4'-diaminodiphenylmethane, 4,4'-diaminodiphenylmethane, 3,3'-diaminodiphenylethane, 3,4'-diaminodiphenylethane, 4,4'-diaminodiphenylethane, 3,3'-diaminodiphenylpropane, 3,4'-diaminodiphenylpropane, 4,4'-diaminodiphenylpropane, 1,3-bis(3-aminophenoxy) benzene, 1,4-bis(3-aminophenoxy) benzene, 1,3-bis(4-aminophenoxy)benzene, 1,4-bis(4-aminophenoxy)benzene, 2,2-bis(3-aminophenyl)-1,1,1,3,3,3-hexafluoropropane, 2,2-bis(4-aminophenyl)-1,1,1,3,3,3-hexafluoropropane, 1,3-bis[2-(4-aminophenyl)-2-propyl]benzene, 1,4-bis[2-(4-aminophenyl)-2-propyl]benzene, 2,2-bis[4-(4-aminophenoxy)phenyl]-1,1,1,3,3,3-hexafluoropropane, 2,2-bis[4-(3-aminophenoxy)phenyl]-1,1,1,3,3,3-hexafluoropropane, bis[3-amino-5-(trifluoromethyl)phenyl] ether, bis[4-amino-2-(trifluoromethyl)phenyl]ether, bis[3-amino-5-(trifluoromethyl)phenyl]sulfone, bis[4-amino-2-(trifluoromethyl)phenyl]sulfone, 4,4'-diamino-2,2'-bis(trifluoromethyl)biphenyl, 3,3'-diamino-5,5'-bis(trifluoromethyl)biphenyl, 2,2'-bis[3-amino-5-(trifluoromethyl)phenyl]-1,1,1,3,3,3-hexafluoropropane, 1,8-diaminonaphthalene, 2,7-diaminonaphthalene, 2,6-diaminonaphthalene, 2,5-diaminopyridine, 2,6-diaminopyridine, 2,6-diamino-4-(trifluoromethyl)pyridine, 2,5-diaminopyrazine and 2,4-diamino-s-triazine.

It is possible to incorporate bis(aminoalkyl) peralkylpolysiloxane represented by the general formula (DA6) into these diamine compounds. The bis(aminoalkyl) peralkylpolysiloxane is effective in improving the adhesion properties of bismaleimide-based cured resin onto a glass substrate or semiconductor substrate. It is preferable to employ the polysiloxane compounds in the ratio of 0.02 to 0.2 molar equivalent based on the total amount of the whole diamine components. If the polysiloxane compounds are used in excess to the upper limit, it may give rise to the lowering of heat resistance of the resultant bismaleimide-based cured resin though the adhesion properties of the resin onto these substrates may be improved.

The bivalent phenol compounds represented by the general formula (DP1) among the (b) components of the precursor of bismaleimide-based cured resin of this invention may be selected from the following compounds. Namely, they are resorcinol, pyrocatechol, hydroquinone, 4,4'-dihydroxydiphenyl ether, 3,3,'-dihydroxydiphenyl ether, 3,4,'-dihydroxydiphenyl ether, bis(3-hydroxyphenyl) sulfide, (3-hydroxyphenyl)(4-hydroxyphenyl) sulfide, bis(4-hydroxyphenyl)sulfide, bis(3-hydroxyphenyl) sulfoxide, (3-hydroxyphenyl)(4-hydroxyphenyl) sulfoxide, bis(4-hydroxyphenyl)sulfoxide, bis(3-hydroxyphenyl)sulfone, (3-hydroxyphenyl) (4-hydroxyphenyl)sulfone, bis(4-hydroxyphenyl)sulfone, 3,3,'-dihydroxybenzophenone, 3,4,'-dihydroxybenzophenone, 4,4,'-dihydroxybenzophenone, 3,3,'-dihydroxybiphenyl, 3,4,'-dihydroxybiphenyl, 4,4,'-dihydroxybiphenyl, 1,3-phenylene-4,4'-diphenol, 1,4-phenylene-4,4'-diphenol, 3,3,'-dihydroxydiphenylmethane, 3,4,'-dihydroxydiphenylmethane, 4,4,'-dihydroxydiphenylmethane, 3,3,'-dihydroxydiphenylethane, 3,4'-dihydroxydiphenylethane, 4,4,'-dihydroxydiphenylethane, 3,3,'-dihydroxydiphenylpropane, 3,4,'-dihydroxydiphenylpropane, 4,4,'-dihydroxydiphenylpropane, 1,3-bis(3-hydroxyphenoxy)benzene, 1,4-bis(3-hydroxyphenoxy)benzene, 1,3-bis(4-hydroxyphenoxy)benzene, 1,4-bis(4-hydroxyphenoxy)benzene, 2,2-bis(3-hydroxyphenyl)-1,1,1,3,3,3-hexafluoropropane, 2,2-bis(4-hydroxyphenyl)-1,1,1,3,3,3-hexafluoropropane, 1,3-bis[2-(4-hydroxyphenyl)-2-propyl]benzene, 1,4-bis[2-(4-hydroxyphenyl)-2-propyl] benzene, 2,2-bis[4-(4-hydroxyphenoxy)phenyl]-1,1,1,3,3,3-hexafluoropropane, 2,2-bis[4-(3-hydroxyphenoxy)phenyl]-1,1,1,3,3,3-hexafluoropropane, bis[3-hydroxy-5-(trifluoromethyl)phenyl]ether, bis[4-hydroxy-2-(trifluoromethyl)phenyl]ether, bis[3-hydroxy-5-(trifluoromethyl)phenyl]sulfone, bis[4-hydroxy-2-(trifluoromethyl)phenyl]sulfone, 4,4'-dihydroxy-2,2'-bis(trifluoromethyl)biphenyl, 3,3'-dihydroxy-5,5'-bis(trifluoromethyl)biphenyl, 2,2-bis[3-hydroxy-5-(trifluoromethyl)phenyl]-1,1,1,3,3,3-hexafluoropropane, 1,8-dihydroxynaphthalene, 2,7-dihydroxynaphthalene, 2,6-dihydroxynaphthalene, 2,5-dihydroxypyridine, 2,6-dihydroxypyridine, 2,6-dihydroxy-4-(trifluoromethyl)pyridine, 2,5-dihydroxypyrazine, 2,4-dihydroxy-s-triazine, 1,3-bis[3-(4-hydroxyphenyl)propyl]-1,1,3,3-tetramethyl disiloxane, 1,3-bis[4-(4-hydroxyphenyl)butyl]-1,1,3,3-tetramethyl disiloxane, 1,3-bis[3-(4-hydroxyphenyl)propyl]-1,1,3,3-tetraphenyl, 1,5-bis[3-(4-hydroxyphenyl)propyl]-1,1,3,3,5,5-hexamethyltrisiloxane, 1,7-bis[3-(4-hydroxyphenyl)propyl]-1,1,3,3,5,5,7,7-octamethyltetrasiloxane and 1,9-bis[3-(4-hydroxyphenyl)propyl]-1,1,3,3,5,5,7,7,9,9-decamethylpentasiloxane.

These bivalent phenol compounds may be employed singly or in combination of two or more.

In the bismaleimide-based cured resin precursor of this invention, the (b) component (curing agent component), i.e. at least one compound selected from the group consisting of diamine compounds and bivalent phenol compounds may be employed in a ratio of 0.01 to 2 molar equivalent per 1 molar equivalent of bismaleimide compound constituting the (a) component. More preferably, the diamine compound is used in the ratio of 0.2 to 0.8 molar equivalent, and the bivalent phenol compound is used in the ratio of 0.7 to 1.3 molar equivalent, respectively, with respect to 1 molar equivalent of bismaleimide compound. If the curing agent compound (b) is used in an amount less than the lower limit, it may give rise to the lowering of heat resistance of the resultant cured resin made from the precursor, since the curing reaction does not preceded sufficiently. Moreover, because the bismaleimide compound is excessively used in this case, the reaction between the bismaleimide compounds occurs during the curing reaction, resulting to lower the flexibility of the cured resin. Whereas if the curing agent component is use in an amount in excess to the upper limit, it may give rise to the lowering of heat resistance and environmental stability, since the excessive curing agent will remain in the cured resin. In order to most effectively undergo the curing reaction between the components, it is preferably to use about 0.5 molar equivalent of diamine compound or about 1 molar equivalent of bivalent phenol compound with respect to 1 molar equivalent of bismaleimide compound.

If desired, a curing catalyst may be employed in the bismaleimide-based precursor of this invention for the purpose of accelerating the curing reaction. For example, boron tetrafluoride complex, aluminum complex/phenol catalyst and aluminum complex/silicon catalyst can be used as the curing catalyst. With a suitable use of these catalysts, the curing reaction can be controlled to obtain high molecular weight cured resins having various two-dimensional or three-dimentional structures. It is also possible according to the bismaleimide-based precursor of this invention to use various kinds of additives such as polyamic acid, epoxy resin, isocyanate compound, triazine resin, phenolic resin and acryl compound together with the above mentioned compound.

The bismaleimide-based precursor of this invention can be prepared in the form of a varnish by dissolving those components mentioned above in an organic solvent. Examples of the organic solvent suitable for use in this case are N,N-dimethylformamide, N,N-dimethylacetamide, N,N-diethylacetamide, N,N-dimethoxyacetamide, N-methyl-2-pyrrolidone, 1,3-dimethyl-2-imidazolidinone, N-methylcaprolactam, 1,2-dimethoxyethane, bis(2-methoxyethyl)ether, bis(2-methoxyethoxy) ethane, bis[2-(2-methoxyethoxy)ethyl]ether, tetrahydrofuran, 1,3-dioxane, 1,4-dioxane, pyrroline, picoline, dimethylsulfoxide and sulforan. These solvents may be used singly or in combination of two or more.

Furthermore, the resultant varnish is generally made into A-stage before using it as an interlayer insulating film for electronic parts. Namely, the varnish is heat-treated for 5 minutes to 5 hours at a temperature of 50° to 150° C. thereby effecting more or less the addition reaction between the bismaleimide compound and diamine compound or bivalent phenol compound, thus increasing the viscosity of the varnish so as to make easy the coating of the varnish.

Next, a method of using the bismaleimide-based precursor of this invention for forming an insulating film for electronic parts. First, the varnish of the bismaleimide-based precursor made into A-stage is coated on a surface of a substrate thereby forming a film. The resultant film is then heated for 5 to 10 minutes at a temperature of 50° to 150° C. thereby evaporating the solvent. Then, the film is placed in a vaccum oven or a oven filled with nitrogen gas to heat it at a prescribed temperature for curing the precursor. The heating temperature may be selected depending on the structure of bismaleimide compound employed, but the temperature is generally set in the range of 100° to 450° C. As a result, an insulating film consisting of bismaleimide-based cured resin is formed.

The bismaleimide-based cured resin thus formed is excellent not only in heat resistance, but also in environmental stability, i.e. even if the bismaleimide-based resin is left to stand in an air atmosphere for a long period of time, the generation of gas such as aniline due to hydrolysis may be controlled to a very lesser amount as compared with the conventional bismaleimide-based cured resin. Moreover, this bismaleimide-based cured resin is very low in dielectric constant and hygroscopicity.

This invention also provides electronic parts as explained below. The electronic parts according to this invention comprises an insulating member for an insulating film or substrate, the insulating member being formed of polyimide resin obtained from the curing of the above mentioned polyimide precursor or bismaleimide-based cured resin obtained from the curing of the above mentioned bismaleimide-based precursor. According to this electronic parts, since the polyimde resin or bismaleimide-based resin constituting the insulating member is low in relative dielectric constant and hygroscopicity, it is possible to realize high operating speed and power-saving of the electronic parts. Moreover, since the insulating member thus formed is excellent in hygroscopicity, and thermal and environmental stability, it is possible to obtain electronic parts of high reliability.

Specifically, the polyimde resin or bismaleimide-based cured resin proposed by this invention can be utilized as an insulating member for electronic parts, for example, an insulating film for a semiconductor device, such as an interlayer insulating film, a hygroscopic protecting film and an alpha ray interrupting film, a carrier film, a flat cable, a flexible printed wiring substrate, a film insulated coil, an interlayer insulating film for a thin film magnetic head or magnetic bubble memory and glass cloth laminating sheet.

Also, the polyimide resin of this invention is very suitable for a liquid crystal alignment film of a liquid crystal display.

This invention will be further explained with reference to drawings depicting electronic parts. Although only polyimide resin is used in the following embodiments, it is possible to use bismaleimide-based cured resin in place of polyimide resin in almost all cases.

FIG. 1 is a sectional view partially showing an interlayer insulating film of a semiconductor device, which is formed of polyimide resin made from the precursor according to this invention. Referring to FIG. 1, the semiconductor device comprises a silicon substrate 1, on which a field oxide film 12, a diffusion layer 13, a thermal oxide film 14 and a CVD oxide film 15 are formed. A contact hole 15 is formed in the thermal oxide film 14 deposited on the diffusion layer 13. A first aluminum electrode 16 is formed in such a manner as to contact with the diffusion layer 13 through the contact hole 15. An interlayer insulating film 17 is formed over the first electrode 16. A contact hole is formed in this interlayer insulating film 17, and a second aluminum electrode 18 is formed in such a manner as to contact with the first electrode 16 through the contact hole 17. A passivation film 19 of polyimide resin is formed covering the whole upper surface of the device.

Figure 2:
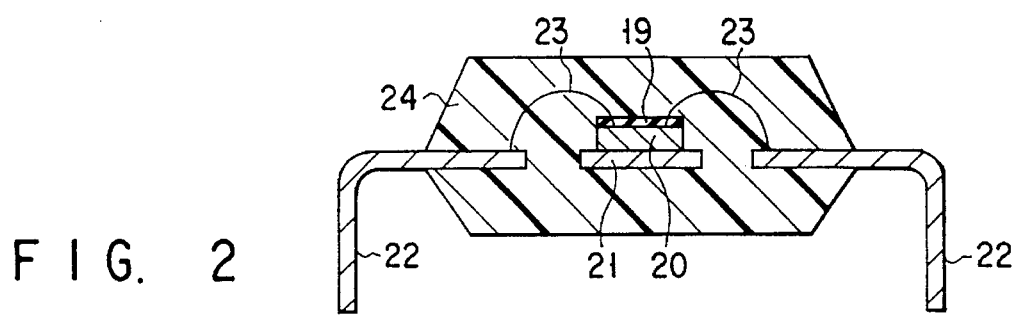
FIG. 2 is a sectional view illustrating a resin molded package having a passivation film consisting of polyimide resin formed from a precursor of this invention.

FIG. 2 depicts a sectional view showing a resin-molded package of a semiconductor tip wherein a passivation film consisting of polyimide resin is formed on the surface of the package. As seen in FIG. 2, a semiconductor tip 20 having a passivation film 19 of polyimide resin formed thereon is mounted on a bed 21. A bonding pad exposed out of the passivation film 19 formed on the surface of the semiconductor tip 20 is connected with a lead 22 via a wire 23. These elements are entirely molded with an encapsulating resin 24 excluding a portion of lead 23 which is protruded out of the encapsulating resin 24.

Figure 3:
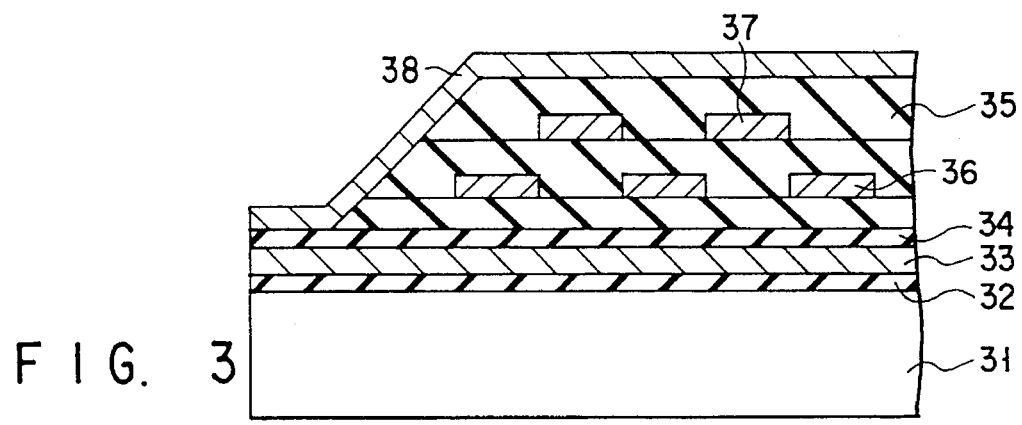
FIG. 3 is a sectional view illustrating a thin film magnetic head having an interlayer insulating film consisting of polyimide resin formed from a precursor of this invention.

FIG. 3 depicts a sectional view partially showing a thin film magnetic head wherein polyimide resin made from the precursor of this invention is applied to the interlayer insulating film thereof. As seen from FIG. 3, a lower alumina 32, a lower magnetic body 33 and a gap alumina 34 are deposited in this order on a surface of a substrate 31. On this gap alumina 34 is further formed a first conductive coil 36 and a second conductive coil 37, each being buried in an interlayer insulating film 35 of polyimide resin. Further, an upper magnetic body 38 is formed on the interlayer insulating film 35 in such a manner that the upper magnetic body 38 faces, at the distal end portion of the magnetic head, to the lower magnetic body 33 with the gap alumina 34 being interposed therebetween.

Figure 4:
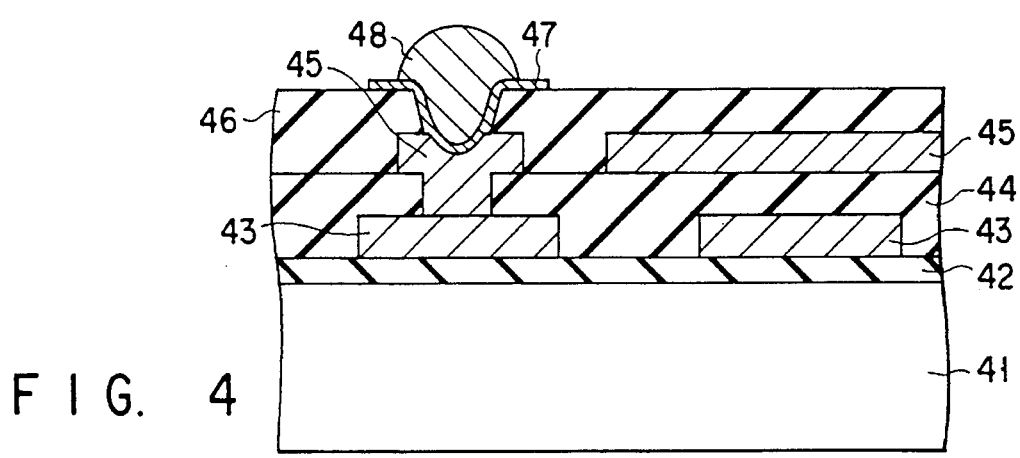
FIG. 4 is a sectional view illustrating a high-density wiring substrate having an interlayer insulating film consisting of polyimide resin formed from a precursor of this invention.

FIG. 4 depicts a sectional view partially showing a high density wiring substrate wherein polyimide resin made from the precursor of this invention is applied to the interlayer insulating film thereof. As seen from FIG. 4, a thermal oxide film 42 and a first copper wiring 43 are formed in this order on a surface of a silicon substrate 41. An interlayer insulating film 44 consisting of polyimide is formed over the first copper wiring 43. A contact hole is formed in this interlayer insulating film 44, thereby allowing the first copper wiring 43 to be connected with a second copper wiring 45 through the contact hole. Further, a passivation film 46 consisting of polyimide is formed all over the exposed surface. This passivation film 46 is provided with a contact hole through which a barrier metal 47 and a Pb/Sm bump 48 are formed contacting with the second copper wiring 45.

Figure 5:
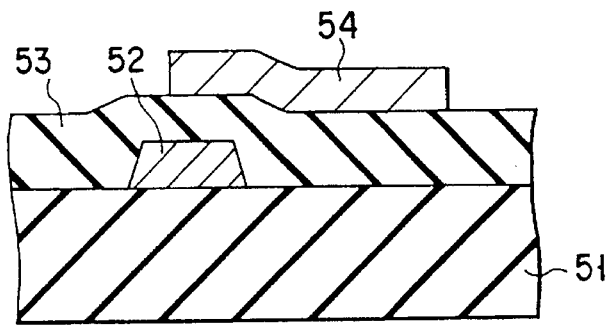
FIG. 5 is a sectional view illustrating a magnetic bubble memory device having an interlayer insulating film consisting of polyimide resin formed from a precursor of this invention.

FIG. 5 depicts a sectional view partially showing a magnetic bubble memory wherein polyimide resin made from the precursor of this invention is applied to the interlayer insulating film thereof. As seen from FIG. 5, a conductor 52 is formed on a garnet substrate 51, and an interlayer insulating film 53 consisting of polyimide resin is formed all over the exposed surface. Further, permalloy 54 is formed over the interlayer insulating film 53.

Figure 6:
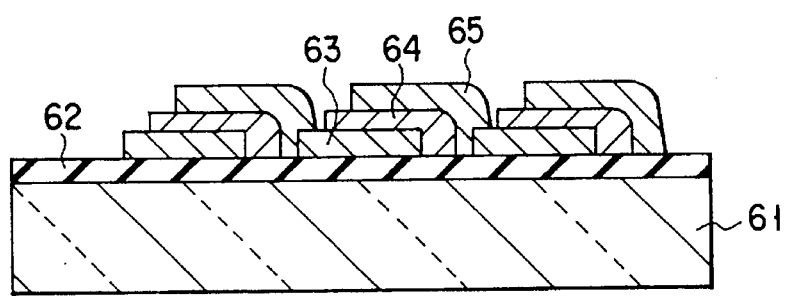
FIG. 6 is a sectional view illustrating a solar battery having a heat-resistant transparent resin film consisting of polyimide resin formed from a precursor of this invention.

FIG. 6 depicts a sectional view partially showing a solar battery wherein polyimide resin made from the precursor of this invention is applied to a heat resistant transparent resin layer thereof. As seen from FIG. 6, a heat resistant transparent resin layer 62 consisting of polyimide is formed on the entire upper surface of a glass substrate 61. A transparent electrode 63, amorphous Si 64 and a metallic electrode 65 are respectively formed on the heat resistant transparent resin layer 62 in predetermined patterns.

As shown in FIGS. 1 to 6, with the employment of polyimide precursor of this invention as an insulating member in any of electronic parts, it has become possible to extremely minimize the step in a wiring and therefore to flatten a wiring structure whereby enhancing the reliability of electronic parts. As explained above, since the polyimde resin or bismaleimide-based cured resin constituting the insulating member is low in relative dielectric constant and hygroscopicity, it is possible to realize high operating speed and power-saving of the electronic parts. Moreover, the polyimde resin as well as bismaleimide-based cured resin of this invention are excellent in hygroscopicity, and thermal and environmental stability.

Figure 7:
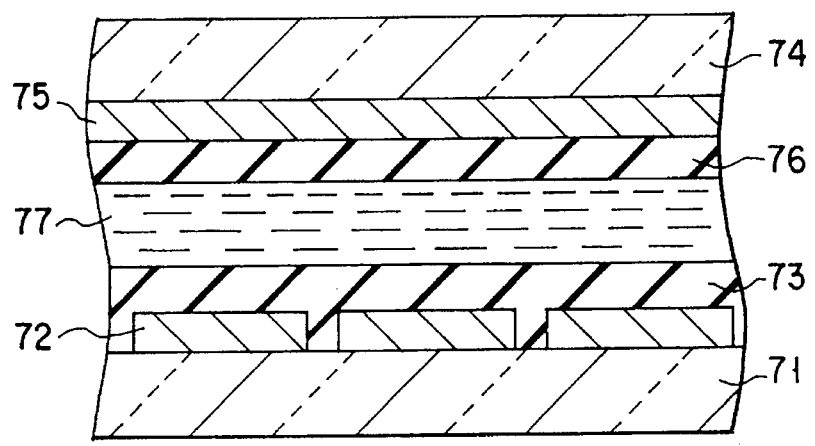
FIG. 7 is a sectional view illustrating a liquid crystal display having a liquid crystal alignment film consisting of polyimide resin formed from a precursor of this invention.

FIG. 7 depicts a sectional view partially showing a liquid crystal display having a liquid crystal alignment film consisting of a polyimide resin made from the precursor of this invention. As seen from FIG. 7, a pixel electrodes 72 and thin film transistors (not shown) are formed on the upper surface of a glass substrate 71, and then a liquid crystal alignment film 73 consisting of a polyimide resin is further formed thereon. On the other hand, a common electrode 75 is formed on the glass substrate 74, and then a liquid crystal alignment film 76 consisting of a polyimide resin is further formed thereon. These glass substrates 71 and 74 are disposed in parallel with the liquid crystal alignment films 73 and 76 being faced to each other leaving a predetermined gap therebetween. Then, a liquid crystal is filled in the space and sealed. It is possible to employ a color filter for obtaining a color display.

As for the substrate, polycarbonate, polyetherether ketone, polyether sulfone or polyethylene terephthalate may be employed in place of glass. Regarding the electrode, a transparent oxide such as ITO (Indium Tin Oxide) or indium oxide may be employed. The thickness of the liquid crystal alignment film may be in the range of 5 to 1000 nm, preferably 20 to 200 nm. The polyimide resin constituting the liquid crystal alignment film may be formed by coating a polyamic acid (a precursor) varnish on the surface of a substrate bearing electrodes, preliminarily drying the coated layer at a temperature of 90° to 120° C. and then heat-treating the layer at a temperature of 200° to 350° C. Subsequently, the polyimide resin film thus formed is subjected to rubbing thereby forming a liquid crystal alignment film. The liquid crystal alignment films formed on the couple of substrates are suitably rubbed depending on the end-use, i.e. they may be rubbed in the same direction, in a different direction (when they are assembled) twisted by 90 degrees from each other or twisted by 200 to 290 degrees from each other. For the purpose of stabilizing the alignment of the liquid crystal, the liquid crystal display may be annealed after filling the cell with a liquid crystal therein.

The liquid crystal alignment film consisting of polyimide resin made from the precursor of this invention is capable of giving a large pretilt angle to the liquid crystal, and moreover high in voltage retention in addition to the merits mentioned above.

EXAMPLES

This invention will be further explained in detail with reference to the following examples, but it is to be understood that this invention is not limited to the particular procedures, conditions and materials of these examples.

Examples 1-1 to 1-45 and Comparative Examples 1 to 5

(1) Synthesis of polyimide precursor (polyamic acid)

Polyamic acid was prepared as follows using, as shown in Tables 1 to 7, raw materials in a predetermined ratio (indicated in molar equivalent). First, 50 mL of N-methyl-2-pyrrolidone was placed under nitrogen gas atmosphere in a separable flask cooled with a refrigerant to a temperature of $-5°$ to $0°$ C. Then, a predetermined amount of tetracarboxylic dianhydride represented by the general formula (DAH1) was added as an acid anhydride component to the N-methyl-2-pyrrolidone and dissolved therein with stirring. To this solution was slowly dripped a solution of a diamine component viz. a predetermined amount of an aromatic diamine compound represented by the general formula (DA1) and bis(aminoalkyl) peralkyl polysiloxane compound represented by the general formula (DA6) in 50 mL of N-methyl-2-pyrrolidone by using a dropping funnel attached with a pressure equilibrium tube. After stirring the resultant mixed solution for two hours, a solution of predetermined amount of maleic anhydride in 50 mL of N-methyl-2-pyrrolidone was slowly dripped from a dropping funnel equipped with a pressure equilibrium tube into the mixed solution. The resultant mixed solution was further stirred for four hours to obtain a varnish containing the aimed polyamic acid.

Followings are explanations of the abbreviations employed in Tables 1 to 7.
(Tetracarboxylic dianhydride)
    6FDPA: 1,1,1,3,3,3-hexafluoro-2,2-propylidene-4,4'-diphthalic dianhydride.
    PMA: Pyromellitic dianhydride.
    BPTA: 3,4,3',4'-biphenyl tetracarboxylic dianhydride.
    ODPA: oxy-4,4'-diphthalic dianhydride.
    6FXTA: 9,9-bis(trifluoromethyl)xanthene-2,3,6,7-tetracarboxylic dianhydride.
(Maleic anhydride)
    MLA: maleic anhydride.
(Diamine compound)
    mSNDA: Sulfonyl-3,3'-dianiline.
    mPODA: 1,3-bis(3-aminophenoxy)benzene.
    mODA: Oxy-3,3'-dianiline.
    6FmODA: Oxy-5,5'-bis[3-(trifluoromethyl)aniline].
    3FmPODA: 3,5-bis(3-aminophenoxy)benzotrifluoride.
    6FmPODA: 1,3-bis[3-amino-5-(trifluoromethyl)phenoxy]benzene.
    9FmPODA: 3,5-bis[3-amino-5-(trifluoromethyl)phenoxy]benzotrifluoride.

3FmPDA: 5-(trifluoromethyl)-1,3-phenylenediamine.

6FmSNDA: 1,1'-bis[3-amino-5-(trifluoromethyl)phenyl]sulfone.

6FmBPDA: 3,3'-diamino-5,5'-bis(trifluoromethyl)biphenyl.

6FpBPDA: 4,4'-diamino-2,2'-bis(trifluoromethyl)biphenyl.

m6FDA: 1,1,1,3,3,3-hexafluoro-2,2-propylidene-3,3'-dianiline.

mPDA: 1,3-phenylenediamine.

mBPDA: 3,3'-diaminobiphenyl.

pBPDA: 4,4'-diaminobiphenyl.

pODA: Oxy-4,4'-dianiline.

p6FDA: 1,1,1,3,3,3-hexafluoro-2,2-propylidene-4,4,'-dianillne.

TSL9306: 1,3-bis(3-aminopropyl)-1,1,3,3-tetramethyldisiloxane.

Meanwhile, the compound employed in Comparative Example 1 was a polyamic acid which was commercially available (a product of Sumitomo Bakelite Co. Ltd., CRC-6061) and whose main raw materials were PMA (Pyromellitic dianhydride), CBDPA (3,3',4,4'-benzophenonetetracarboxylic dianhydride) and pODA (oxy-4,4'-dianiline). The compounds employed in Comparative Examples 2 to 5 were aromatic diamine compounds excepting those of the general formula (DA1).

A 0.5 w/v % N-methyl-2-pyrrolidone solution of each polyamic acid thus synthesized was measured of its intrinsic viscosity at a temperature of 30° C. The results thus measured were shown in Tables 1 to 7. As seen from Tables 1 to 7, it was comfirmed that a polyamic acid of low intrinsic viscosity as low as 0.5 or less could be synthesized by using maleic anhydride.

(2) Measurment of the properties of polyimide film (a) Decomposition-starting temperature Polyamic acid varnish was coated on the surface of a glass plates of 1 mm×130 mm×150 mm in size by means of a bar coater thereby forming a layer 75 μm in thickness, which was then prebaked for one hour at a temperature of 110° C. The resultant film was removed from the glass plate, and fixed to a brass frame having an inner area of 100 mm×100 mm. The film fixed in this manner was then heated in a desiccator filled with nigrogen gas, raising the temperature from room temperature to 150° C., 250° C. and then 350° C., each of these temperatures being kept for one hour, and finally heating it at a temperature of 400° C. for 30 minutes thereby obtaining a polyimide film. In this heating process, the heat-up time from one temperature to the next temperature was set to one hour. The polyimide film thus obtained was subjected to thermogravimetric analysis/differential thermal analysis (TG/DTA) in a nitrogen gas stream for measuring the temperature which causes a weight reduction of 0.5 wt. % to determine the decomposition-starting temperature of the polyimide film. As a result, all of polyimide films according to Examples 1-1 to 1-45 were confirmed to have a heat resistance which was comparable to that of Comparative Examples.

(b) Adhesion to a silicon substrate

Polyamic acid varnish was spin-coated on the surface of a silicon substrate having a diameter of 4 inches to obtain a coated layer having such a thickness that would become 5 to 10 μm thick after the curing thereof. The coated layer was then heated in a desic-cator filled with nigrogen gas, raising the temperature from room temperature to 150° C., 250° C. and then 350° C., each of these temperatures being kept for one hour, and finally heating it at a temperature of 400° C. for 30 minutes thereby obtaining a polyimide film. In this heating process, the heat-up time from one temperature to the next temperature was set to 30 minutes. The silicon substrate bearing this polyimide film was left to stand for 24 hours in a pressure cooker, the interior of which was maintained in a steam atmosphere of 120° C. and 2 atmospheric pressures. Subsequently, cellophane tape was adhered onto the surface of the polyimide film, and peeled from the substrate under a predetermined conditions to measure the ratio of peeled portion of the polyimide film. The adhesion properties of the polyimide film was determined by the value of this peeled ratio of the polyimide film. As a result, all of the polyimide films according to Examples 1-1 to 1-45 were confirmed to have superior adhesion properties to the silicon substrate as compared with those of Comparative Examples.

(c) Trench-filling properties

Polyamic acid varnish was spin-coated on the surface of a silicon substrate of 4 inches in diameter and having a trench 0.3 μm in width and 1.0 μm in depth to obtain a coated layer having such a thickness that would become 5 to 10 μm thick after the curing thereof. The coated layer thus formed was then cured under the same conditions as in the case of (b) thereby forming a polyimide film. Subsequently, the section of the trench was observed with a scanning electron microscope (SEM) to investigate the filling property of the polyimide resin to the trench. As a result, the trench was found as being completely and compactly filled with the polyimide in any of Examples 1-1 to 1-45. By contrast, in the case of Comparative Examples 1 to 5, the trench was not completely filled with polyimide leaving a large void in the trench.

(d) Dielectric constant

Polyamic acid varnish was spin-coated two to four times on the surface of an aluminum plate of 1 mm×100 mm×100 mm in size so as to obtain a coated layer having such a thickness that would become 40 to 60 μm thick after the curing thereof. The coated layer thus obtained was then heated in a desiccator filled with nigrogen gas, raising the temperature from room temperature to 150° C., 250° C. and then 350° C., each of these temperatures being kept for one hour, and finally heating it at a temperature of 400° C. for 30 minutes thereby obtaining a polyimide film. In this heating process, the heat-up time from one temperature to the next temperature was set to 30 minutes. The polyimide film thus obtained was measured of its dielectric constant under the condition of 10 kHz. It was found as a result that the dielectric constant of any of polyimide films in Examples 1-1 to 1-45 was 3.0 or less, which was very low as compared with that of polyimide film of Comparative Example 1, thus verifying an excellent dielectric property of the polyimide film of Examples 1-1 to 1-45.

(e) Amount of generated hydrolyric gas

A polyimide film was formed on a silicon substrate in the same manner as conducted in (b). The polyimide film thus formed was left to stand for one week under a saturated water vapor atmosphere at 20° C. Subsequently, the polyimide film was introduced into a pyrofoil and heat-treated with a Curie pyrolyser for 3 seconds at a temperature of 358° C., thereby allowing gas to be generated from the polyimide film. The gas components thus generated were then analyzed with GC-MASS. The amount of toluene, which is one of the hydrolytic gases, was evaluated by converting the integral value of the signals of toluene in the total ion chromatogram into a value per 1 mg of sample. As a result, it was found that the amount of generated toluene gas was very little in the case of polyimide films of Examples 1-1 to 1-45, so that the polyimide films of Examples 1-1 to 1-45 were excellent in environmental stability.

TABLE 1

| Raw materials | Example | | | | | | |
|---|---|---|---|---|---|---|---|
| (molar eq.) | 1-1 | 1-2 | 1-3 | 1-4 | 1-5 | 1-6 | 1-7 |
| 6FDPA | 0.96 | 0.93 | 0.96 | 0.93 | 0.96 | 0.93 | 0.95 |
| PMA | — | — | — | — | — | — | — |
| BPTA | — | — | — | — | — | — | — |
| ODPA | — | — | — | — | — | — | — |
| 6FXTA | — | — | — | — | — | — | — |
| MLA | 0.08 | 0.14 | 0.08 | 0.14 | 0.08 | 0.14 | 0.10 |
| mSNDA | 0.95 | 0.95 | — | — | — | — | — |
| mPODA | — | — | 0.95 | 0.95 | — | — | — |
| mODA | — | — | — | — | 0.95 | 0.95 | — |
| 6FmODA | — | — | — | — | — | — | 0.95 |
| 3FmPODA | — | — | — | — | — | — | — |
| 6FmPODA | — | — | — | — | — | — | — |
| 9FmPODA | — | — | — | — | — | — | — |
| 3FmPDA | — | — | — | — | — | — | — |
| 6FmSNDA | — | — | — | — | — | — | — |
| 6FmBPDA | — | — | — | — | — | — | — |
| 6FpBPDA | — | — | — | — | — | — | — |
| m6FDA | — | — | — | — | — | — | — |
| mPDA | — | — | — | — | — | — | — |
| mBPDA | — | — | — | — | — | — | — |
| pODA | — | — | — | — | — | — | — |
| p6FDA | — | — | — | — | — | — | — |
| TSL9306 | 0.05 | 0.05 | 0.05 | 0.05 | 0.05 | 0.05 | 0.05 |
| Properties | | | | | | | |
| Intrinsic viscosity [dL/g] | 0.42 | 0.32 | 0.46 | 0.35 | 0.45 | 0.34 | 0.38 |
| Decomposition-starting temperature [°C.] | 540 | 540 | 530 | 530 | 530 | 530 | 530 |
| Adhesiveness | 0/100 | 0/100 | 0/100 | 0/100 | 0/100 | 0/100 | 0/100 |
| Trench-filling Property | good | good | good | good | good | good | good |
| Dielectric constant | 2.86 | 2.88 | 2.82 | 2.84 | 2.84 | 2.85 | 2.62 |
| Moisture absorption coefficient [%] | 0.65 | 0.70 | 0.53 | 0.57 | 0.52 | 0.54 | 0.33 |
| Amount of decomposiotn gas | 750 | 800 | 1400 | 1600 | 1100 | 1200 | 1200 |

TABLE 2

| Raw materials | Example | | | | | | |
|---|---|---|---|---|---|---|---|
| (molar eq.) | 1-8 | 1-9 | 1-10 | 1-11 | 1-12 | 1-13 | 1-14 |
| 6FDPA | 0.95 | 0.95 | 0.95 | 0.95 | 0.95 | 0.95 | 0.95 |
| PMA | — | — | — | — | — | — | — |
| BPTA | — | — | — | — | — | — | — |
| ODPA | — | — | — | — | — | — | — |
| 6FXTA | — | — | — | — | — | — | — |
| MLA | 0.10 | 0.10 | 0.10 | 0.10 | 0.10 | 0.10 | 0.10 |
| mSNDA | — | 0.40 | 0.70 | 0.40 | 0.40 | 0.40 | 0.40 |
| mPODA | — | — | — | — | — | — | — |
| mODA | — | — | — | — | — | — | — |
| 6FmODA | — | — | — | 0.55 | — | — | — |
| 3FmPODA | — | — | — | — | — | — | — |
| 6FmPODA | 0.95 | — | — | — | 0.55 | — | — |
| 9FmPODA | — | — | — | — | — | — | — |
| 3FmPDA | — | 0.55 | 0.25 | — | — | — | — |
| 6FmSNDA | — | — | — | — | — | 0.55 | — |
| 6FmBPDA | — | — | — | — | — | — | 0.55 |
| 6FpBPDA | — | — | — | — | — | — | — |
| m6FDA | — | — | — | — | — | — | — |
| mPDA | — | — | — | — | — | — | — |
| mBPDA | — | — | — | — | — | — | — |
| pODA | — | — | — | — | — | — | — |
| p6FDA | — | — | — | — | — | — | — |
| TSL9306 | 0.05 | 0.05 | 0.05 | 0.05 | 0.05 | 0.05 | 0.05 |
| Properties | | | | | | | |
| Intrinsic viscosity [dL/g] | 0.36 | 0.35 | 0.37 | 0.36 | 0.33 | 0.35 | 0.37 |
| Decomposition-starting temperature [°C.] | 530 | 535 | 540 | 535 | 535 | 540 | 540 |
| Adhesiveness | 0/100 | 0/100 | 0/100 | 0/100 | 0/100 | 0/100 | 0/100 |
| Trench-filling Property | good | good | good | good | good | good | good |
| Dielectric constant | 2.56 | 2.75 | 2.81 | 2.72 | 2.69 | 2.73 | 2.72 |
| Moisture absorption coefficient [%] | 0.30 | 0.42 | 0.58 | 0.49 | 0.47 | 0.48 | 0.41 |
| Amount of decomposiotn gas | 1800 | 1300 | 1000 | 1050 | 1400 | 850 | 900 |

TABLE 3

| Raw materials | Example | | | | | | |
|---|---|---|---|---|---|---|---|
| (molar eq.) | 1-15 | 1-16 | 1-17 | 1-18 | 1-19 | 1-20 | 1-21 |
| 6FDPA | 0.95 | 0.95 | 0.95 | 0.95 | 0.95 | 0.95 | 0.95 |
| PMA | — | — | — | — | — | — | — |
| BPTA | — | — | — | — | — | — | — |
| ODPA | — | — | — | — | — | — | — |
| 6FXTA | — | — | — | — | — | — | — |
| MLA | 0.10 | 0.10 | 0.10 | 0.10 | 0.10 | 0.10 | 0.10 |
| mSNDA | 0.40 | — | — | — | — | — | — |
| mPODA | — | — | — | — | — | — | — |
| mODA | — | 0.40 | 0.40 | 0.40 | 0.40 | — | — |
| 6FmODA | — | — | 0.55 | — | — | — | — |
| 3FmPODA | — | — | — | — | — | — | — |
| 6FmPODA | — | — | — | — | — | — | — |
| 9FmPODA | — | — | — | — | — | — | — |
| 3FmPDA | — | 0.55 | — | — | — | 0.95 | — |
| 6FmSNDA | — | — | — | 0.55 | — | — | 0.95 |
| 6FmBPDA | — | — | — | — | — | — | — |
| 6FpBPDA | 0.55 | — | — | — | 0.55 | — | — |
| m6FDA | — | — | — | — | — | — | — |
| mPDA | — | — | — | — | — | — | — |
| mBPDA | — | — | — | — | — | — | — |
| pODA | — | — | — | — | — | — | — |
| p6FDA | — | — | — | — | — | — | — |
| TSL9306 | 0.05 | 0.05 | 0.05 | 0.05 | 0.05 | 0.05 | 0.05 |
| Properties | | | | | | | |
| Intrinsic viscosity [dL/g] | 0.40 | 0.39 | 0.37 | 0.40 | 0.38 | 0.42 | 0.34 |
| Decomposition-starting temperature [°C.] | 535 | 535 | 530 | 535 | 530 | 535 | 540 |
| Adhesiveness | 0/100 | 0/100 | 0/100 | 0/100 | 0/100 | 0/100 | 0/100 |
| Trench-filling Property | good | good | good | good | good | good | good |
| Dielectric constant | 2.75 | 2.74 | 2.71 | 2.72 | 2.74 | 2.72 | 2.64 |
| Moisture absorption coefficient [%] | 0.42 | 0.36 | 0.41 | 0.41 | 0.35 | 0.24 | 0.32 |
| Amount of decomposiotn gas | 6200 | 1400 | 1200 | 1000 | 84000 | 1600 | 900 |

TABLE 4

| Raw materials | Example | | | | | | |
|---|---|---|---|---|---|---|---|
| (molar eq.) | 1-22 | 1-23 | 1-24 | 1-25 | 1-26 | 1-27 | 1-28 |
| 6FDPA | 0.95 | 0.95 | 0.95 | 0.95 | — | — | — |
| PMA | — | — | — | — | 0.95 | — | 0.95 |
| BPTA | — | — | — | — | — | 0.95 | — |
| ODPA | — | — | — | — | — | — | — |
| 6FXTA | — | — | — | — | — | — | — |
| MLA | 0.10 | 0.10 | 0.10 | 0.10 | 0.10 | 0.10 | 0.10 |
| mSNDA | — | — | — | — | — | — | — |
| mPODA | — | — | — | — | — | — | — |
| mODA | — | — | — | — | — | — | — |
| 6FmODA | — | — | — | — | 0.95 | 0.95 | — |
| 3FmPODA | — | — | — | — | — | — | — |
| 6FmPODA | — | — | — | — | — | — | — |
| 9FmPODA | — | — | — | — | — | — | — |
| 3FmPDA | — | — | — | — | — | — | 0.95 |
| 6FmSNDA | — | — | — | — | — | — | — |
| 6FmBPDA | 0.95 | — | — | — | — | — | — |
| 6FpBPDA | — | — | — | — | — | — | — |
| m6FDA | — | 0.95 | — | — | — | — | — |
| mPDA | — | — | 0.95 | — | — | — | — |
| mBPDA | — | — | — | 0.95 | — | — | — |
| pODA | — | — | — | — | — | — | — |
| p6FDA | — | — | — | — | — | — | — |
| TSL9306 | 0.05 | 0.05 | 0.05 | 0.05 | 0.05 | 0.05 | 0.05 |
| Properties | | | | | | | |
| Intrinsic viscosity [dL/g] | 0.32 | 0.34 | 0.44 | 0.33 | 0.42 | 0.40 | 0.44 |
| Decomposition-starting temperature [°C.] | 540 | 530 | 535 | 540 | 530 | 530 | 535 |
| Adhesiveness | 0/100 | 0/100 | 0/100 | 0/100 | 0/100 | 0/100 | 0/100 |
| Trench-filling Property | good | good | good | good | good | good | good |
| Dielectric constant | 2.62 | 2.70 | 2.81 | 2.79 | 2.92 | 2.89 | 2.87 |
| Moisture absorption coefficient [%] | 0.20 | 0.38 | 0.72 | 0.58 | 0.52 | 0.48 | 0.65 |
| Amount of decompositon gas | 1000 | 900 | 1500 | 800 | 800 | 1000 | 1200 |

TABLE 5

| Raw materials | Example | | | | | | |
|---|---|---|---|---|---|---|---|
| (molar eq.) | 1-29 | 1-30 | 1-31 | 1-32 | 1-33 | 1-34 | 1-35 |
| 6FDPA | — | — | — | — | — | — | — |
| PMA | — | 0.95 | — | — | — | — | — |
| BPTA | 0.95 | — | 0.95 | — | — | — | — |
| ODPA | — | — | — | — | — | — | — |
| 6FXTA | — | — | — | 0.95 | 0.95 | 0.95 | 0.95 |
| MLA | 0.10 | 0.10 | 0.10 | 0.10 | 0.10 | 0.10 | 0.10 |
| mSNDA | — | — | 0.95 | — | — | — | — |
| mPODA | — | — | — | — | — | — | — |
| mODA | — | — | — | — | 0.95 | — | — |
| 6FmODA | — | — | — | — | — | — | — |
| 3FmPODA | — | — | — | — | — | — | — |
| 6FmPODA | — | — | — | — | — | — | — |
| 9FmPODA | — | — | — | — | — | — | — |
| 3FmPDA | 0.95 | — | — | — | — | — | — |
| 6FmSNDA | — | — | — | — | — | — | — |
| 6FmBPDA | — | — | — | — | — | — | — |
| 6FpBPDA | — | — | — | — | — | — | — |
| m6FDA | — | 0.95 | 0.95 | — | — | 0.95 | — |
| mPDA | — | — | — | — | — | — | — |
| mBPDA | — | — | — | — | — | — | 0.95 |
| pODA | — | — | — | — | — | — | — |
| p6FDA | — | — | — | — | — | — | — |
| TSL9306 | 0.05 | 0.05 | 0.05 | 0.05 | 0.05 | 0.05 | 0.05 |
| Properties | | | | | | | |
| Intrinsic viscosity [dL/g] | 0.43 | 0.39 | 0.37 | 0.48 | 0.44 | 0.46 | 0.48 |
| Decomposition-starting temperature [°C.] | 535 | 530 | 530 | 540 | 540 | 540 | 540 |
| Adhesiveness | 0/100 | 0/100 | 0/100 | 0/100 | 0/100 | 0/100 | 0/100 |
| Trench-filling Property | good | good | good | good | good | good | good |
| Dielectric constant | 2.85 | 2.81 | 2.78 | 2.78 | 2.62 | 2.54 | 2.74 |
| Moisture absorption coefficient [%] | 0.61 | 0.48 | 0.45 | 0.46 | 0.36 | 0.25 | 0.42 |
| Amount of decompositon gas | 1400 | 1000 | 800 | 900 | 1800 | 1600 | 1000 |

TABLE 6

| Raw materials | Example | | | | | | |
|---|---|---|---|---|---|---|---|
| (molar eq.) | 1-36 | 1-37 | 1-38 | 1-39 | 1-40 | 1-41 | 1-42 |
| 6FDPA | — | — | — | — | — | — | 0.95 |
| PMA | — | — | — | 0.95 | — | 0.95 | — |
| BPTA | — | — | — | — | — | — | — |
| ODPA | — | — | — | — | 0.95 | — | — |
| 6FXTA | 0.95 | 0.95 | 0.95 | — | — | — | — |
| MLA | 0.10 | 0.10 | 0.10 | 0.10 | 0.10 | 0.10 | 0.10 |
| mSNDA | — | — | — | — | — | — | — |
| mPODA | — | — | — | — | — | — | — |
| mODA | — | — | — | — | — | — | — |
| 6FmODA | — | — | — | — | — | — | — |
| 3FmPODA | — | — | — | — | — | 0.95 | 0.95 |
| 6FmPODA | — | — | — | 0.95 | 0.95 | — | — |
| 9FmPODA | — | — | — | — | — | — | — |
| 3FmPDA | 0.95 | — | — | — | — | — | — |
| 6FmSNDA | — | 0.95 | — | — | — | — | — |
| 6FmBPDA | — | — | 0.95 | — | — | — | — |
| 6FpBPDA | — | — | — | — | — | — | — |
| m6FDA | — | — | — | — | — | — | — |
| mPDA | — | — | — | — | — | — | — |
| mBPDA | — | — | — | — | — | — | — |
| pODA | — | — | — | — | — | — | — |
| p6FDA | — | — | — | — | — | — | — |
| TSL9306 | 0.05 | 0.05 | 0.05 | 0.05 | 0.05 | 0.05 | 0.05 |
| Properties | | | | | | | |
| Intrinsic viscosity [dL/g] | 0.46 | 0.42 | 0.46 | 0.38 | 0.37 | 0.38 | 0.36 |
| Decomposition-starting temperature [°C.] | 540 | 545 | 545 | 530 | 545 | 530 | 530 |
| Adhesiveness | 0/100 | 0/100 | 0/100 | 0/100 | 0/100 | 0/100 | 0/100 |
| Trench-filling Property | good | good | good | good | good | good | good |
| Dielectric constant | 2.74 | 2.66 | 2.64 | 2.95 | 2.75 | 3.00 | 2.66 |
| Moisture absorption coefficient [%] | 0.28 | 0.36 | 0.24 | 0.51 | 0.55 | 0.56 | 0.35 |
| Amount of decompositon gas | 2000 | 1000 | 1200 | 1300 | 1500 | 1000 | 1600 |

TABLE 7

| Raw materials | Example | | | Comparative Example | | | | |
|---|---|---|---|---|---|---|---|---|
| (molar eq.) | 1-43 | 1-44 | 1-45 | 1 | 2 | 3 | 4 | 5 |
| 6FDPA | — | — | 0.95 | — | 1.00 | — | 1.00 | — |
| PMA | 0.95 | — | — | — | — | 1.00 | — | 1.00 |
| BPTA | — | — | — | — | — | — | — | — |
| ODPA | — | 0.95 | — | — | — | — | — | — |
| 6FXTA | — | — | — | — | — | — | — | — |
| MLA | 0.10 | 0.10 | 0.10 | — | — | — | — | — |
| mSNDA | — | — | — | — | — | — | — | — |
| mPODA | — | — | — | — | — | — | — | — |
| mODA | — | — | — | — | — | — | — | — |
| 6FmODA | — | — | — | — | — | — | — | — |
| 3FmPODA | — | — | — | CRC- | — | — | — | — |
| 6FmPODA | — | — | — | 6061 | — | — | — | — |
| 9FmPODA | 0.95 | 0.95 | 0.95 | — | — | — | — | — |
| 3FmPDA | — | — | — | — | — | — | — | — |
| 6FmSNDA | — | — | — | — | — | — | — | — |
| 6FmBPDA | — | — | — | — | — | — | — | — |
| 6FpBPDA | — | — | — | — | — | — | — | — |
| m6FDA | — | — | — | — | — | — | — | — |
| mPDA | — | — | — | — | — | — | — | — |
| mBPDA | — | — | — | — | — | — | — | — |
| pODA | — | — | — | — | 1.00 | 1.00 | — | — |
| p6FDA | — | — | — | — | — | — | 1.00 | 1.00 |
| TSL9306 | 0.05 | 0.05 | 0.05 | — | — | — | — | — |
| Properties | | | | | | | | |
| Intrinsic viscosity [dL/g] | 0.38 | 0.37 | 0.38 | 0.95 | 0.98 | 1.12 | 0.75 | 0.82 |
| Decomposition-starting temperature [°C.] | 530 | 545 | 530 | 535 | 535 | 535 | 530 | 530 |
| Adhesiveness | 0/100 | 0/100 | 0/100 | 60/100 | 100/100 | 80/100 | 100/100 | 100/100 |
| Trench-filling Property | good | good | good | poor | poor | poor | poor | poor |
| Dielectric constant | 2.85 | 2.68 | 2.50 | 3.43 | 2.90 | 3.42 | 2.72 | 2.85 |
| Moisture absorption coefficient [%] | 0.42 | 0.45 | 0.20 | 1.78 | 0.55 | 1.82 | 0.30 | 0.60 |
| Amount of decomposiotn gas | 1800 | 2000 | 2200 | 12000 | 16000 | 13000 | 33000 | 24000 |

Examples 2-1 to 2-11

(1) Synthesis of fluorine-containing aromatic diamine compound

Example of synthesis: 2A

Synthesis of 2,2-bis[3-amino-5-(trifluoromethyl)phenyl]-1,1,1,3,3,3-hexafluoropropane (6Fm6FDA)

(a) Synthesis of 2,2-bis[3-(trifluoromethyl) phenyl]-1,1,1,3,3,3-hexafluoropropane (Compound: 2Aa)

A 500 mL autoclave was charged with 44.5 g (80.0 mmol) of 2,2-bis[3-iodophenyl]-1,1,1,3,3,3-hexafluoropropane, 40.09 (204 mmol) of trifluoromethyl iodide, 150 mL of dry N,N-dimethylformamide and copper powder (catalyst), and the mixture was heated at a temperature of 150° C. for 24 hours with stirring. After being cooled, the reaction mixture was filtered to remove the copper powder, and the filtrate was fractionally distillated under a reduced pressure to obtain the aimed compound 2Aa.

Molecular formula: $C_{17}H_8F_{12}$
Molecular weight: 440.227
Yield: 28.5 g (64.7 mmol) (81%)

Elemental analysis:

| | Carbon | Hydrogen | Florine |
|---|---|---|---|
| Calculated: | 46.4% | 1.8% | 51.8% |
| Found: | 46.6% | 1.8% | 51.6% |

(b) Synthesis of 2,2-bis[3-nitro-5-(trifluoromethyl) phenyl]-1,1,1,3,3,3-hexafluoropropane (Compound: 2Ab)

26.5 g (60.2 mmol) of the compound 2Aa obtained in the process (a) was dissolved into 60 mL of 95% concentrated sulfuric acid. To this solution was slowly added 20 mL of 90% fuming nitric acid using a dropping funnel, and the resultant mixture was heated with stirring at a temperature of 50° C. for 5 hours. Upon finishing the reaction, the reaction mixture was poured into an ice water, and the reaction product was extracted with 300 mL of methylene chloride. The extracted solution was then taken out by means of separatory funnel, and washed twice with 300 mL of 5% aqueous solution of sodium hydroxide and then once with 300 mL of water. After being dried over sodium sulfate anhydride, the extracted solution was vaccum-concentrated, and resultant residue was recrystalized from a hot ethanol solution thereby obtaining the aimed compound 2Ab.

Molecular formula: $C_{17}H_6F_{12}N_2O_4$
Molecular weight: 530.221
Yield: 28.0 g (52.8 mmol) (88%)

Elemental analysis:

|  | Carbon | Hydrogen | Florine | Nitrogen |
|---|---|---|---|---|
| Calculated: | 38.5% | 1.1% | 43.0% | 5.3% |
| Found: | 38.8% | 1.2% | 42.8% | 5.3% |

(c) Synthesis of 2,2-bis[3-amino-5-(trifluoromethyl) phenyl]-1,1,1,3,3,3-hexafluoropropane (6Fm6FDA)

26.5 g (50.0 mmol) of the compound 2Ab obtained in the process (b), 50 mL of isopropyl alcohol and 1.5 g of 5%-Pd/C reducing agent (water content: 50%) were introduced into a reducing apparatus in which these reactants were reacted in a hydrogen gas atmosphere for four hours at a temperature of 80° C. Upon finishing the reaction, insoluble matters were removed through a suction filtration, and the reaction solution was vaccum-concentrated, and resultant crude crystal thus precipitated was recrystalized from a hot ethanol solution thereby obtaining the aimed compound 6Fm6FDA.

Molecular formula: $C_{17}H_{10}F_{12}N_2$
Molecular weight: 470.257
Yield: 21.5 g (45.7 mmol) (91%)
Elemental analysis:

|  | Carbon | Hydrogen | Florine | Nitrogen |
|---|---|---|---|---|
| Calculated: | 43.4% | 2.1% | 48.5% | 6.0% |
| Found: | 43.6% | 2.2% | 48.3% | 5.9% |

Infrared absorption spectrum (KBr method):
- 3480 cm$^{-1}$ N—H antisymmetric stretching vibration (primary amine)
- 3390 cm$^{-1}$ N—H symmetric stretching vibration (primary amine)
- 1600 cm$^{-1}$ N—H in-plane deformation (scissoring) vibration (aromatic primary amine)
- 1320, 1250, 1220, 1190, 1140 cm$^{-1}$ C—F stretching vibration and deformation vibration (CF$_3$ group)

Example of synthesis: 2B

Synthesis of 3,3'-diamino-5,5'-bis(trifluoromethyl)biphenyl (6FmBPDA)

15.9 g (50.2 mmol) of 3-iodo-5-nitrobenzotrifluoride was dissolved into 50 mL of N,N'-dimethylformamide, and after being added with 20 g of copper powder, the solution was heated to reflux for 72 hours. After being left to cool, insoluble matters were removed through a suction filtration, and the reaction solution was vaccum-concentrated and vacuum-dried. The residue thus obtained was dissolved into 50 mL of isopropyl alcohol thereby forming a solution to which 1.5 g of 5%-Pd/C reducing agent (water content: 50%) was added. The resultant mixed solution was then allowed to react in a hydrogen gas atmosphere for four hours at a temperature of 80° C. Upon finishing the reaction, insoluble matters were removed through a suction filtration, and the reaction solution was vaccum-concentrated, and resultant crude crystal thus precipitated was recrystalized from a hot ethanol solution thereby obtaining the aimed compound (6FmBPDA).

Molecular formula: $C_{14}H_{10}F_6N_2$
Molecular weight: 320.236
Yield: 10.9 g (34.0 mmol) (68%)

Elemental analysis:

|  | Carbon | Hydrogen | Florine | Nitrogen |
|---|---|---|---|---|
| Calculated: | 52.5% | 3.1% | 35.6% | 8.7% |
| Found: | 52.6% | 3.0% | 35.6% | 8.8% |

Infrared absorption spectrum (KBr method):
- 3500 cm$^{-1}$ N—H antisymmetric stretching vibration (primary amine)
- 3400 cm$^{-1}$ N—H symmetric stretching vibration (primary amine)
- 1600 cm$^{-1}$ N—H in-plane deformation (scissoring) vibration (aromatic primary amine)
- 1320 cm$^{-1}$ CF$_3$ symmetric deformation vibration
- 1200 cm$^{-1}$ C—N stretching vibration (primary amine)
- 1140 cm$^{-1}$ CF$_3$ antisymmetric stretching vibration Example of synthesis: 2C Synthesis of 3,3'-diamino-5,5'-difluorobiphenyl (2FmBPDA)

The same processes as those of the above synthesis 2B were repeated using 13.4 g (50.2 mmol) of 3-fluoro-5-iodonitrobenzene thereby obtaining the aimed compound (2FmBPDA).

Molecular formula: $C_{12}H_{10}F_2N_2$
Molecular weight: 220.222
Yield: 7.1 g (32.2 mmol) (64%)
Elemental analysis:

|  | Carbon | Hydrogen | Florine | Nitrogen |
|---|---|---|---|---|
| Calculated: | 65.4% | 4.6% | 17.3% | 12.7% |
| Found: | 65.7% | 4.6% | 17.1% | 12.6% |

Infrared absorption spectrum (KBr method):
- 3520 cm$^{-1}$ N—H antisymmetric stretching vibration (primary amine)
- 3420 cm$^{-1}$ N—H symmetric stretching vibration (primary amine)
- 1605 cm$^{-1}$ N—H in-plane deformation (scissoring) vibration (aromatic primary amine)
- 1240 cm$^{-1}$ C—F stretching vibration (fluorobenzene)
- 1205 cm$^{-1}$ C—N stretching vibration (primary amine)

(2) Synthesis of polyimide precursor (polyamic acid)

Polyamic acid was prepared as follows using raw materials in a predetermined ratio (indicated in molar equivalent) as shown in Tables 8 and 9. First, 50 mL of N-methyl-2-pyrrolidone was taken under nitrogen gas atmosphere in a separable flask cooled with a refrigerant to a temperature of −5° to 0° C. Then, a predermined amount of tetracarboxylic dianhydride represented by the general formula (DAH2) was added as an acid anhydride component to the N-methyl-2-pyrrolidone and dissolved therein with stirring. To this solution was slowly dripped a solution of a diamine component viz. a predetermined amount of a fluorine-containing aromatic diamine compound represented by the general formula (DA2) and bis(aminoalkyl) peralkyl polysiloxane compound represented by the general formula (DA6) in N-methyl-2-pyrrolidone by using a dropping funnel attached with a pressure equilibrium tube. The resultant mixed solution was stirred six hours to obtain a varnish containing the aimed polyamic acid.

Followings are explanations of the abbreviations employed in Tables 8 and 9.

(Tetracarboxylic dianhydride)

PMA: pyromellitic dianhydride.

BPTA: 3,4,3',4'-biphenyltetracarboxylic dianhydride.

ODPA: oxy-4,4'-diphthalic dianhydride.

6FDPA: 1,1,1,3,3,3-hexafluoro-2,2-propylidene-4,4'-diphthalic dianhydride.

6FXTA: 9,9-bis(trifluoromethyl) xanthene-2,3,6,7-tetracarboxylic dianhydride.

SNDPA: Sulfonyl-4,4'-diphthalic dianhydride. (Diamine compound)

6Fm6FDA: 2,2-bis[3-amino-5-(trifluoromethyl)phenpl]-1,1,1,3,3,3-hexafluoropropane.

6FmBPDA: 3,3'-diamino-5,5'-bis(trifluoromethyl)biphenyl.

2FmBPDA: 3,3'-diamino-5,5'-difluorobiphenyl.

TSL9306: 1,3-bis( 3-aminopropyl )-1,1,3,3-tetramethyl disiloxane.

(3) Measurements of various properties

The intrinsic viscosity of a polyamic acid solution, and the decomposition-starting temperature, dielectric constant and coefficient of moisture absorption of polyimide films were measured in the same manner as in Example 1. The results are shown in Tables 8 and 9. It was confirmed as a result that the polyimide films obtained in Examples 2-1 to 2-11 were excellent in heat resistance which was comparable to that of Comparative Example 1, and at the same time very low in dielectric constant.

TABLE 8

| | Example | | | | | |
|---|---|---|---|---|---|---|
| | 2-1 | 2-2 | 2-3 | 2-4 | 2-5 | 2-6 |
| Raw materials (molar eq.) | | | | | | |
| PMA | 1.00 | — | — | — | — | 1.00 |
| BPTA | — | 1.00 | — | — | — | — |
| ODPA | — | — | 1.00 | — | — | — |
| 6DFPA | — | — | — | 1.00 | — | — |
| 6FXTA | — | — | — | — | 1.00 | — |
| SNDPA | — | — | — | — | — | — |
| 6Fm6FDA | 0.95 | 0.95 | 0.95 | 0.95 | 0.95 | — |
| 6FmBPDA | — | — | — | — | — | 0.95 |
| 2FmBPDA | — | — | — | — | — | — |
| TSL9306 | 0.05 | 0.05 | 0.05 | 0.05 | 0.05 | 0.05 |
| Properties | | | | | | |
| Intrinsic viscosity [dL/g] | 0.76 | 0.80 | 0.72 | 0.74 | 0.70 | 0.82 |
| Decomposition-starting temperature [°C.] | 525 | 530 | 540 | 525 | 530 | 540 |
| Dielectric constant | 2.65 | 2.62 | 2.68 | 2.50 | 2.52 | 2.92 |
| Moisture absorption coefficient [%] | 0.45 | 0.38 | 0.48 | 0.26 | 0.30 | 0.43 |

TABLE 9

| | Example | | | | |
|---|---|---|---|---|---|
| | 2-7 | 2-8 | 2-9 | 2-10 | 2-11 |
| Raw materials (molar eq.) | | | | | |
| PMA | — | — | — | — | — |
| BPTA | — | — | — | — | — |
| ODPA | 1.00 | — | — | 1.00 | — |
| 6FDPA | — | — | 1.00 | — | 1.00 |
| 6FXTA | — | — | — | — | — |
| SNDPA | — | 1.00 | — | — | — |
| 6Fm6FDA | — | — | — | — | — |
| 6FmBPDA | 0.95 | 0.95 | 0.95 | — | — |

TABLE 9-continued

| | Example | | | | |
|---|---|---|---|---|---|
| | 2-7 | 2-8 | 2-9 | 2-10 | 2-11 |
| 2FmBPDA | — | — | — | 0.95 | 0.95 |
| TSL9306 | 0.05 | 0.05 | 0.05 | 0.05 | 0.05 |
| Properties | | | | | |
| Intrinsic viscosity [dL/g] | 0.71 | 0.68 | 0.75 | 0.67 | 0.72 |
| Decomposition-starting temperature [°C.] | 555 | 540 | 540 | 550 | 535 |
| Dielectric constant | 2.73 | 2.76 | 2.62 | 2.98 | 2.76 |
| Moisture absorption coefficient [%] | 0.51 | 0.63 | 0.20 | 0.73 | 0.42 |

Examples 3-1 to 3-8

(1) Synthesis of polyimide precursor (polyamic acid)

Polyamic acid was prepared as follows using, as shown in Table 10, raw materials in a predetermined ratio (indicated in molar equivalent). First, 50 mL of N-methyl-2-pyrrolidone was placed under nitrogen gas atmosphere in a separable flask cooled with a refrigerant to a temperature of –5° to 0° C. Then, a predetermined amount of tetracarboxylic dianhydride represented by the general formula (DAH1) was added as an acid anhydride component to the N-methyl-2-pyrrolidone and dissolved therein with stirring. To this solution was slowly dripped a solution of a diamine component viz. a predetermined amount of a fluorine-containing aromatic diamine compound represented by the general formula (DA5) and bis(aminoalkyl) peralkyl polysiloxane compound represented by the general formula (DA6) in 50 mL of N-methyl-2-pyrrolidone by using a dropping funnel attached with a pressure equilibrium tube. The resultant mixed solution was stirred for six hours to obtain a varnish containing the aimed polyamic acid.

Followings are explanations of the abbreviations employed in Table 10.

(Tetracarboxylic dianhydride)

PMA: pyromellitic dianhydride.

BPTA: 3,4,3',4'-biphenyltetracarboxylic dianhydride.

ODPA: oxy-4,4'-diphthalic dianhydride.

SNDPA: sulfonyl-4,4'-diphthalic dianhydride.

CBDPA: carbonyl-4,4'-diphthalic dianhydride.

6FDPA: 1,1,1,3,3,3-hexafluoro-2,2-propylidene-4,4'-diphthalic dianhydride.

SXDPA: 1,3-bis(3,4-dicarboxyphenyl)-1,1,3,3-tetramethyl disiloxane dianhydride.

PODPA: 1,3-bis(3,4-dicarboxyphenyl)benzene dianhydride.

(Diamine compound)

6FmSNDA: 1,1'-bis[3-amino-5-(trifluoromethyl)phenyl]sulfone.

(3) Measurements of various properties

The intrinsic viscosity of a polyamic acid solution, and the decomposition-starting temperature, dielectric constant and coefficient of moisture absorption of polyimide films were measured in the same manner as in Example 1. The results are shown in Table 10. It was confirmed as a result that the polyimide films obtained in Examples 3-1 to 3-8 were excellent in heat resistance and at the same time very low in dielectric constant.

TABLE 10

| | Example | | | | | | | |
|---|---|---|---|---|---|---|---|---|
| | 3-1 | 3-2 | 3-3 | 3-4 | 3-5 | 3-6 | 3-7 | 3-8 |
| Raw materials (molar eq.) | | | | | | | | |
| PMA | 1.00 | — | — | — | — | — | — | — |
| BPTA | — | 1.00 | — | — | — | — | — | — |
| ODPA | — | — | 1.00 | — | — | — | — | — |
| SNDPA | — | — | — | 1.00 | — | — | — | — |
| CBDPA | — | — | — | — | 1.00 | — | — | — |
| 6FDPA | — | — | — | — | — | 1.00 | — | — |
| SXDPA | — | — | — | — | — | — | 1.00 | — |
| PODPA | — | — | — | — | — | — | — | 1.00 |
| 6FmSNDA | 0.95 | 0.95 | 0.95 | 0.95 | 0.95 | 0.95 | 0.95 | 0.95 |
| TSL9306 | 0.05 | 0.05 | 0.05 | 0.05 | 0.05 | 0.05 | 0.05 | 0.05 |
| Properties | | | | | | | | |
| Intrinsic viscosity [dL/g] | 0.78 | 0.72 | 0.66 | 0.62 | 0.78 | 0.70 | 0.62 | 0.58 |
| Decomposition-starting temperature [°C.] | 540 | 555 | 555 | 540 | 555 | 540 | 460 | 545 |
| Dielectric constant | 2.94 | 2.92 | 2.84 | 2.90 | 2.92 | 2.64 | 2.66 | 2.78 |
| Moisture absorption coefficient [%] | 0.55 | 0.57 | 0.63 | 0.75 | 0.70 | 0.32 | 0.35 | 0.68 |

Examples 4-1 to 4-15

(1) Synthesis of polyimide precursor (polyamic acid)

Polyamic acid was prepared as follows using, as shown in Tables 11 and 12, raw materials in a predetermined ratio (indicated in molar equivalent). First, 50 mL of N-methyl-2-pyrrolidone was placed under nitrogen gas atmosphere in a separable flask cooled with a refrigerant to a temperature of −5° to 0° C. Then, a predermined amount of tetracarboxylic dianhydride represented by the general formula (DAH1) was added as an acid anhydride component to the N-methyl-2-pyrrolidone and dissolved therein with stirring. To this solution was slowly dripped a solution of a diamine component viz. a predetermined amount of an aromatic diamine compound represented by the general formula (DA1) and bis(aminoalkyl) peralkyl polysiloxane compound represented by the general formula (DA6) in 50 mL of N-methyl-2-pyrrolidone by using a dropping funnel attached with a pressure equilibrium tube. The resultant mixed solution was stirred for six hours to obtain a varnish containing the aimed polyamic acid.

Followings are explanations of the abbreviations employed in Tables 11 and 12.
(Tetracarboxylic dianhydride)

6FDPA: 1,1,1,3,3,3-hexafluoro-2,2-propylidene-4,4'-diphthalic dianhydride.

PMA: pyromellitic dianhydride.

ODPA: oxy-4,4'-diphthalic dianhydride.

SNDPA: sulfonyl-4,4'-diphthalic dianhydride. (Maleic anhydride)

MLA: maleic acid anhydride. (Diamine compound)

mSNDA: Sulfonyl-3,3'-dianiline.

mPODA: 1,3-bis(3-aminophenoxy)benzene.

mODA: Oxy-3,3'-dianiline.

6FmODA: Oxy-5,5'-bis[3-(trifluoromethyl)aniline].

3FmPODA: 3,5-bis(3-aminophenoxy)benzotrifluoride.

6FmPODA: 1,3-bis[3-amino-5-(trifluoromethyl)phenoxy]benzene.

9FmPODA: 3,5-bis[3-amino-5-(trifluoromethyl)phenoxy]benzotrifluoride.

3FmPDA: 5-(trifluoromethyl)-1,3-phenylene diamine.

6FmSNDA: 1,1'-bis[3-amino-5-(trifluoromethyl)phenyl] sulfone.

2FmBPDA: 3,3'-diamino-5,5'-difluorobiphenyl.

6FmBPDA: 3,3'-diamino-5,5'-bis(trifluoromethyl)biphenyl.

6FpBPDA: 4,4'-diamino-2,2'-bis(trifluoromethyl)biphenyl.

pODA: Oxy-4,4'-dianiline.

TSL9306: 1,3-bis(3-aminopropyl)-1,1,3,3-tetramethyl disiloxane.

A 0.5 w/v % N-methyl-2-pyrrolidone solution of each polyamic acid thus synthesized was measured of its intrinsic viscosity at a temperature of 30° C. The results thus measured were shown in Tables 11 and 12. As seen from Tables 11 and 12, it was confirmed that a polyamic acid of low intrinsic viscosity as low as 0.7 or less could be synthesized by using maleic anhydride.

TABLE 11

| | Polyamic acid | | | | | | |
|---|---|---|---|---|---|---|---|
| | 4-1 | 4-2 | 4-3 | 4-4 | 4-5 | 4-6 | 4-7 |
| Raw materials (molar eq.) | | | | | | | |
| 6FDPA | 0.96 | 0.96 | 0.98 | 0.98 | 0.95 | 0.95 | 0.98 |
| PMA | — | — | — | — | — | — | — |
| ODPA | — | — | — | — | — | — | — |
| SNDPA | — | — | — | — | — | — | — |
| MLA | 0.08 | 0.08 | 0.04 | 0.04 | 0.10 | 0.10 | 0.04 |
| mSNDA | 0.95 | — | 0.50 | — | — | — | 0.70 |
| mPODA | — | 0.95 | 0.45 | — | — | — | — |
| mODA | — | — | — | 0.95 | — | — | — |
| 6FmODA | — | — | — | — | 0.95 | — | — |
| 3FmPODA | — | — | — | — | — | — | — |
| 6FmPODA | — | — | — | — | — | 0.95 | — |
| 9FmPODA | — | — | — | — | — | — | — |
| 3FmPDA | — | — | — | — | — | — | 0.25 |
| 6FmSNDA | — | — | — | — | — | — | — |
| 2FmBPDA | — | — | — | — | — | — | — |
| 6FmBPDA | — | — | — | — | — | — | — |
| 6FpBPDA | — | — | — | — | — | — | — |
| TSL9306 | 0.05 | 0.05 | 0.05 | 0.05 | 0.05 | 0.05 | 0.05 |
| Intrinsic viscosity [dL/g] | 0.42 | 0.46 | 0.53 | 0.52 | 0.38 | 0.36 | 0.50 |

TABLE 12

| | Polyamic acid | | | | | | | | | |
|---|---|---|---|---|---|---|---|---|---|---|
| | 4-8 | 4-9 | 4-10 | 4-11 | 4-12 | 4-13 | 4-14 | 4-15 | 4-16 | 4-17 |
| Raw materials (molar eq.) | | | | | | | | | | |
| 6FDPA | 1.00 | 1.00 | — | — | — | — | — | 0.95 | — | — |
| PMA | — | — | — | 0.98 | 0.98 | — | — | — | 1.00 | 1.00 |
| ODPA | — | — | — | — | — | 1.00 | — | — | — | — |
| SNDPA | — | — | — | — | — | — | 1.00 | — | — | — |
| MLA | — | — | — | 0.04 | 0.04 | — | — | 0.10 | — | — |
| mSNDA | 0.40 | 0.40 | — | — | — | — | — | 0.40 | — | — |
| mPODA | — | — | — | — | — | — | — | — | — | — |
| mODA | — | — | — | — | — | — | — | — | — | — |
| 6FmODA | — | — | — | — | — | — | — | — | — | — |
| 3FmPODA | — | — | — | 0.95 | — | — | — | — | — | — |
| 6FmPODA | — | — | — | — | — | — | — | — | — | — |
| 9FmPODA | — | — | — | — | 0.95 | — | — | — | — | — |
| 3FmPDA | — | — | — | — | — | — | — | — | — | — |
| 6FmSNDA | 0.55 | — | 0.95 | — | — | — | — | — | — | — |
| 2FmBPDA | — | — | — | — | — | 0.95 | — | — | — | — |
| 6FmBPDA | — | — | — | — | — | — | 0.95 | — | — | — |
| 6FpBPDA | — | 0.55 | — | — | — | — | — | 0.55 | — | 0.50 |
| pODA | — | — | — | — | — | — | — | — | 1.00 | 0.50 |
| TSL9306 | 0.05 | 0.05 | 0.05 | 0.05 | 0.05 | 0.05 | 0.05 | 0.05 | — | — |
| Intrinsic viscosity [dL/g] | 0.67 | 0.59 | 0.62 | 0.63 | 0.64 | 0.67 | 0.68 | 0.40 | 1.21 | 1.48 |

(2) Preparation of photosensitive polyimide precursor

Example 4-1

1.57 g (0.01 mol) of 2-N,N-dimethylaminoethyl methacrylate and 0.37 g (0.001 mol) of 2,6-di(4-azidobenzal)-4-hydroxycyclohexanone, as a photosensitive agent, were dissolved into 20 g of 16 wt. % N-methyl-2-pyrrolidone solution of polyamic acid (4-1), and the mixture was homogenized to prepare a homogeneous solution which was then filtered using a filter having a pore size of 0.5 μm, thereby preparing a photosensitive polyimide precursor.

Examples 4-2 to 4-15 and Comparative Example 6 and 7

Each of photosensitive polyimde precursors was prepared by the same processes as described in Example 4-1 using 16 wt % N-methyl-2-pyrrolidone solution of polyamic acid and photosensitive agent, and sensitizer if required in a predetermined ratio (indicated in weight) as shown in Tables 13 and 14.

Followings are explanations of the abbreviations employed in Tables 13 and 14.
(Photosensitive agent)
  DMAEA: 2-N,N-dimethylaminoethyl acrylate.
  DMAEM: 2-N,N-dimethylaminoethyl methacrylate.
  DMABM: 4-N,N-dimethylaminobutyl methacrylate.
  DABMCH: 2,6-di(4-azidobenzal)-4-methylcyclohexanone.
  DABHCH: 2,6-di(4-azidobenzal)-4-hydrocyclohexanone.
(Sensitizer)

BDMK: benzyl dimethylketal

TABLE 13

| | Example | | | | | | |
|---|---|---|---|---|---|---|---|
| | 4-1 | 4-2 | 4-3 | 4-4 | 4-5 | 4-6 | 4-7 |
| Polyamic acid | | | | | | | |
| 4-1 | 20 | — | — | — | — | — | — |
| 4-2 | — | 20 | — | — | — | — | — |
| 4-3 | — | — | 20 | — | — | — | — |
| 4-4 | — | — | — | 20 | — | — | — |
| 4-5 | — | — | — | — | 20 | — | — |
| 4-6 | — | — | — | — | — | 20 | — |
| 4-7 | — | — | — | — | — | — | 20 |
| Photosensitive agent | | | | | | | |
| DMAEA | — | 0.50 | — | — | — | 0.20 | — |
| DMAEM | 1.57 | 1.00 | 1.45 | 1.60 | — | 1.00 | — |
| DMABM | — | — | — | — | 1.30 | — | 1.60 |
| DABMCH | 0.37 | — | 0.28 | — | — | — | — |
| DABHCH | — | 0.34 | — | — | — | 0.20 | — |
| azide A | — | — | — | — | 0.42 | — | — |
| azide B | — | — | — | — | — | — | 0.37 |
| Sensitizer | | | | | | | |
| Michler's ketone | — | — | — | 0.30 | — | — | — |
| BDMK | — | — | — | — | — | — | — |

TABLE 14

|  | Example | | | | | | | | Comparative Example | |
|---|---|---|---|---|---|---|---|---|---|---|
|  | 4-8 | 4-9 | 4-10 | 4-11 | 4-12 | 4-13 | 4-14 | 4-15 | 6 | 7 |
| Polyamic acid | | | | | | | | | | |
| 4-8 | 20 | — | — | — | — | — | — | — | — | — |
| 4-9 | — | 20 | — | — | — | — | — | — | — | — |
| 4-10 | — | — | 20 | — | — | — | — | — | — | — |
| 4-11 | — | — | — | 20 | — | — | — | — | — | — |
| 4-12 | — | — | — | — | 20 | — | — | — | — | — |
| 4-13 | — | — | — | — | — | 20 | — | — | — | — |
| 4-14 | — | — | — | — | — | — | 20 | — | — | — |
| 4-15 | — | — | — | — | — | — | — | 20 | — | — |
| 4-16 | — | — | — | — | — | — | — | — | 20 | — |
| 4-17 | — | — | — | — | — | — | — | — | — | 20 |
| Photosensitive agent | | | | | | | | | | |
| DMAEA | — | 0.30 | — | — | — | 0.60 | — | — | — | — |
| DMAEM | 1.30 | — | 1.40 | 1.80 | — | 1.00 | 1.50 | 1.60 | 1.70 | 1.70 |
| DMABM | — | 1.10 | — | — | 1.50 | — | — | — | — | — |
| DABMCH | — | — | 0.30 | — | — | — | 0.40 | — | — | — |
| DABHCH | — | — | — | — | — | — | — | 0.40 | — | — |
| azide A | — | — | — | 0.40 | — | — | — | — | — | — |
| azide B | — | — | — | — | 0.30 | — | — | — | — | — |
| Sensitizer | | | | | | | | | | |
| Michler's ketone | — | — | — | — | — | 0.20 | — | — | 0.30 | 0.30 |
| BDMK | — | 0.30 | — | — | — | 0.20 | — | — | — | — |

(3) Evaluation of photosensitive property

Each of photosensitive polyimide precursors thus obtained was evaluated of its photosensitive property in the following method.

First, the photosensitive polyimide precursor was spin-coated on the surface of a silicon substrate and then heated for 6 minutes at a temperature of 90° C. to dry it thereby forming a coated layer having a thickness of 4 to 6 Nm. Subsequently, the coated layer was irradiated with ultraviolet ray for 60 seconds through a mask by using a light exposure apparatus (PLA-500F, a product of Canon Co., Ltd.). Then, the irradiated layer was developed using a developer consisting of 4 parts by volume of N-methyl-2-pyrrolidone and 1 part by volume of isopropyl alcohol and rinsed with ethnol, thereby obtaining a relief pattern. Then, the cross-section of the relief pattern thus formed was observed with a scanning electron microscope. The initial film thickness of the relief pattern, irradiation dose, developing time, ratio of residual film and resolution are shown in Table 15.

As shown in Table 15, it was possible to form a relief pattern having a minimum width of 4 μm. Even if each of the silicon substrates bearing the relief pattern was subjected to heating at a temperature of 400° C. for 90 minutes, any deformation of the relief pattern was not observed.

TABLE 15

|  |  | Initial film thickness (μm) | Irradiation dose (mg/cm$^2$) | Development time (sec) | Rate of residual film (%) | Resolution (μm) |
|---|---|---|---|---|---|---|
| Example | 4-1 | 4.2 | 250 | 50 | 92 | 4.0 |
|  | 4-2 | 4.5 | 250 | 50 | 90 | 4.5 |
|  | 4-3 | 4.5 | 250 | 50 | 90 | 4.5 |
|  | 4-4 | 4.1 | 200 | 50 | 88 | 4.9 |
|  | 4-5 | 4.2 | 200 | 50 | 89 | 5.1 |
|  | 4-6 | 4.1 | 200 | 50 | 89 | 5.2 |
|  | 4-7 | 4.1 | 200 | 50 | 86 | 5.1 |
|  | 4-8 | 4.8 | 250 | 50 | 90 | 4.3 |
|  | 4-9 | 5.1 | 250 | 50 | 91 | 4.3 |
|  | 4-10 | 5.9 | 250 | 50 | 90 | 4.7 |
|  | 4-11 | 4.7 | 250 | 50 | 90 | 4.7 |
|  | 4-12 | 5.8 | 280 | 50 | 93 | 4.5 |
|  | 4-13 | 5.7 | 280 | 50 | 94 | 4.5 |
|  | 4-14 | 5.7 | 280 | 50 | 93 | 4.2 |
|  | 4-15 | 5.7 | 280 | 50 | 95 | 4.1 |
| Comparative Example | 6 | 4.9 | 250 | 50 | 90 | 4.5 |
|  | 7 | 5.2 | 250 | 50 | 89 | 5.1 |

(4) Trench-filling properties

Aluminum was deposited on the surface of a silicon substrate having a diameter of 6 inches thereby to form an aluminum film. Then, a patterning was performed on the surface of this aluminum film in such a manner that a trench of 1.2 μm in depth was formed in a repeated pattern of 0.3 μm line and space. Each of photosensitive polyimide precursor was spin-coated on the surface face of the aluminum film, and heated for one hour at a temperature of 90° C., for 30 minutes at a temperature of 150° C., for 30 minutes at a temperature of 250° C. and finally for one hour at a temperature of 400° C., thereby obtaining a polyimide film. Subsequently, the section of the trench was observed with a scanning electron microscope (SEM) to investigate the filling property of the polyimide resin to the trench. As a result, the trench was found as being completely and compactly filled with the polyimide in any of Examples 4-1 to 4-15. By contrast, in the case of Comparative Examples 6 and 7, the trench was not completely filled with polyimide leaving a large void in the trench. As seen from these results, the flowability and flow-out of the solution of photosensitive polyimide precursor are much influenced by the specific molecular structure thereof.

Example 5

A 100 mL 4-necked flask equipped with a nitrogen-introducing tube was charged with 8.88 g (0.02 mol) of 1,1,1,3,3,3-hexafluoro-2,2-propylidene-4,4'-diphthalic dianhydride (6FDPA) and 5.2 g (0.04 mol) of 2-hydroxyethyl methacrylate, and the mixed solution was kept at room temperature with stirring for 6 days to obtain a diester of 6FDPA. To this solution was added gradually with thionyl chloride while keeping the solution at a temperature of −15° C. Subsequently, the temperature of the reaction solution was gradually raised up to 5° C. and with stirring allowed to react for four hours while maintaining this temperature. To this reaction solution was gradually added a solution of 7.04 g (0.02 mol) of 1,3-bis[3-amino-5-(trifluoromethyl)phenoxy]benzene and 4.4 g (0.044 mol) of trimethyl amine in 25 g of N-methyl-2-pyrrolidone. The resultant solution was kept with sterring at a temperature of 5° C. in a nitrogen atmosphere for 8 hours, and then vacuum-filtered thereby removing precipitated matters. The filtrate was then poured in water thereby allowing a polyamic acid derivative to be precipitated.

3.0 g of this polyamic acid derivative was dissolved into 12 g of N-methyl-2-pyrrolidone to obtain a solution, to which 0.05 g of 4,4'-bis(diethylamino)benzophenone and 0.01 g of 2-methyl-1-[4-(methylthio)phenyl]-2-morpholinopropanone-1, as a photopolymerization initiator, were added. The resultant solution was then filtered using a filter having an pore size of 0.5 μm, thereby preparing a photosensitive polyimide precursor.

This photosensitive polyimide precursor was then spin-coated on the surface of a silicon substrate and heated for 5 minutes at a temperature of 90° C. to dry it thereby forming a coated layer. Subsequently, the coated layer was irradiated with ultraviolet ray for 60 seconds through a mask by using a light exposure apparatus (PLA-500F, a product of Canon Co., Ltd.). Then, the irradiated layer was developed using a developer consisting of 7 parts by volume of N-methyl-2-pyrrolidone and 3 part by volume of methyl alcohol and rinsed with water. This developed pattern was heat-treated for 30 minutes at a temperature of 150° C., for 30 minutes at a temperature of 250° C. and finally for 60 minutes at a temperature of 350° C., thereby obtaining a 5 μm thick relief pattern in the form of 6 μm line-and-space pattern.

Even if each of the silicon substrates bearing the relief pattern was subjected to heating at a temperature of 400° C. for 90 minutes, any deformation of the relief pattern was not observed.

Further, the filling property of photosensitive polyimide precursor to a trench was investigated in the same manner as in Example 4 (4) by using a silicon substrate bearing 12 μm deep aluminum pattern in the form of 0.3 μm line-and-space pattern. It was found as a result that the trench could be completely filled with polyimide and at the same time the surface of the trench was excellent in flatness. (Examples 6-1 to 6-3 and Comparative Example 6-1) (Liquid crystal display element)
(1) Preparation of liquid crystal cell Example 6-1

An N-methyl-2-pyrrolidone solution of polyamic acid prepared in Example 1-3 was diluted with butylcellosolve acetate into an 8 wt. % solution. This solution was then passed through a filter having a pore size of 0.2 μm thereby removing insoluble matters such as refuse. The filtered solution was then coated on the surface of a glass substrate provided with ITO electrodes by means of a screen printing method. The glass substrate was heated for 5 minutes at a temperature of 100° C. to dry the coated layer, and then further heat-treated for 30 minutes at a temperature of 150° C. and for 30 minutes at a temperature of 250° C. thereby forming a polyimide film having a thickness of 60 nm. The polyimide film thus formed was subjected to rubbing with the use of a rubbing machine provided with a roll wound around with a nylon cloth, under the conditions of 450 rpm in rotational speed and 1 cm/sec in stage moving speed thereby obtaining a liquid crystal alingment film. Thus, a pair of glass substrates, each bearing a liquid crystal alingment film rubbed in this manner, were prepared. This pair of glass substrates were bonded face to face to each other at their peripheral portions using an epoxy-based adhesive containing beads as a spacer and heat-curing the adhesive at a temperature of 180° C., thereby obtaining a liquid crystal cell having a cell gap of 10 μm. Finally, a nematic liquid crystal (ZLI-1565, a product of Merk Co., Ltd.) was injected through a liquid crystal injection port into the cell, and then the injection port was sealed with a photowrable epoxy resin, thereby preparing a test sample of liquid crystal cell.

Example 6-2 and 6-3

The process of Example 6-1 was repeated except that the polyamic acid prepared in Example 1-39 or Example 3-9 was used in place of the polyamic acid prepared in Example 1-3, thereby preparing test samples of liquid crystal cell.

Comparative Example 6-1

A four-necked flask equipped with a stirring rod, a thermometer and a nitrogen-introducing tube was charged with 10.921 g (0.05 mol) of pyromellitic dianhydride and 60 g of N-methyl-2-pyrrolidone, and the solution was aggitated while passing therethrough a dehydrated nitrogen gas, thereby obtaining a suspension. A solution of 24.892 g (0.048 mol) of 1,1,1,3,3,3-hexafuoro-2,2-bis[4-(4-aminophenoxy)phenyl]propane and 0.495 g (0.002 mol) of 1,3-bis(3-aminopropyl)-1,1,3,3-tetramethyldisloxane dissolved in 120 g of N-methyl-2-pyrrolidone was gradually added to the suspension maintained at a temperature of 5° C. Subsequently, stirring was continued for six hours at a temperature ranging 5° C. to room temperature, thereby synthesizing ployamic acid. To 50 g portion of this solution was added 35 g of N-methyl-2-pyrrolidone and 25 g of butylcellosolve acetate thereby obtaining 8 wt. % polyamic acid solution. With this solution, a test sample of liquid crystal cell was prepared in the same manner as in Example 6-1.

(2) Evaluation of alignment characteristics

The alignment characteristics of these liquid crystal cells were evaluated by measuring the pretilt angle and voltage retention.

The pretilt angle was measured according to a method described in Journal of Applied Physics, Vol. 9, No. 10, p2013-4 (1980).

Figure 8A:
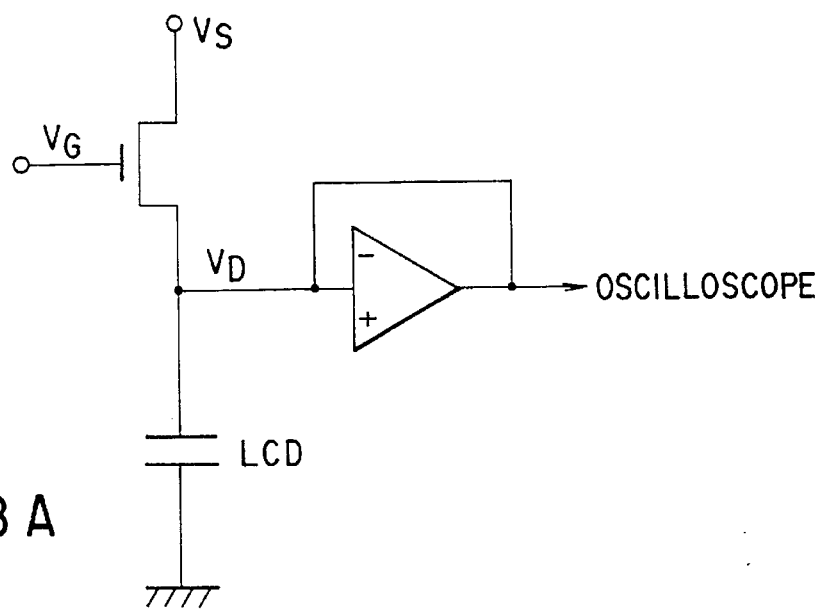
FIG. 8A is a diagram illustrating a circuit for measuring voltage retention rate of a liquid crystal display.
Figure 8B:
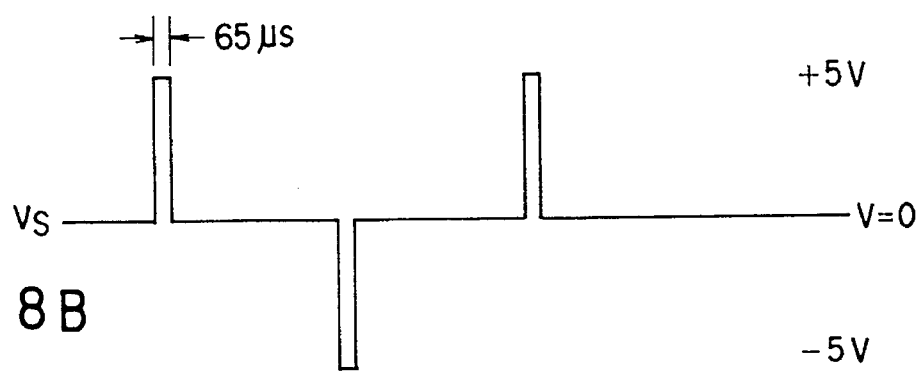
FIGS. 8B and 8C are charts representing waveforms of $V_S$ and $V_D$.
Figure 8C:
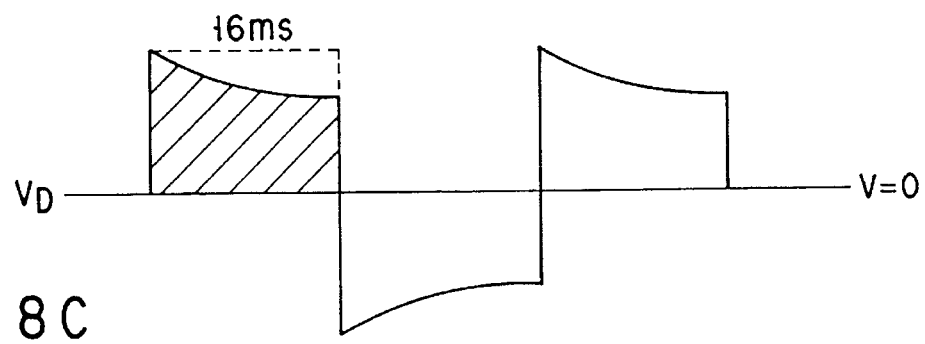

Voltage retention rate herein refers to a ratio of write voltage applied to an electrode of a liquid crystal cell that can be kept until the next write voltage is applied to the electrode (at a frame cycle of 16 msec). This voltage retention rate was measured by using a measuring circuit shown in FIG. 8A in the following manner. Namely, a rectangular pulse wave $V_s$ with pulse width 65 µs, frequency of 60 Hz and wave height of ±5 V was applied to the source of TFT as shown in FIG. 8B, and a drain voltage $V_D$ was monitored. As shown in FIG. 8C, the $V_D$ was attenuated before the next pulse voltage was applied to the electrode. The ratio of the shaded area between the monitored $V_D$ value and the line of V=0 (an integral voltage value actually applied to the electrode) to the area between the broken line and the line of V=0 (an integral voltage value provided that the $V_D$ is not attenuated) is defined as the voltage retention rate. By the way, the voltage retention rate was measured at a temperature of 90° C.

The results of the measurements were shown in Table 16. As seen from Table 16, the liquid crystal cells using liquid crystal alignment films made of polyimides of Examples 6-1 to 6-3 were found as having a desirable pretilt angle and a high voltage retention rate. This means that it is possible to realize a liquid crystal display excellent in contrast and visibility, which is most suited for the enlargement and colorization of liquid crystal display.

TABLE 16

|  |  | Pretilt angle (°) | Voltage retention rate (%) |
|---|---|---|---|
| Example | 6-1 | 4.6 | 85 |
|  | 6-2 | 6.9 | 90 |
|  | 6-3 | 5.0 | 92 |
| Comparative | 6-1 | 2.6 | 33 |

Examples 7-1 to 7-16 and Comparative Examples 7-1 to 7-4

(1) Synthesis of bismaleimide compound

Example of synthesis: 7A

Synthesis of 3,3'-dimaleimido-5,5'-bis(trifluoromethyl)biphenyl (6FmBPDM)

10.8 g (110 mmol) of maleic anhydride was dissolved with stirring into 50 mL of N,N'-dimethylformamide in a flask. To the resulting solution was slowly dripped a solution of 16.0 g (50.0 mmol) of 3,3'-diamino-5,5'-bis(trifluoromethyl)biphenyl (6FmBPDA) in 50 mL of dimethyl formamide from a dropping funnel. After stirring the resultant solution for 3 hours, 2.4 g of trimethylamine, 100 mg of magnesium (II) oxide and 10 mg of cobalt (II) acetate tetrahydrate were added to the solution. Subsequently, 13 g of acetic anhydride was dripped at room temperature from a dropping funnel over a period of 30 minutes, and the resultant solution was stirred for three hours. To this reaction solution was added little by little one litter of water, thus precipitating crude crystals which was then taken out through filtration. The crude crystals thus obtained was dissolved into a little amount of dimethyl formamide, and the solution was poured into one litter of water thereby precipitating crystallized product. The same procedure was repeated once more thereby obtaining refined crystals which were then taken out through filtration. The refined crystals were vacuum-dried to obtain the aimed compound (6FmBPDM).

Molecular formula: $C_{22}H_{10}F_6N_2O_4$
Molecular weight: 480.320
Yield: 23.3 g (48.5 mmol) (97%)
Elemental analysis:

|  | Carbon | Hydrogen | Florine | Nitrogen |
|---|---|---|---|---|
| Calculated: | 55.0% | 2.1% | 23.7% | 5.8% |
| Found: | 55.0% | 2.1% | 23.8% | 5.8% |

Infrared absorption spectrum:
  1780, 1720 cm$^{-1}$ C=O stretching vibration (cyclic imide)
  1320, 1140 cm$^{-1}$ C—F symmetric deformation vibration ($CF_3$ group).

Example of synthesis: 7B

Synthesis of bis[3-maleimido-5-(trifluoromethyl)phenyl] ether (6FmODM)

The process of synthesizing example 7A was repeated except that 16.8 g (50.0 mmol) of oxy-5,5'-bis[3-(trifluoromethyl)aniline](6FmODA) was used in place of the 6FmBPDA, thereby obtaining the aimed compound (6FmODM).

Molecular formula: $C_{22}H_{10}F_6N_2O_5$
Molecular weight: 496.319
Yield: 23.6 g (47.6 mmol) (95%)
Elemental analysis:

|  | Carbon | Hydrogen | Florine | Nitrogen |
|---|---|---|---|---|
| Calculated: | 53.2% | 2.0% | 23.0% | 5.6% |
| Found: | 53.3% | 2.0% | 22.9% | 5.7% |

Infrared absorption spectrum:
  1780, 1720 cm$^{-1}$ C=O stretching vibration (cyclic imide)
  1320 cm$^{-1}$ C—F symmetric deformation vibration ($CF_3$ group).
  1245 cm$^{-1}$ C—O—C antisymmetric stretching vibration (aromatic ether).
  1140 cm$^{-1}$ C—F symmetric deformation vibration ($CF_3$ group).

Example of synthesis: 7C

Synthesis of bis[3-maleimido-5-(trifluoromethyl)phenyl] sulfone (6FmSNDM)

The process of synthesizing example 7A was repeated except that 19.29 g (50.0 mmol) of 1,1'-bis[3-(trifluoromethyl)phenyl]sulfone (6FmSNDA) was used in place of the 6FmBPDA, thereby obtaining the aimed compound (6FmSNDM).

Molecular formula: $C_{22}H_{10}F_6N_2O_6S$
Molecular weight: 544.378

Yield: 25.6 g (47.0 mmol) (94%)
Elemental analysis:

|  | Carbon | Hydrogen | Florine | Nitrogen | Sulfur |
|---|---|---|---|---|---|
| Calculated: | 48.5% | 1.9% | 20.9% | 5.2% | 5.9% |
| Found: | 48.6% | 1.8% | 21.0% | 5.1% | 5.9% |

Infrared absorption spectrum:

1780, 1720 cm$^{-1}$ C=O stretching vibration (cyclic imide)

1320 cm$^{-1}$ C—F symmetric deformation vibration (CF$_3$ group).

1310 cm$^{-1}$ S=O antisymmetric stretching vibration (sulfone).

1160 cm$^{-1}$ S=O symmetric deformation vibration (sulfone).

1140 cm$^{-1}$ C—F symmetric deformation vibration (CF$_3$ group).

Example of synthesis: 7D

Synthesis of 2,2-bis[3-maleimido-5-(trifluoromethyl)phenyl]-1,1,1,3,3,3-hexafluoropropane (6Fm6FDM)

The process of synthesizing example 7A was repeated except that 23.5 g (50.0 mmol) of 2,2'-bis[3-amino-5-(trifluoromethyl)phenyl]-1,1,1,3,3,3-hexafluoropropane (6Fm6FDA) was used in place of the 6FmBPDA, thereby obtaining the aimed compound (6Fm6FDM).

Molecular formula: C$_{25}$H$_{10}$F$_{12}$N$_2$O$_4$
Molecular weight: 630.341
Yield: 29.0 g (46.0 mmol) (92%)
Elemental analysis:

|  | Carbon | Hydrogen | Florine | Nitrogen |
|---|---|---|---|---|
| Calculated: | 47.6% | 1.6% | 36.2% | 4.4% |
| Found: | 47.7% | 1.6% | 36.1% | 4.5% |

Infrared absorption spectrum:

1780, 1720 cm$^{-1}$ C=O stretching vibration (cyclic imide)

1320, 1250, 1220, 1190, 1140 cm$^{-1}$ C—F stretching vibration and deformation vibration (CF$_3$ group).

(2) Preparation of bismaleimide-based resin varnish

Mixtures of a bismaleimide compound and either an aromatic diamine compound or a bivalent phenol compound in the prescribed mixing ratios as shown in Tables 17 to 19 (indicated as molar equivalent) were respectively dissolved into N,N-dimethylacetoamide whereby to prepare a 50 wt. % solution of resin composition respectively. Each of the solutions was heated for about one hour at a temperature of 80° C. thereby allowing a reaction in some degree between the bismaleimide compound and either the aromatic diamine compound or the bivalent phenol compound to make into A-stage. Subsequently, N,N-dimethyl acetoamide was further added to this solution of reaction mixture until the viscosity of the solution became about one poise thereby preparing a bismaleimide-based resin varnish.

Followings are explanations of the abbreviations employed in Table 17 to 19.

(Bismaleimide compound)

6FmBPDM: 3,3'-dimaleimido-5,5'-bis(3-trifluoromethyl)biphenyl.

6FmODM: Bis[3-maleimido-5-(trifluoromethyl)phenyl]-ether.

6FmSNDM: Bis[3-maleimido-5-(trifluoromethyl)phenyl]-sulfone.

6Fm6FDM: 2,2-bis[3-maleimido-5-(trifluoromethyl)phenyl]-1,1,1,3,3,3-hexafluoropropane.

pMDM: Bis(4-maleimidophenyl)methane p6FDM: 2,2-bis(4-maleimidophenyl)-1,1,1,3,3,3-hexafluoropropane.

(Aromatic diamine compound)

pODA: Oxy-4,4'-dianiline.

m6FDA: 1,1,1,3,3,3-hexafluoro-2,2-propyliden-3,3'-dianiline.

6FpBPDA: 4,4'-diamino-2,2'-bis(trifluoromethyl)biphenyl.

pMDA: methylene-4,4'-dianyline.

p6FDA: 1,1,1,3,3,3-hexafluoro-2,2-propylidene-4,4'-dianiline.

(Bivalent phenol compound)

p6FDP: 1,1,1,3,3,3-hexafluoro-2,2-propylidene-4,4'-diphenpl.

Meanwhile, in Comparative Examples 7-1 and 7-2, bis-maleimide compounds not included in the general formula (DM1) were employed.

(3) Measurement of properties of bismaleimide-based cured resin film (a) Decomposition-starting temperature Bismaleimide-based resin varnish was coated on the surface of a glass plate of 1 mm×130 mm×150 mm in size by means of a bar coater thereby forming a layer 5 μm in thickness, which was then prebaked for one hour at a temperature of 110° C. The film was then heated in a desiccator filled with nigrogen gas, raising the temperature from room temperature to 150° C., 250° C. and then 350° C., each of these temperatures being kept for one hour, and finally heating it at a temperature of 400° C. for 30 minutes thereby obtaining a bismaleimide-based cured resin film. In this heating process, the heat-up time from one temperature to the next temperature was set to one hour. The bismaleimide-based cured resin film thus obtained was subjected to thermogravimetric analysis/differential thermal analysis (TG/DTA) in a nitrogen gas stream for measuring the temperature which causes a weight reduction of 0.5 wt. % to determine the decomposition-starting temperature of the bismaleimide-based cured resin film. As a result, all of bismaleimide-based cured resin films according to Examples 7-1 to 7-16 were confirmed to have a heat resistance which was comparable to or more excellent than that of Comparative Examples.

(b) Dielectric constant

Bismaleimide-based resin varnish was spin-coated two to four times on the surface of an aluminum plate of 1 mm×100 mm×100 mm in size so as to obtain a coated layer having such a thickness that would become 40 to 60 μm thick after the curing thereof. The coated layer thus obtained was then heated in a desiccator filled with nigrogen gas, raising the temperature from room temperature to 150° C., 250° C. and then 350° C., each of these temperatures being kept for one hour, and finally heating it at a temperature of 400° C. for 30 minutes thereby obtaining a bismaleimide-based cured resin film. In this heating process, the heat-up time from one temperature to the next temperature was set to 30 minutes. The bismaleimide-based cured resin film thus obtained was measured of its dielectric constant under the condition of 100 kHz. It was found as a result that the dielectric constant of any of bismaleimide-based cured resin films in Examples 7-1 to 7-16 was 3.0 or less, which was very low as compared with that of the film of Comparative Example 8-1 that is conventionally used, thus verifying an excellent dielectric property of the bismaleimide-based cured resin film of Examples 7-1 to 7-16.

(c) Amount of generated hydrolytic gas

Bismaleimide-based resin varnish was spin-coated on the surface of a silicon substrate having a diameter of 4 inches to obtain a coated layer having such a thickness that would become 5 to 10 μm thick after the curing thereof. The coated layer was then heated in a desiccator filled with nigrogen gas, raising the temperature from room temperature to 150° C., 250° C. and then 350° C., each of these temperatures being kept for one hour, and finally heating it at a temperature of 400° C. for 30 minutes thereby obtaining a bismaleimide-based cured resin film. In this heating process, the heat-up time from one temperature to the next temperature was set to 30 minutes. The silicon substrate bearing this bismaleimide-based cured resin film was left to stand for one week under a saturated water vapor atmosphere at 20° C. Subsequently, the bismaleimide-based cured resin film was introduced into a pyrofoil and heat-treated with a Curie pyrolyser for 3 seconds at a temperature of 358° C., thereby allowing gas to be generated from the bismaleimide-based cured resin film. The gas components thus generated were then analyzed with GC-MASS. The amount of aniline, which is one of the hydrolyric gases, was evaluated by converting the integral value of the signals of aniline in the total ion chromatogrm into a value per 1 mg of sample. As a result, it was found that the amount of generated toluene gas was very little in the case of bismaleimide-based cured resin films of Examples 7-1 to 7-16, so that the bismaleimide-based cured resin films of Examples 7-1 to 7-16 were excellent in environmental stability.

TABLE 17

| | Example | | | | | | |
|---|---|---|---|---|---|---|---|
| | 7-1 | 7-2 | 7-3 | 7-4 | 7-5 | 7-6 | 7-7 |
| Raw materials (molar eq.) | | | | | | | |
| 6FmBPDM | 1.00 | 1.00 | 1.00 | — | — | — | — |
| 6FmODM | — | — | — | 1.00 | 1.00 | 1.00 | — |
| 6FmSNDM | — | — | — | — | — | — | 1.00 |
| 6FM6FDM | — | — | — | — | — | — | — |
| pMDM | — | — | — | — | — | — | — |
| p6FDM | — | — | — | — | — | — | — |
| pODA | 0.50 | — | — | 0.50 | — | — | 0.50 |
| m6FDM | — | 0.50 | — | — | 0.50 | — | — |
| 6FpBPDA | — | — | 0.50 | — | — | 0.50 | — |
| pMDA | — | — | — | — | — | — | — |
| p6FDA | — | — | — | — | — | — | — |
| p6FDP | — | — | — | — | — | — | — |
| Properties | | | | | | | |
| Decomposition-starting temperature [°C.] | 450 | 450 | 460 | 440 | 440 | 445 | 450 |
| Dielectric constant | 2.78 | 2.62 | 2.50 | 2.88 | 2.72 | 2.68 | 2.90 |
| Moisture absorption coefficient [%] | 0.56 | 0.34 | 0.28 | 0.62 | 0.44 | 0.36 | 0.64 |
| Amount of decomposiotn gas | 2400 | 1200 | 3300 | 2800 | 1500 | 3500 | 2600 |

TABLE 18

| | Example | | | | | | |
|---|---|---|---|---|---|---|---|
| | 7-8 | 7-9 | 7-10 | 7-11 | 7-12 | 7-13 | 7-14 |
| Raw materials (molar eq.) | | | | | | | |
| 6FmBPDM | — | — | — | — | — | — | 1.00 |
| 6FmODM | — | — | — | — | — | — | 1.00 |
| 6FmSNDM | 1.00 | 1.00 | — | — | — | — | — |
| 6FM6FDM | — | — | 1.00 | 1.00 | 1.00 | — | — |
| pMDM | — | — | — | — | — | — | — |
| p6FDM | — | — | — | — | — | — | — |
| pODA | — | — | 0.50 | — | — | — | — |
| m6FDA | 0.50 | — | — | 0.50 | — | — | — |
| 6FpBPDA | — | 0.50 | — | — | 0.50 | — | — |
| pMDA | — | — | — | — | — | — | — |
| p6FDA | — | — | — | — | — | — | — |
| p6FDP | — | — | — | — | — | 1.00 | 1.00 |
| Properties | | | | | | | |
| Decomposition-starting temperature [°C.] | 455 | 460 | 435 | 440 | 445 | 450 | 440 |
| Dielectric constant | 2.72 | 2.70 | 2.70 | 2.52 | 2.50 | 2.66 | 2.76 |
| Moisture absorption coefficient [%] | 0.48 | 0.42 | 0.42 | 0.22 | 0.20 | 0.46 | 0.46 |
| Amount of decomposiotn gas | 1400 | 1500 | 3200 | 2000 | 5500 | 1800 | 2800 |

TABLE 19

| | Example | | Comparative Example | | | |
|---|---|---|---|---|---|---|
| | 7-15 | 7-16 | 7-1 | 7-2 | 7-3 | 7-4 |
| Raw materials (molar eq.) | | | | | | |
| 6FmBPDM | — | — | — | — | — | — |
| 6FmODM | — | — | — | — | — | — |
| 6FmSNDM | 1.00 | — | — | — | — | — |
| 6FM6FDM | — | 1.00 | — | — | — | — |
| pMDM | — | — | 1.00 | — | — | — |
| p6FDM | — | — | — | 1.00 | 1.00 | 1.00 |
| pODA | — | — | — | — | — | — |
| m6FDA | — | — | — | — | — | — |
| 6FpBPDA | — | — | — | — | — | — |
| pMDA | — | — | 0.50 | 0.50 | — | — |
| p6FDA | — | — | — | — | 0.50 | — |
| p6FDP | 1.00 | 1.00 | — | — | — | 1.00 |
| Properties | | | | | | |
| Decomposition-starting temperature [°C.] | 450 | 435 | 430 | 440 | 430 | 430 |
| Dielectric constant | 2.78 | 2.54 | 3.54 | 2.90 | 2.72 | 2.78 |
| Moisture absorption coefficient [%] | 0.60 | 0.44 | 4.10 | 0.80 | 0.42 | 0.50 |
| Amount of decomposiotn gas | 2100 | 3000 | 25000 | 36000 | 42000 | 58000 |

What is claimed is:

1. A polyimide precursor having a molecular structure obtained by polymerizing
   (a) 0.97 to 1.03 molar equivalent of a diamine component containing 0.40 molar equivalent or more of aromatic diamine compound represented by the following general formula (DA1), and
   (b) an acid anhydride component containing $(1-n_1/2)$ molar equivalent of a tetracarboxylic dianhydride represented by the following general formula (DAH1) and $n_1$, molar equivalent of at least one compound selected from the group consisting of maleic anhydride and maleic derivative anhydride, wherein $n_1$ ranges from 0.02 to 0.40:

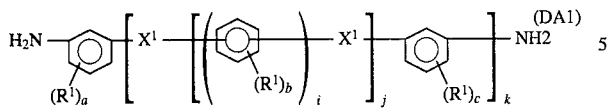

wherein $X^1$ groups may be the same or different and represent bivalent oxy, thio, sulfonyl, carbonyl, peralkylpolysiloxanylene or a nonsubstituted or fluoro-substituted aliphatic hydrocarbon group, or a single bond; $R^1$ substituents may be the same or different and represent individually fluoro, or a nonsubstituted or fluoro-substituted aliphatic hydrocarbon group; a, b and c each are an integer of 0 to 4; i is an integer of 1 to 6; j is an integer of 0 to 6; and k is 0 or 1,

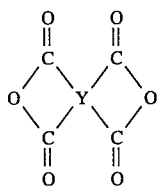

wherein Y is a tetravalent organic group; and
wherein said compound selected from the group consisting of maleic anhydride and maleic derivative anhydride has the following general formula (MA1)

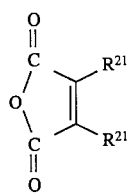

wherein $R^{21}$ substituents may be the same or different and represent individually halo, or a nonsubstituted or fluoro-substituted aliphatic hydrocarbon group, or hydrogen atom.

2. The polyimide precursor according to claim 1, wherein said diamine compound contains 0.02 to 0.1 molar equivalent of a diamine compound represented by the following general formula (DA6):

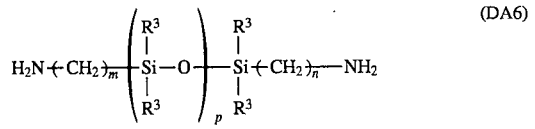

wherein $R^3$ substituents may be the same or different and represent alkyl group having 1 to 5 carbon atoms; m and n each are an integer of 1 to 10 and p is an positive integer.

3. The polyimide precursor according to claim 1, wherein said tetracarboxylic dianhydride is at least one selected from the group consisting of aromatic tetracarboxylic dianhydrides represented by the following general formulas (DAH2) to (DAH4):

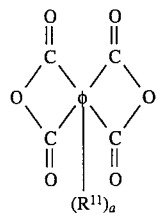

wherein $R^{11}$ substituents may be the same or different and represent fluoro, or a nonsubstituted or fluoro-substituted aliphatic hydrocarbon group; φ represents an aromatic hydrocarbon group; and a is an integer of 0 to 10

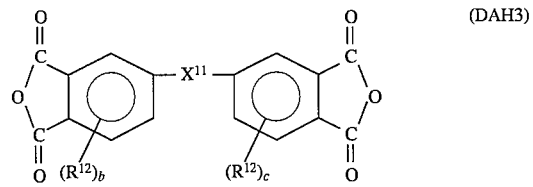

wherein $X^{11}$ represents bivalent oxy, sulfonyl, carbonyl, peralkylpolysiloxanylene, or a nonsubstituted or fluoro-substituted aliphatic hydrocarbon group, 1,4-phenylene, biphenyl-4,4'-diyl, or a single bond; $R^{12}$ substituents may be the same or different and represent fluoro, or a nonsubstituted or fluoro-substituted hydrocarbon group; and b and c is an integer of 0 to 4,

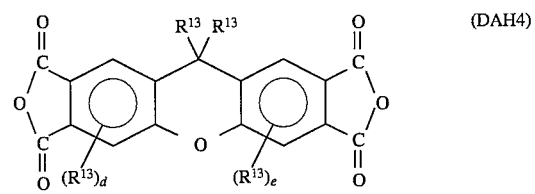

wherein $R^{13}$ substituents may be the same or different and represent fluoro, or a nonsubstituted or fluoro-substituted aliphatic hydrocarbon group or aromatic hydrocarbon group; and d and e are an integer of 0 to 4.

4. The polyimide precursor according to claim 1, wherein said diamine compound represented by the general formula (DA1) is contained in a ratio of 0.70 molar equivalent or more in the whole diamine compounds.

5. The polyimide precursor according to claim 1, wherein the intrinsic viscosity of 0.5 w/v % N-methyl-2-pyrrolidone solution thereof ranges 0.2 to 0.7 dL/g at 30° C.

6. The polyimide precursor according to claim 1, further comprising 0.1 to 120 parts by weight of a photosensitive agent based on 100 parts by weight of said polyimide precursor.

7. The polyimide precursor according to claim 6, wherein said photosensitive agent is an azide compound or an amine having a double bond.

8. A polyimide precursor having a molecular structure obtained by polymerizing
(a) a diamine component containing 0.10 molar equivalent or more of an aromatic diamine compound represented by the following general formula (DA2), and
(b) an acid anhydride component containing 0.80 molar equivalent or more of a tetracarboxylic dianhydride represented by the following general formula (DAH1):

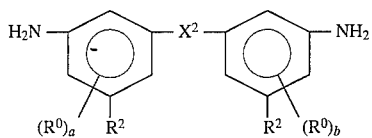 (DA2)

wherein $X^2$ represents perfluoroalkylene, perfluoroalkylidene, sulfonyl, or a single bond; $R^2$ substituents may be the same or different and represent fluoro, a nonsubstituted or fluoro-substituted aliphatic hydrocarbon group, or a hydrogen atom, at least one $R^2$ being fluoro, or a fluoro-substituted aliphatic hydrocarbon group; $R^0$ substituents may be the same or different and represent fluoro, or a nonsubstituted or fluoro-substituted aliphatic hydrocarbon group; and a and b each are an integer of 0 to 3,

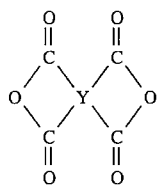 (DAH1)

wherein Y is a tetravalent organic group.

9. The polyimide precursor according to claim 8, having a molecular structure obtained by polymerizing
   (a) 0.97 to 1.03 molar equivalent of said diamine compound pound containing said fluorine-containing diamine compound represented by the general formula (DA2), and
   (b) $(1-n_2/2)$ molar equivalent of said tetracarboxylic dianhydride represented by the general formula (DAH1) and $n_2$ molar equivalent of a dicarboxylic anhydride, wherein $n_2$ ranges from 0 to 0.4, or
   (a') $(1-n_3/2)$ molar equivalent of said diamine compound containing 0.1 molar equivalent or more of said fluorine-containing diamine compound represented by the general formula (DA2) and $n_3$ molar equivalent of a monoamine compound, wherein $n_3$ ranges from 0 to 0.4, and
   (b') 0.97 to 1.03 molar equivalent of said tetracarboxylic dianhydride represented by the general formula (DAH1).

10. The polyimide precursor according to claim 8, wherein said diamine compound contains 0.02 to 0.1 molar equivalent of a diamine compound represented by the following general formula (DA6):

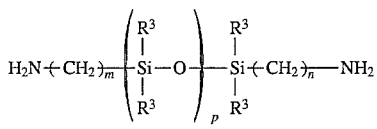 (DA6)

wherein $R^3$ substituents may be the same or different and represent alkyl group having 1 to 5 carbon atoms; m and n each are an integer of 1 to 10; and p is an positive integer.

11. The polyimide precursor according to claim 8, wherein said tetracarboxylic dianhydride is at least one selected from the group consisting of aromatic tetracarboxylic dianhydrides represented by the following general formulas (DAH2) to (DAH4):

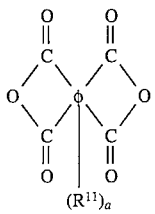 (DAH2)

wherein $R^{11}$ substituents may be the same or different and represent fluoro, or a nonsubstituted or fluoro-substituted aliphatic hydrocarbon group; φ represents an aromatic hydrocarbon group; and a is an integer of 0 to 10,

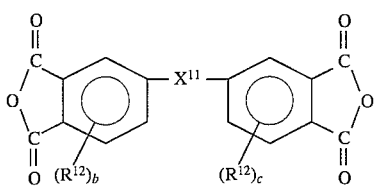 (DAH3)

wherein $X^{11}$ represents bivalent oxy, sulfonyl, carbonyl, peralkylpolysiloxanylene, or a nonsubstituted or fluoro-substituted aliphatic hydrocarbon group, 1,4-phenylene, biphenyl-4,4'-diyl, or a single bond; $R^{12}$ substituents may be the same or different and represent fluoro, or a nonsubstituted or fluoro-substituted hydrocarbon group; and b and c each is an integer of 0 to 4,

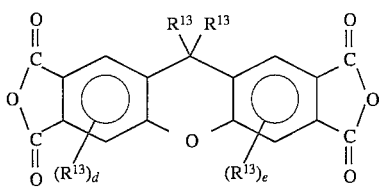 (DAH4)

wherein $R^{13}$ substituents may be the same or different and represent fluoro, or a nonsubstituted or fluoro-substituted aliphatic hydrocarbon group or aromatic hydrocarbon group; and d and e each are an integer of 0 to 4.

12. The polyimide precursor according to claim 8, further comprising 0.1 to 120 parts by weight of a photosensitive agent based on 100 parts by weight of said polyimide precursor.

13. The polyimide precursor according to claim 12, wherein said photosensitive agent is an azide compound or an amine having a double bond.

14. A polyimide precursor comprising:
   (a) 100 parts by weight of a polyamic acid derivative having a repeating unit represented by the following general formula (PA11), and
   (b) 0.05 to 30 parts by weight of a photopolymerization initiator:

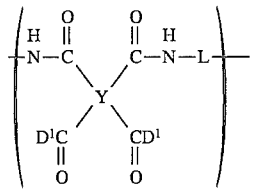 (PA11)

wherein Y is a tetravalent organic group; L is a bivalent organic group consisting of a residual group of said diamine compound represented by the general formula (DA1); $D^1$ substituents may be the same or different and represent a photosensitive organic group or hydroxy, at least one $D^1$ being the photosensitive organic group.

15. The polyimide precursor according to claim 14, wherein said $D^1$ is at least one photosensitive organic group selected from the group consisting of the following chemical formulas:

$$CH_2=CH-\overset{O}{\overset{\|}{C}}O(CH_2)_2O-, \quad CH_2=CH-\overset{O}{\overset{\|}{C}}O(CH_2)_2NH-,$$

$$CH_2=\overset{CH_3}{\underset{|}{C}}-\overset{O}{\overset{\|}{C}}O(CH_2)_2O-, \quad CH_2=\overset{CH_3}{\underset{|}{C}}-\overset{O}{\overset{\|}{C}}O(CH_2)_2NH-,$$

$$CH_2=CH-\overset{O}{\overset{\|}{C}}O(CH_2)_3O-, \quad CH_2=CH-\overset{O}{\overset{\|}{C}}O(CH_2)_3NH-,$$

$$CH_2=\overset{CH_3}{\underset{|}{C}}-\overset{O}{\overset{\|}{C}}O(CH_2)_3O-, \quad CH_2=\overset{CH_3}{\underset{|}{C}}-\overset{O}{\overset{\|}{C}}O(CH_2)_3NH-,$$

$$CH_3-\overset{O}{\overset{\|}{CH=CHCO(CH_2)_2O}}-,$$

$(CH_2=CHCH_2OCH_2)_3CCH_2O-$, and

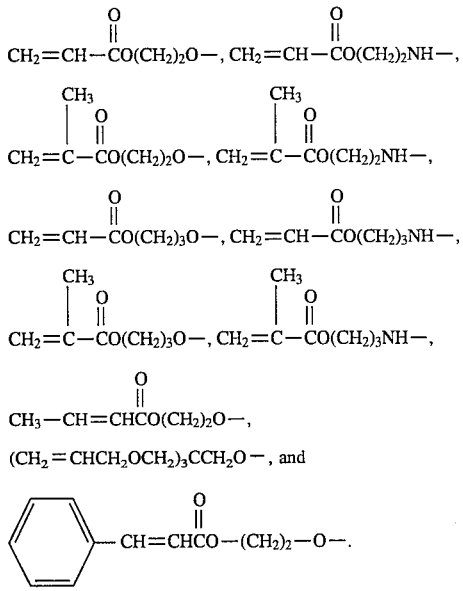

16. The polyimide precursor according to claim 14, wherein said photopolymerization initiator is at least one compound selected from the group consisting of azide compounds and sensitizers.

17. A bismaleimide-based cured resin precursor having a molecular structure obtained by reacting
(a) 1 molar equivalent of bismaleimide compound represented by the following general formula (DM1), and
(b) 0.01 to 2 molar equivalent of at least one selected from the group consisting of a diamine compound represented by the following general formula (DA11) and a bivalent phenol compound represented by the following general formula (DP1):

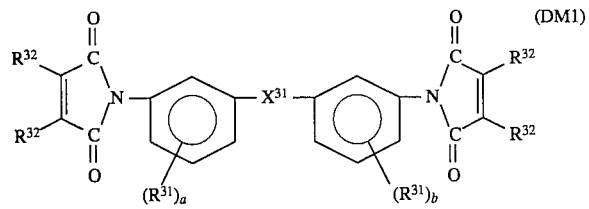

wherein $X^{31}$ represents bivalent oxy, sulfonyl, carbonyl, peralkylpolysiloxanylene, 1,3-phenylenedioxy, 1,4-phenylenedioxy, or a nonsubstituted or fluoro-substituted aliphatic hydrocarbon group, or a single bond; $R^{31}$ substituents may be the same or different and represent fluoro, a nonsubstituted or fluoro-substituted aliphatic hydrocarbon group, or a hydrogen atom, at least one $R^{31}$ being fluoro, or a fluoro-substituted aliphatic hydrocarbon group; $R^{32}$ substituents may be the same or different and represent halo, or a nonsubstituted or fluoro-substituted aliphatic hydrocarbon group, or a hydrogen atom; and a and b each are an integer of 1 to 4, $$H_2N-X^{32}-NH_2 \qquad (DA11)$$

wherein $X^{32}$ represents a bivalent organic group, $$HO-Ar+(X^{33}-Ar)_n OH \qquad (DP1)$$

wherein $X^{33}$ represents a bivalent organic group; Ar represents an aromatic hydrocarbon group or an aromatic heterocyclic group; and n is 0 or 1.

18. The bismaleimide-based cured resin precursor according to claim 17, wherein said diamine compound contains 0.02 to 0.1 molar equivalent of a diamine compound represented by the following general formula (DA6):

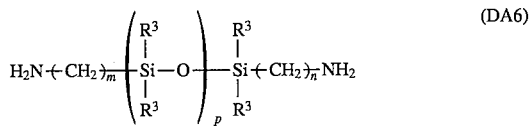

wherein $R^3$ substituents may be the same or different and represent alkyl group having 1 to 5 carbon atoms; m and n each are an integer of 1 to 10; and p is an positive integer.

19. An electronic part comprising an insulating member consisting of a polyimide resin, the polyimide resin being obtained by curing a polyimide precursor having a molecular structure obtained by polymerizing
(a) 0.97 to 1.03 molar equivalent of a diamine component containing 0.40 molar equivalent or more of aromatic diamine compound represented by the following general formula (DA1), and
(b) an acid anhydride component containing $(1-n_1/2)$ molar equivalent of a tetracarboxylic dianhydride represented by the following general formula (DAH1) and $n_1$ molar equivalent of at least one compound selected from the group consisting of maleic anhydride and maleic derivative anhydride, wherein $n_1$ ranges from 0.02 to 0.40:

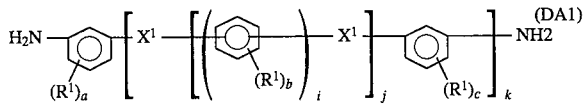

wherein $X^1$ groups may be the same or different and represent bivalent oxy, thio, sulfonyl, carbonyl, peralkylpolysiloxanylene or a nonsubstituted or fluoro-substituted aliphatic hydrocarbon group, or a single bond; $R^1$ substituents may be the same or different and represent individually fluoro, or a nonsubstituted or fluoro-substituted aliphatic hydrocarbon group; a, b, and c are each an integer of 0 to 4; i is an integer of 1 to 6; j is an integer of 0 to 6; and k is 0 or 1,

wherein Y is a tetravalent organic group, or (a') a diamine component containing 0.10 molar equivalent or more of an aromatic diamine compound represented by the following general formula (DA2), and
(b') an acid anhydride component containing 0.80 molar equivalent or more of tetracarboxylic dianhydride represented by the following general formula (DAH1):

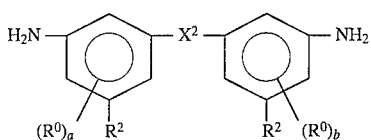 (DA2)

wherein $X^2$ represents perfluoroalkylene, perfluoroalkylidene, sulfonyl, or a single bond; $R^2$ substituents may be the same or different and represent fluoro, a nonsubstituted or fluoro-substituted aliphatic hydrocarbon group, or a hydrogen atom, at least one $R^2$ being fluoro, or a fluoro-substituted aliphatic hydrocarbon group; $R^0$ substituents may be the same or different and represent fluoro, or a nonsubstituted or fluoro-substituted aliphatic hydrocarbon group; and a and b are each an integer of 0 to 3,

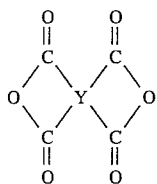 (DAH1)

wherein Y is a tetravalent organic group; and
wherein said compound selected from the group consisting of maleic anhydride and maleic derivative anhydride has the following general formula (MA1)

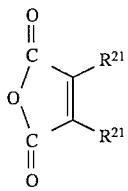 (MA1)

wherein $R^{21}$ substituents may be the same or different and represent individually halo, or a nonsubstituted or fluoro-substituted aliphatic hydrocarbon group, or hydrogen atom.

20. An electronic part comprising an insulating member consisting of a bismaleimide-based cured resin, the bismaleimide-based cured resin being obtained by curing a precursor having a molecular structure obtained by reacting (a) 1 molar equivalent of bismaleimide compound represented by the following general formula (DM1), and
(b) 0.01 to 2 molar equivalent of at least one selected from the group consisting of a diamine compound represented by the following general formula (DA11) and a bivalent phenol compound represented by the following general formula (DP1):

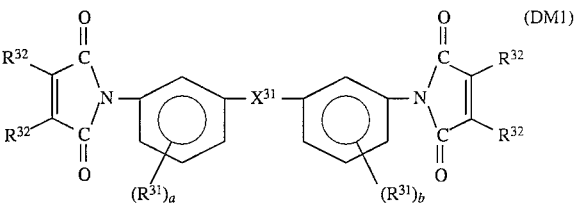 (DM1)

wherein $x^{31}$ represents bivalent oxy, sulfonyl, carbonyl, peralkylpolysiloxanylene, 1,3-phenylenedioxy, 1,4-phenylenedioxy, or a nonsubstituted or fluoro-substituted aliphatic hydrocarbon group, or a single bond; $R^{31}$ substituents may be the same or different and represent fluoro, a nonsubstituted or fluoro-substituted aliphatic hydrocarbon group, or a hydrogen atom, at least one $R^{31}$ being fluoro, or a fluoro-substituted aliphatic hydrocarbon group; $R^{32}$ substituents may be the same or different and represent halo, or a nonsubstituted or fluoro-substituted aliphatic hydrocarbon group, or a hydrogen atom; and a and b each are an integer of 1 to 4,

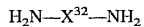 (DA11)

wherein $X^{32}$ represents a bivalent organic group,

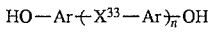 (DP1)

wherein $X^{33}$ represents a bivalent organic group; Ar represents an aromatic hydrocarbon group or an aromatic heterocyclic group; and n is 0 or 1.

* * * * *